(12) United States Patent
Lee et al.

(10) Patent No.: US 8,501,606 B2
(45) Date of Patent: Aug. 6, 2013

(54) METHODS OF FORMING WIRING STRUCTURES

(75) Inventors: Eun-Ok Lee, Hwaseong-si (KR);
Dae-Yong Kim, Yongin-si (KR);
Gil-Heyun Choi, Seoul (KR);
Byung-Hee Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 332 days.

(21) Appl. No.: 12/836,081

(22) Filed: Jul. 14, 2010

(65) Prior Publication Data

US 2011/0092060 A1   Apr. 21, 2011

(30) Foreign Application Priority Data

Oct. 16, 2009   (KR) ........................ 10-2009-0098742

(51) Int. Cl.
*H01L 21/3205* (2006.01)
*H01L 21/4763* (2006.01)

(52) U.S. Cl.
USPC ............... 438/586; 438/618; 257/E21.585

(58) Field of Classification Search
USPC ............ 438/586, 618–622; 257/E21.585, 257/E21.158
See application file for complete search history.

(56) References Cited

U.S. PATENT DOCUMENTS

| | | | |
|---|---|---|---|
| 5,398,205 A | 3/1995 | Yamaguchi | |
| 6,117,723 A | 9/2000 | Huang | |
| 6,461,959 B1 | 10/2002 | Chien et al. | |
| 6,770,535 B2 | 8/2004 | Yamada et al. | |
| 2007/0085207 A1* | 4/2007 | Lee et al. | 257/739 |
| 2008/0003753 A1 | 1/2008 | Seo et al. | |
| 2008/0003766 A1* | 1/2008 | Eun | 438/396 |
| 2008/0284029 A1 | 11/2008 | Kim et al. | |

FOREIGN PATENT DOCUMENTS

| | | |
|---|---|---|
| JP | 06-318680 | 11/1994 |
| JP | 2001-257325 | 9/2001 |
| JP | 2008-078381 | 4/2008 |

* cited by examiner

*Primary Examiner* — Chuong A Luu
*Assistant Examiner* — Nga Doan
(74) *Attorney, Agent, or Firm* — F. Chau & Associates, LLC

(57) ABSTRACT

A semiconductor memory wiring method includes: receiving a substrate having a cell array region and a peripheral circuit region; depositing a first insulating layer on the substrate; forming a first contact plug in the cell array region, the first contact plug having a first conductive material extending through the first insulating layer; forming a first elongated conductive line at substantially the same time as forming the first contact plug, the first elongated conductive line having the first conductive material directly covering and integrated with the first contact plug; forming a second contact plug in the peripheral circuit region at substantially the same time as forming the first contact plug, the second contact plug having the first conductive material extending through the first insulating layer; and forming a second elongated conductive line at substantially the same time as forming the second contact plug, the second elongated conductive line having the first conductive material directly covering and integrated with the second contact plug.

17 Claims, 50 Drawing Sheets

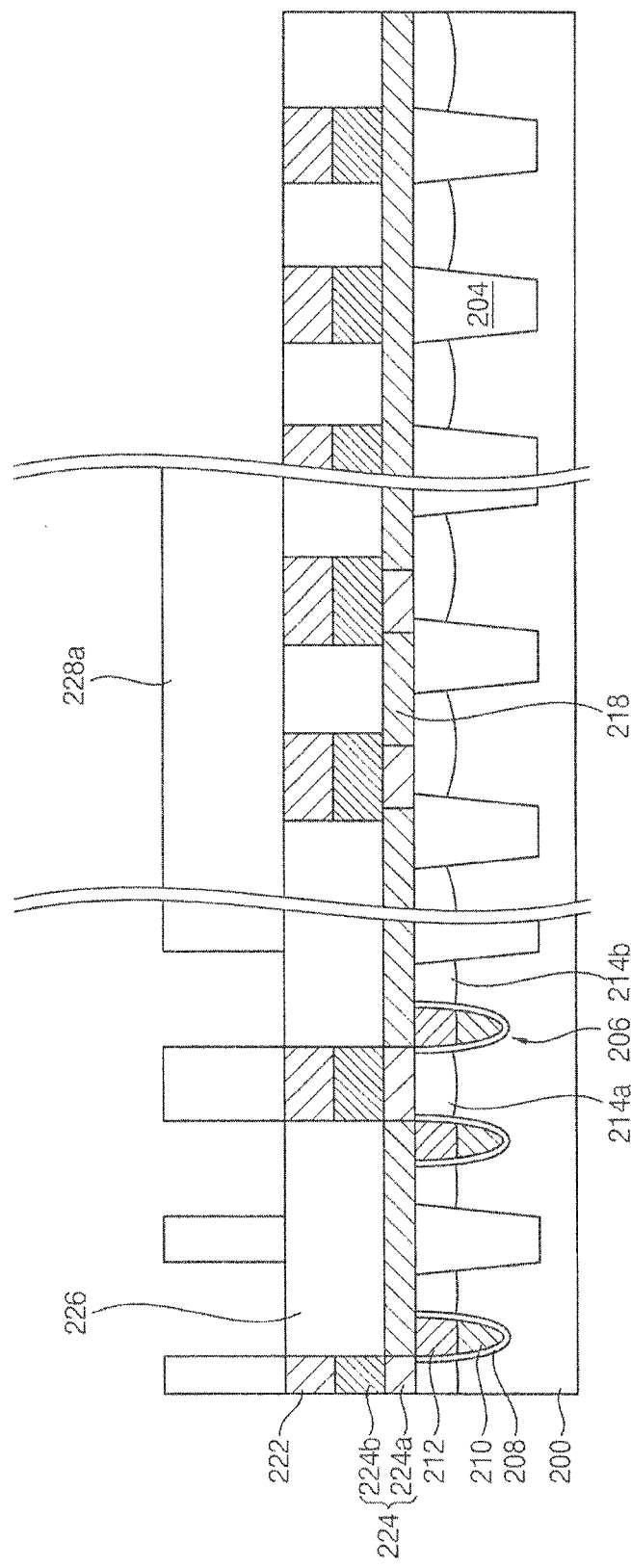

METHODS OF FORMING WIRING STRUCTURES

CROSS-REFERENCE TO RELATED APPLICATION

This application claims foreign priority under 35 U.S.C. §119 to Korean Patent Application No. 10-2009-0098742, filed on Oct. 16, 2009, in the Korean Intellectual Property Office, the disclosure of which is incorporated by reference herein in its entirety.

BACKGROUND OF THE INVENTION

The present disclosure generally relates to semiconductor manufacturing and lithography methods. More particularly, the present disclosure relates to wiring structures and methods of forming wiring structures in semiconductor devices.

As semiconductor devices have become increasingly integrated, widths of wirings and distances between wirings have decreased. Low resistance wirings are even more important than ever, due in part to the decreased distances between wirings. Unfortunately, decreasing the widths of the wirings generally leads to an increase in resistance. Thus, semiconductor devices are required with low resistance wirings, reduced wiring widths, and reduced distances between adjacent wirings.

When wiring includes a contact plug connected to a conductive line, the contact resistance between the contact plug and the conductive line may be decreased in consideration of the low total wiring resistance desired. In addition, the wiring height may be increased to reduce the wiring resistance, since the wiring resistance is generally increased as the width of the wiring is reduced. The wiring may also be formed using a lower resistance conductive material to further reduce the wiring resistance.

Unfortunately, the alignment between the conductive line and the contact plug may become problematic as the height of the wiring is increased, thereby reducing the contact area between the conductive line and the contact plug. Moreover, much of the metal or metal silicide used in such wiring may not be easily patterned by photolithography processes. Thus, the metal or metal silicide may be inefficiently utilized during formation of the wiring.

SUMMARY OF THE INVENTION

The present disclosure teaches wiring structures and methods of forming wiring structures in semiconductor devices. Exemplary embodiments are provided.

An exemplary embodiment semiconductor memory wiring method comprises: receiving a substrate having a cell array region and a peripheral circuit region; depositing a first insulating layer on the substrate; forming a first contact plug in the cell array region, the first contact plug comprising a first conductive material extending through the first insulating layer; forming a first elongated conductive line at substantially the same time as forming the first contact plug, the first elongated conductive line comprising the first conductive material directly covering and integrated with the first contact plug; forming a second contact plug in the peripheral circuit region at substantially the same time as forming the first contact plug, the second contact plug comprising the first conductive material extending through the first insulating layer; and forming a second elongated conductive line at substantially the same time as forming the second contact plug, the second elongated conductive line comprising the first conductive material directly covering and integrated with the second contact plug.

An exemplary embodiment semiconductor memory wiring structure comprises: a substrate having a cell array region and a peripheral circuit region; a first insulating layer disposed on the substrate; a first contact plug disposed in the cell array region and comprising a first conductive material extending through the first insulating layer; a first elongated conductive line disposed in the cell array region, extending along a first horizontal path, and comprising the first conductive material directly covering and integrated with the first contact plug; a second contact plug disposed in the peripheral circuit region and comprising the first conductive material extending through the first insulating layer; and a second elongated conductive line disposed in the peripheral circuit region, extending along a second horizontal path, and comprising the first conductive material directly covering and integrated with the second contact plug.

Another exemplary embodiment semiconductor memory wiring method comprises: receiving a substrate; depositing a first insulating layer on the substrate; etching a first contact hole through the first insulating layer in an active region of the substrate; simultaneously forming a first contact plug in the first contact hole and a conductive layer directly covering and integrated with the first contact plug, both of a first conductive material; forming an elongated capping pattern along a first horizontal path on the conductive layer covering the first contact plug; removing a portion of the conductive layer that extends outside of the elongated capping pattern to form a first elongated conductive line along the first horizontal path directly covering and integrated with the first contact plug; and forming an elongated photoresist pattern that extends along a second horizontal path oblique to the first horizontal path.

Another exemplary embodiment semiconductor memory wiring structure comprises: a substrate; a first insulating layer disposed on the substrate; a first contact plug comprising a first conductive material extending through the first insulating layer; a first elongated conductive line extending along a first horizontal path, and comprising the first conductive material directly covering and integrated with the first contact plug; and an elongated capping pattern on the conductive layer covering the first contact plug.

The present disclosure may be further understood from the following description of exemplary embodiments, which is to be read in connection with the accompanying drawings.

BRIEF DESCRIPTION OF THE DRAWINGS

The present disclosure provides wiring structures and methods of forming wiring structures in accordance with the following exemplary figures, in which:

FIGS. 3 to 8, 10 and 11 are cross sectional views illustrating a method of forming the wiring structure in FIG. 2a;

FIG. 9 is a perspective view illustrating the method of forming the wiring structure in FIG. 2a;

FIGS. 19b and 20b are cross sectional views illustrating processes for forming a storage node contact in accordance other exemplary embodiments of the present disclosure;

DETAILED DESCRIPTION OF PREFERRED EMBODIMENTS

Figure 1:
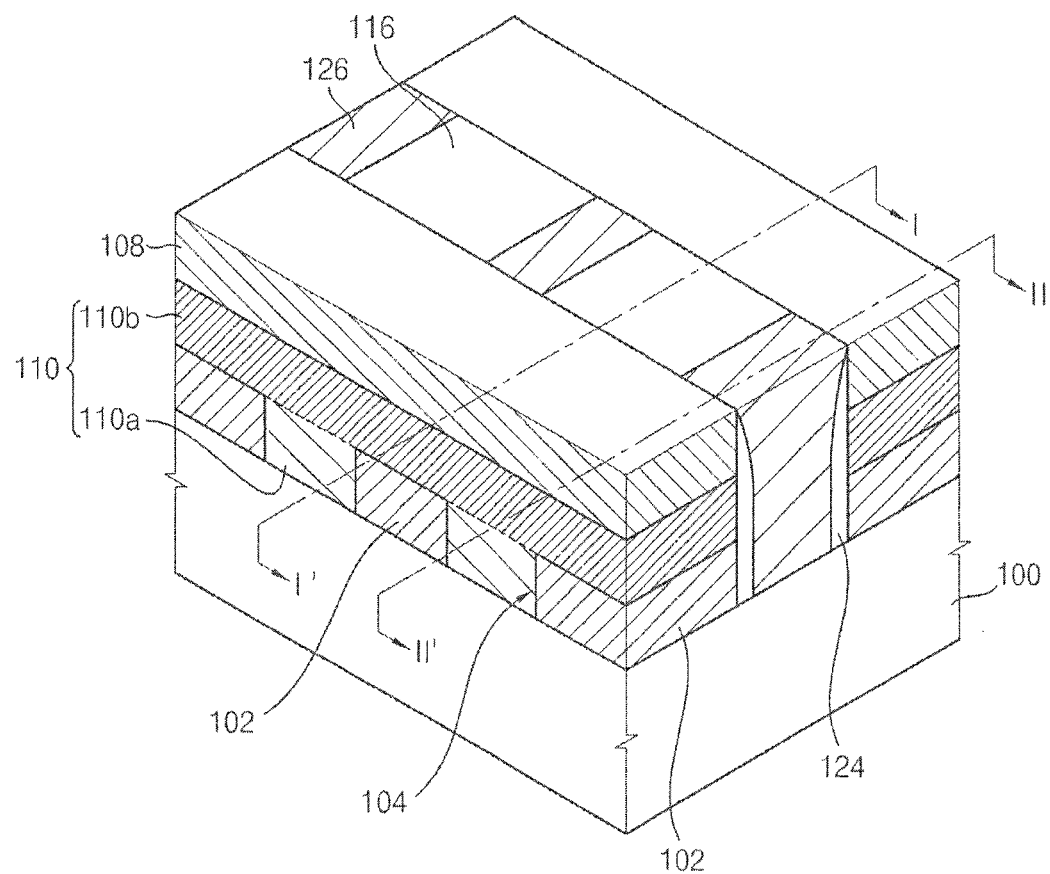
FIG. 1 is a perspective view illustrating a wiring structure in accordance with an exemplary embodiment of the present disclosure.

Semiconductor wiring structures and related methods of manufacture are provided for forming wiring structures in semiconductor devices. Exemplary embodiment devices relate to wiring structures having contact plugs and conductive lines connected to the contact plugs. Exemplary embodiment methods relate to formation of wiring structures having contact plugs and conductive lines connected with the contact plugs.

Exemplary embodiment devices provide wiring structures having small heights with low resistance. A preferred device provides a volatile semiconductor memory device including a wiring structure having a small height and low resistance.

Exemplary embodiment methods provide steps for manufacturing the wiring structures having small heights with low resistance. A preferred method is described for manufacturing a volatile semiconductor memory device including a wiring structure having a small height and low resistance.

In an exemplary embodiment, a method is provided for forming a wiring structure including a first wiring and a second contact plug, where an insulation layer having a contact hole may be formed on a substrate. A first contact plug filling the contact hole may be integrally formed with a conductive line protruding from the insulation layer. At least one portion of the conductive line in the first wiring may include metal silicide. An insulating interlayer may be formed on the insulation layer to cover the first wiring while filling a gap between adjacent first wirings. The second contact plug may be formed through the insulating interlayer and the insulation layer. The wiring structure may include metal silicide to further reduce resistance.

Exemplary embodiments of the inventive concept are described more fully hereinafter with reference to the accompanying drawings. The inventive concept may, however, be embodied in many different forms and should not be construed as being limited to the exemplary embodiments set forth herein. In the drawings, the sizes and relative sizes of layers and regions may be exaggerated for clarity.

It shall be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals may refer to like or similar elements throughout. As used herein, the term "and/or" includes any and all combinations of one or more of the associated listed items.

It shall be understood that, although the terms first, second, third, etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It shall be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the inventive concept. As used herein, the singular forms "a," "an" and "the" are intended to include the plural forms as well, unless the context clearly indicates otherwise. It shall be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of illustratively idealized exemplary embodiments (and intermediate structures) of the inventive concept. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It shall be further understood that terms, such as those defined in commonly used dictionaries, should be interpreted as having a meaning that is consistent with their meaning in the context of the relevant art and shall not be interpreted in an idealized or overly formal sense unless expressly so defined herein.

Figure 2A:
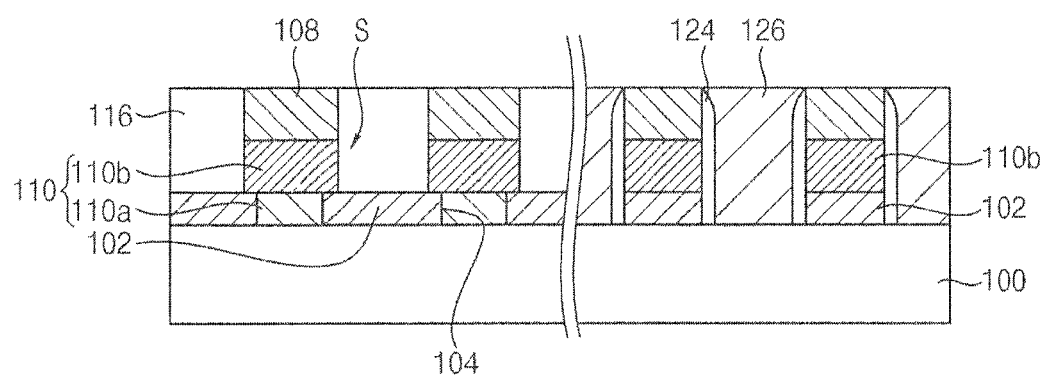
FIG. 2a is a cross sectional view illustrating the wiring structure in accordance with an exemplary embodiment of the present disclosure.

FIG. 1 is a perspective view illustrating a wiring structure in accordance with a first embodiment of the inventive concept. FIG. 2a is a cross sectional view illustrating the wiring structure in FIG. 1. In FIG. 2a, a left part shows the wiring structure taken along the line of I-I' in FIG. 1, and a right part illustrates the wiring structure taken along the line of in FIG. 1.

Referring to FIGS. 1 and 2a, a wiring structure including a first wiring 110 and a second contact plug 126 is provided on a substrate 100 having an insulation layer 102 thereon. A contact hole 104 is formed through the insulation layer 102. In exemplary embodiments, the contact hole 104 may be formed to an upper portion of the substrate 100 by overetching the upper portion of the substrate 100 while etching the insulation layer 102. That is, the contact hole 104 may be formed from the insulation layer 102 to the upper portion of the substrate 100.

The insulation layer 102 may serve as an etch stop layer while successively etching an insulating interlayer 116. Hence, the insulation layer 102 may include a material having an etching selectivity relative to the insulating interlayer 116.

For example, the insulation layer 102 may include nitride such as silicon nitride. The insulation layer 102 may have a thickness substantially the same as or substantially similar to a height of a first contact plug 110a. That is, upper faces of the insulation layer 102 and the first contact plug 110a may be positioned on the same plane. For example, the insulation layer 102 may have a relatively small thickness in a range of about 100 Å to about 300 Å.

The first contact plug 110a locates on the substrate 100 through the insulation layer 102. The first contact plug 110a may not be formed in an additional lower insulating interlayer but may be directly positioned in the insulation layer 102 serving as the etch stop layer. Thus, the first contact plug 110a may have a relatively small height.

A conductive line 110b is disposed on the first contact plug 110a and the insulation layer 102. The conductive line 110b and the first contact plug 110a may be integrally formed. Namely, the conductive line 110b and the first contact plug 110a may be simultaneously formed by one deposition process. For example, the first contact plug 110a and the conductive line 110b may be obtained by depositing a conductive material on the insulation layer 102 to fill up the contact hole 104.

The first wiring 110 includes the first contact plug 110a and the conductive line 110b. The first wiring 110 may include metal silicide (S) having low resistance. For example, at least one portion of the first wiring 110 may include the metal silicide (S).

In exemplary embodiments, the conductive line 110b of the first wiring 110 may include the metal silicide (S) whereas the first contact plug 110a may include polysilicon as illustrated in FIGS. 1 and 2a. Alternatively, a portion of the conductive line 110b may include metal silicide, or all of the conductive line 110b and the first contact plug 110a may include metal silicide.

Figure 2B:
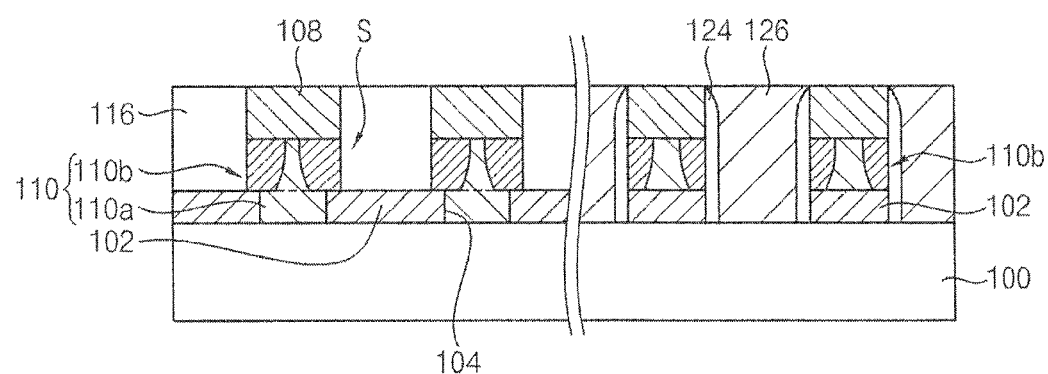
FIG. 2b is a cross sectional view illustrating a wiring structure in accordance with another exemplary embodiment of the present disclosure.
Figure 2C:
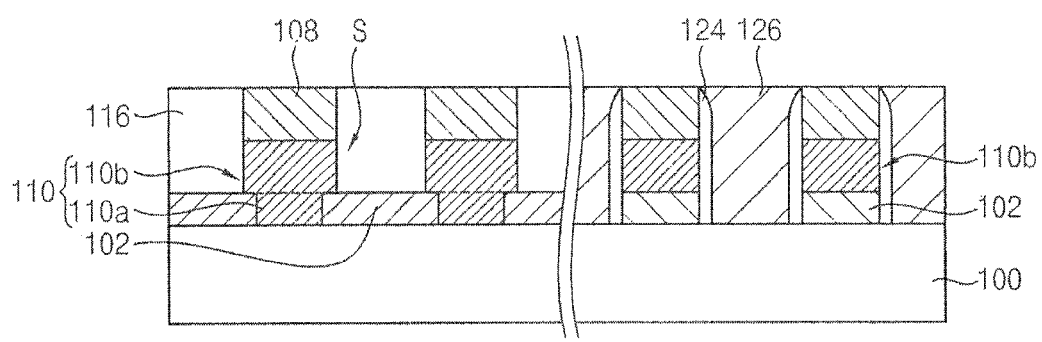
FIG. 2c is a cross sectional view illustrating a wiring structure in accordance with another exemplary embodiment of the present disclosure.

FIG. 2b is a cross sectional view illustrating a wiring structure in accordance with another exemplary embodiment. FIG. 2c is a cross sectional view illustrating a wiring structure according to still another exemplary embodiment. In FIGS. 2b and 2c, each of the wiring structures may have a construction substantially the same as or substantially similar to that of the wiring structure of FIGS. 1 and 2a except for a portion including metal silicide.

As illustrated in FIG. 2b, the wiring structure has a conductive line 110a that includes lateral portions of metal silicide (S). Other portions of the wiring structure may include polysilicon. Referring to FIG. 2c, however, both of a conductive line 110b and a first contact plug 110a in the wiring structure may include metal silicide (S). In exemplary embodiments, a thickness of the metal silicide (S) may vary to ensure a desired resistance of the first wiring 110. Further, a position of the metal silicide (S) in the first wiring 110 may vary considering a resistance of the first wiring 110.

Examples of the metal silicide (S) may include cobalt silicide (CoSix), titanium silicide (TiSix), tantalum silicide (TaSix), nickel silicide (NiSix), platinum silicide (PtSix), or the like. These may be used alone or in a combination thereof.

In exemplary embodiments, the metal silicide (S) in the first wiring 110 may have a resistance substantially smaller than that of tungsten (W) or metal nitride such as titanium nitride (TiNx) or tungsten nitride (WNx). For example, the metal silicide (S) may include cobalt silicide considering the low resistance of the first wiring 110 and manufacturing processes employed in a semiconductor device. When the first wiring 110 includes cobalt silicide as the metal silicide (S), the first wiring 110 may have a resistance sufficiently smaller than that of metal nitride even though the first contact plug 110a and the conductive line 110b have reduced heights.

A hard mask pattern 108 is provided on the conductive line 110a. The hard mask pattern 108 may serve as an etching mask for etching the insulating interlayer 116. The hard mask pattern 108 may include a material having an etching selectivity with respect to oxide. For example, the hard mask pattern 108 may include nitride like silicon nitride.

The insulating interlayer 116 is formed on the insulation layer 102 to cover the first wiring 110. The insulating interlayer 116 may sufficiently fill up a gap between adjacent first wirings 110. Upper faces of the hard mask pattern 108 and the insulating interlayer 116 may be positioned on the same plane. Alternatively, the insulating interlayer 116 may have the upper face substantially higher or substantially lower than the upper face of the hard mask pattern 108.

The second contact plug 126 is formed on the substrate 100 through the insulating interlayer 116 and the insulation layer 102. The second contact plug 126 may be located between adjacent first wirings 110.

A sidewall spacer 124 may be provided on an inner sidewall of the second contact plug 126. The second contact plug 126 may be electrically insulated from adjacent first wirings 110 by the sidewall spacer 124. The second contact plug 126 may make contact with the substrate 100, so that the second contact plug 126 may include polysilicon to enhance adhesion strength between the substrate 100 and the second contact plug 126. The sidewall spacer 124 may include oxide such as silicon oxide, or nitride like silicon nitride.

As described above, an interface contact resistance between the first contact plug 110a and the conductive line 110b may be reduced when the first contact plug 110a and the conductive line 110b are integrally formed. Additionally, the first wiring 110 includes the metal silicide (S) having the resistance substantially lower than that of tungsten or metal nitride, so that the first wiring 110 may ensure a sufficiently small resistance even though the first wiring 110 has a reduced thickness. Furthermore, the second contact plug 126 may be easily obtained because the hard mask pattern 108 positioned on the first wiring 110 may serve as the etching mask for forming the second contact plug 126.

Figure 7:
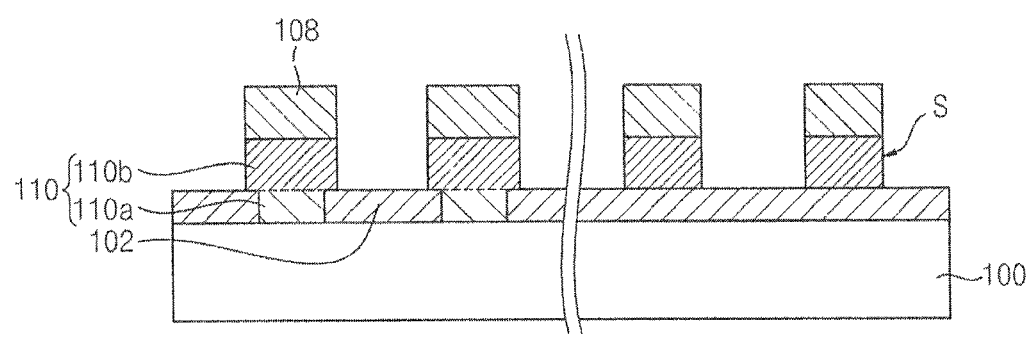
Figure 8:
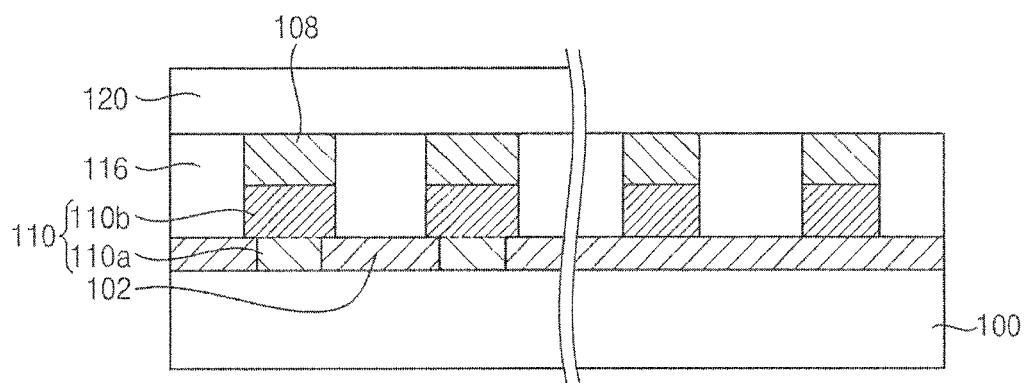
Figure 9:
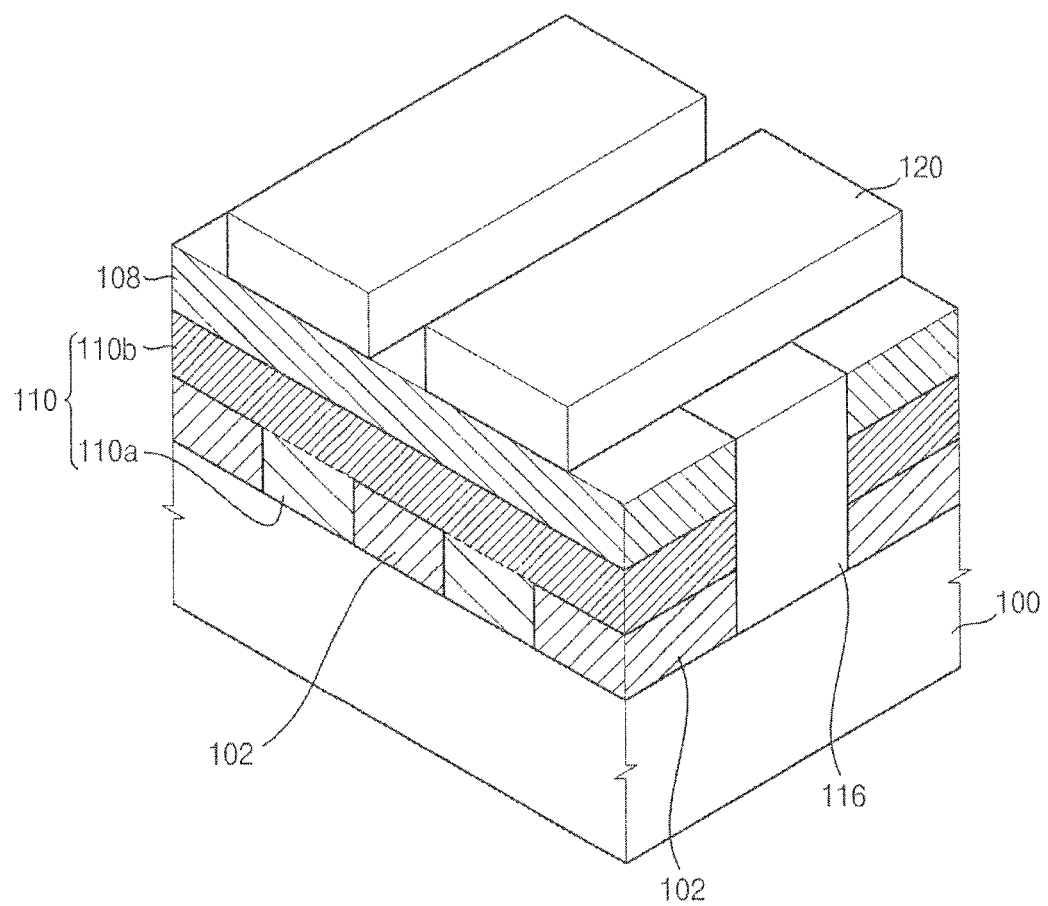

FIGS. 3 to 8, 10 and 11 are cross sectional views illustrating a method of forming the wiring structure in FIG. 2a, and FIG. 9 is a perspective view illustrating the method of forming the wiring structure in FIG. 2a. In FIGS. 3 to 8, 10 and 11, each left part illustrates the wiring structure taken along the line of I-I' in FIG. 1, and each right part illustrates the wiring structure taken along the line of in FIG. 1.

Figure 3:
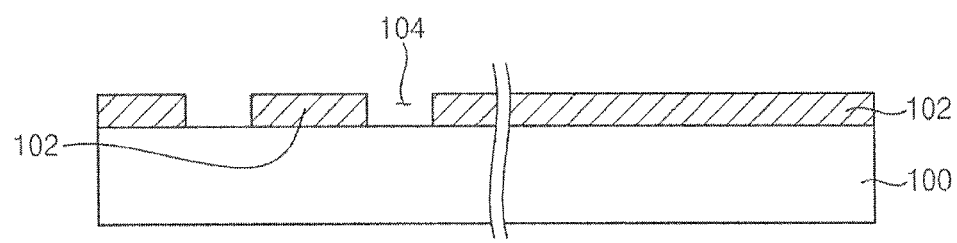

Referring to FIG. 3, an insulation layer 102 is formed on a substrate 100. The insulation layer 102 may function as an etch stop layer while etching an insulating interlayer 116 (see FIG. 8) in a successive etching process. The insulation layer 102 may be formed using a material such as silicon nitride, which has an etching selectivity with respect to the insulating interlayer 116. The insulation layer 102 may be formed to have a relatively small thickness of about 100 Å to about 300 Å.

A first contact hole 104 is formed through the insulation layer 102 by partially etching the insulation layer 102. The first contact hole 104 may be formed by a photolithography process.

Figure 4:
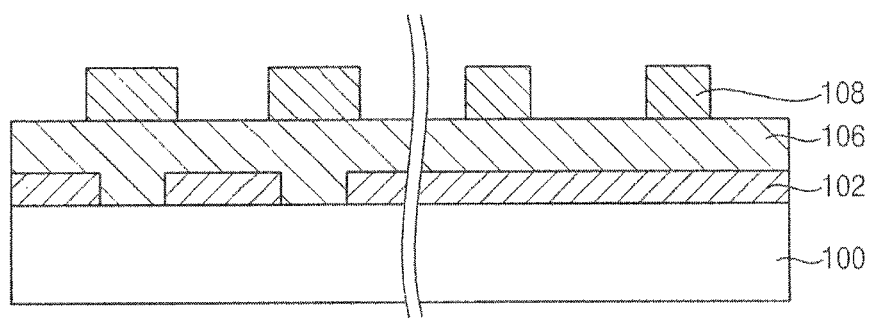

Referring to FIG. 4, a polysilicon layer 106 is formed on the insulation layer 102 to fill up the first contact hole 104.

A hard mask layer is formed on the polysilicon layer 106. The hard mask layer may be formed using nitride such as silicon nitride. The hard mask layer is patterned by a photolithography process to form a hard mask pattern 108. The hard mask pattern 108 may extend along a first direction over the substrate 100. The hard mask pattern 108 may have a line shape. Further, the hard mask pattern 108 may correspond to an upper portion of the contact hole 104.

Figure 5:
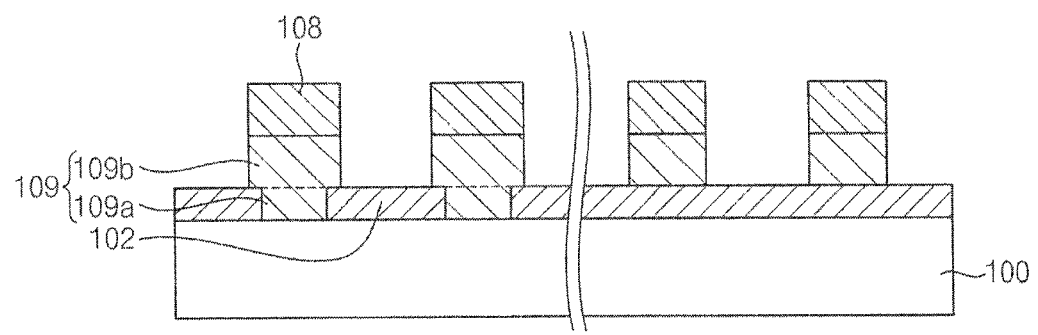

Referring to FIG. 5, the polysilicon layer 106 is etched using the hard mask pattern 108 as an etching mask to form a preliminary conductive line 109.

The preliminary conductive line 109 includes a preliminary contact plug 109a and a preliminary line pattern 109b. The preliminary contact plug 109a may fill up the first contact hole 104, and the preliminary line pattern 109b may have a line shape. The preliminary line pattern 109b may be integrally formed with the preliminary contact plug 109a. In exemplary embodiments, the preliminary line pattern 109b may cover an entire surface of the preliminary contact plug 109a filling the first contact hole 104. Here, a contact area between the preliminary line pattern 109b and the preliminary contact plug 109a may increase because the preliminary contact plug 109a may not deviate with respect to the preliminary line pattern 109b.

Figure 6:
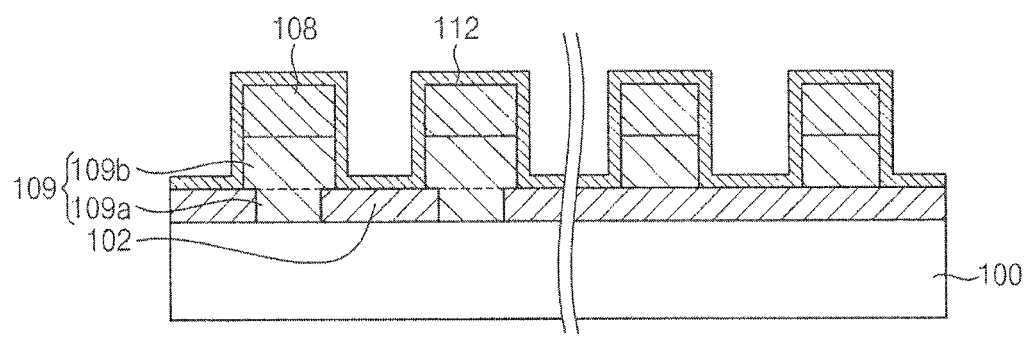

Referring to FIG. 6, a metal layer 112 is formed on the insulation layer 102 along profiles of the hard mask pattern 108 and the preliminary line pattern 109b. The metal layer 112 may include refractory metal for ensuring low resistance such that a metal silicide (S) (see FIG. 7) is generated from the metal layer 112 in a successive silicidation process. Examples of the refractory metal in the metal layer 112 may include cobalt, titanium, tantalum, nickel, platinum, or the like. These may be used alone or in a mixture thereof. In exemplary embodiments, the metal layer 112 may be formed using cobalt, so that the metal silicide caused from the metal layer 112 may have an improved thermal stability and a low resistance.

When the metal layer 112 is formed using tungsten, the wiring structure including tungsten silicide generated from the metal layer 112 may not have a desired small resistance because tungsten silicide has a relatively large resistance.

In some exemplary embodiments, a capping layer may be formed on the metal layer 112. The capping layer may be formed using metal nitride, for example, titanium nitride or tantalum nitride.

Referring to FIG. 7, the metal silicide (S) is formed in at least one lateral portion of the preliminary line pattern 109b of FIG. 6 by the silicidation process. That is, polysilicon in the preliminary line pattern 109b may be reacted with refractory metal in the metal layer 112 through a thermal treatment, such that the metal silicide (S) is generated at the lateral portion of the preliminary line pattern 109b. Then, an unreacted portion of the metal layer 112 is removed from the hard mask pattern 108 and the insulating layer 102.

As a result, a first wiring 110 including the metal silicide (S) is formed on the substrate 100. The first wiring 110 includes a first contact plug 110a filling up the first contact hole 104, and a conductive line 110b integrally formed with the first contact plug 110a.

In exemplary embodiments, the metal silicide S in the first wiring 110 may have a thickness or an area varied in accordance with process conditions of the silicidation process. That is, a process time and/or a process temperature may vary to modify the thickness of the metal silicide S included in the first wiring 110. For example, as illustrated in FIGS. 2a and 7, the preliminary line pattern 109b of FIG. 6 may be completely changed into the metal silicide S by adjusting the process conditions of the silicidation process while preventing the metal silicide S from being generated in the first contact plug 110a.

In some exemplary embodiments, the metal silicide S may be formed at the lateral portion of the conductive line 110*b* only whereas the metal silicide S may be generated in other portions of the conductive line 110*b* and the first contact plug 110*a* as illustrated in FIG. 2*b*.

In still other exemplary embodiments, the conductive line 110*b* and the first contact plug 110*a* may be fully changed into the metal silicide S through the silicidation process as illustrated in FIG. 2*c*.

As described above, the thickness or the area of the metal silicide S in the first wiring 110 may be properly adjusted in accordance with the desired resistance of the first wiring 110.

In exemplary embodiments, the metal silicide S may be obtained through one thermal treatment process, or two or more thermal treatment processes. To achieve the low resistance of the first wiring 110, the metal silicide S may be formed by twice performing the thermal treatment process. In the silicidation process including two thermal treatment processes, the resultant structure having the metal layer 122 including cobalt may be processed by a first thermal treatment process. The first thermal treatment process may be carried out at a relatively low temperature of about 250° C. to about 550° C. An unreacted portion of the metal layer 112 may be removed from the resultant structure by a stripping process. Then, a second thermal treatment process may be executed on the resultant structure to obtain the metal silicide S of the first wiring 110. The second thermal treatment process may be performed at a relatively high temperature of about 600° C. to about 900° C.

In exemplary embodiments, the first wiring 110 includes the first contact plug 110*a* and the conductive line 110*b* integrally formed through one deposition process using polysilicon. Thus, an alignment error between the first contact plug 110*a* and the conductive line 110*b* may be effectively prevented, and the contact area between the first contact plug 110*a* and the conductive line 110*b* may be increased while reducing a contact resistance between the first contact plug 110*a* and the conductive line 110*b*. Therefore, the first wiring 110 may have further reduced resistance.

Since at least one portion of the first wiring 110 includes the metal silicide S ensuring the low resistance, an entire resistance of the first wiring 110 may be reduced. The metal silicide S may be obtained by forming the preliminary conductive line 109 using the hard mask pattern 108 and by performing the silicidation process about the metal layer 112 and the preliminary conductive line 109. Namely, the first wiring 110 having a line-shaped pattern including metal silicide may be obtained without a damascene process. Particularly, the first wiring 110 having the line-shaped pattern may be easily formed without any damascene process when the line-shaped pattern in the first wiring 110 includes metal silicide (e.g., cobalt silicide) that is hardly etched by a photolithography process. Therefore, the first wiring 110 may be formed through simplified processes, and the cost and time for forming the first wiring 110 may be decreased. Further, the hard mask pattern 108 provided on the first wiring 110 may be utilized as an etching mask in successive etching processes.

Referring to FIGS. 8 and 9, an additional insulation layer is formed on the hard mask pattern 108 and the insulation layer 102 to fill up a gap between adjacent first wirings 110. The additional insulation layer may be formed using oxide like silicon oxide.

The additional insulation layer is partially removed until an upper face of the hard mask pattern 108 is exposed, so that an insulating interlayer 116 filling the gap between the first wirings 110 is formed on the insulation layer 102.

A photoresist pattern 120 is formed on the insulating interlayer 116 and the hard mask pattern 108. The photoresist pattern 120 may have a line shape extending in a second direction substantially perpendicular to the first direction as illustrated in FIG. 9. Thus, a portion of the insulating interlayer 116, which is not covered with the photoresist pattern 120, is exposed between adjacent photoresist patterns 120.

Figure 10:
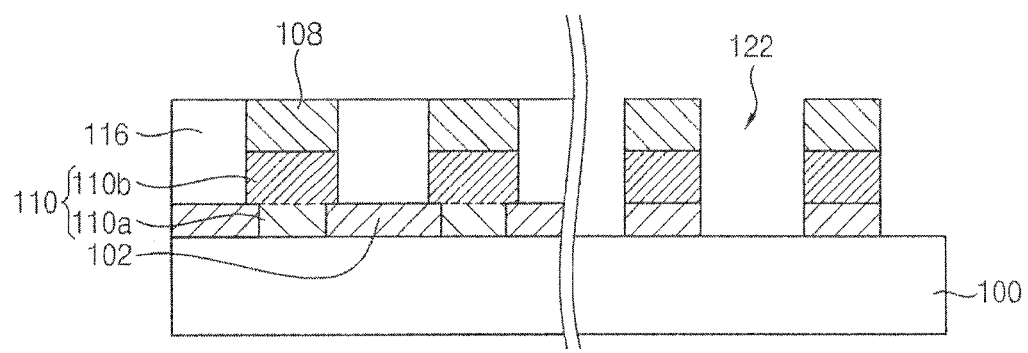

Referring to FIG. 10, the exposed portion of the insulating interlayer 116 is etched using the photoresist pattern 120 and the hard mask pattern 108 as etching masks until the insulation layer 102 is exposed. Thus, an etching process for etching the insulating interlayer 116 may be stopped when the insulation layer 102 is exposed. The exposed insulation layer 102 is partially etched to expose a portion of the substrate 100. Thus, a second contact hole 122 is formed through the insulating interlayer 116 and the insulation layer 102.

In exemplary embodiments, the hard mask pattern 108 covers the first wiring 110, so that the portion of the insulating interlayer 116 isolated by the hard mask pattern 108 and the photoresist pattern 120 may be exposed after forming the photoresist pattern 120 having the line shape on the insulating interlayer 116 as illustrated in FIG. 9. Thus, the second contact hole 122 may be formed by etching the insulating interlayer 116 and the insulation layer 102 using the photoresist pattern 120 having the line shape. That is, the second contact hole 122 may be obtained by a self-alignment process relative to the hard mask pattern 108. Therefore, an alignment error of the second contact hole 122 may decrease and the second contact hole 122 may have a lower portion substantially wider than an upper portion thereof.

Figure 11:
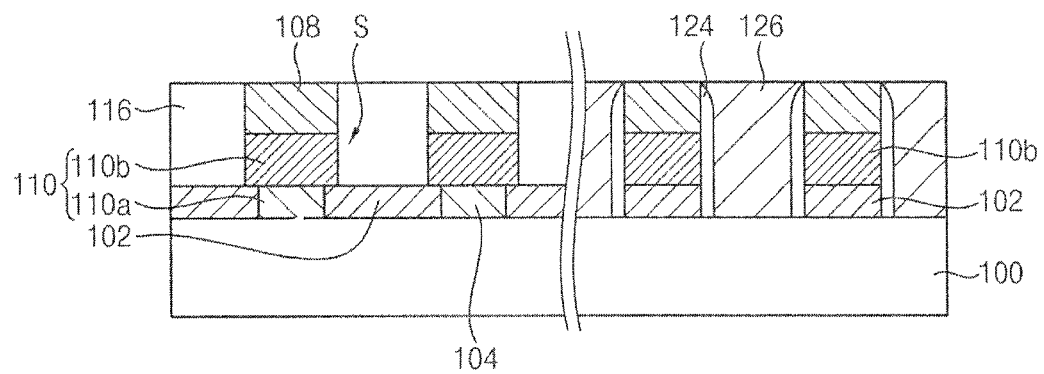

Referring to FIG. 11, a sidewall spacer 124 is formed on a sidewall of the second contact hole 122. In the formation of the sidewall spacer 124, a spacer formation layer may be formed on the hard mask pattern 108, the insulating interlayer 116, a bottom of the second contact hole 122 and the sidewall of the second contact hole 122. The spacer formation layer may be conformably formed along profiles of the hard mask pattern 108, the insulating interlayer 116 and the second contact hole 122. Then, the spacer formation layer may be anisotropically etched until a portion of the substrate 100 is exposed, thereby forming the sidewall spacer 124 on the sidewall of the second contact hole 122. The sidewall spacer 124 may include oxide such as silicon oxide, or nitride like silicon nitride.

A conductive material is formed on the hard mask pattern 108 and the insulating interlayer 116 to fill up the second contact hole 122, and then the conductive material is removed until the hard mask pattern 108 is exposed. Thus, a second contact plug 126 filling the second contact hole 122 is provided on the substrate 100. The second contact plug 126 may be formed using polysilicon to enhance adhesion strength between the substrate 100 and the second contact plug 126. Alternatively, the second contact plug 126 may have a multi layer structure that includes a barrier metal film and a metal film.

According to exemplary embodiments, a wiring structure including a first wiring and a second contact plug may be formed on a substrate. The first wiring may include a first contact plug and a conductive line integrally formed with the first contact plug, so that a contact resistance between the first contact plug and the conductive line may be considerably decreased. Additionally, the first wiring may include metal silicide having a low resistance, such that the wiring structure may ensure a desired low resistance when the wiring structure has a relatively small height even though the wiring structure has a minute width. Furthermore, a semiconductor device including the wiring structure may have an improved degree of integration and manufacturing processes for the semiconductor device may be facilitated. Moreover, an alignment error of the second contact plug may be effectively prevented because the second contact plug may be formed by a self-alignment process using a hard mask pattern provided on the first wiring as an etching mask.

According to the inventive concept, a wiring structure may be properly employed in a volatile semiconductor device such as a dynamic random access memory (DRAM) device, a static random access memory (SRAM), or the like.

Figure 12:
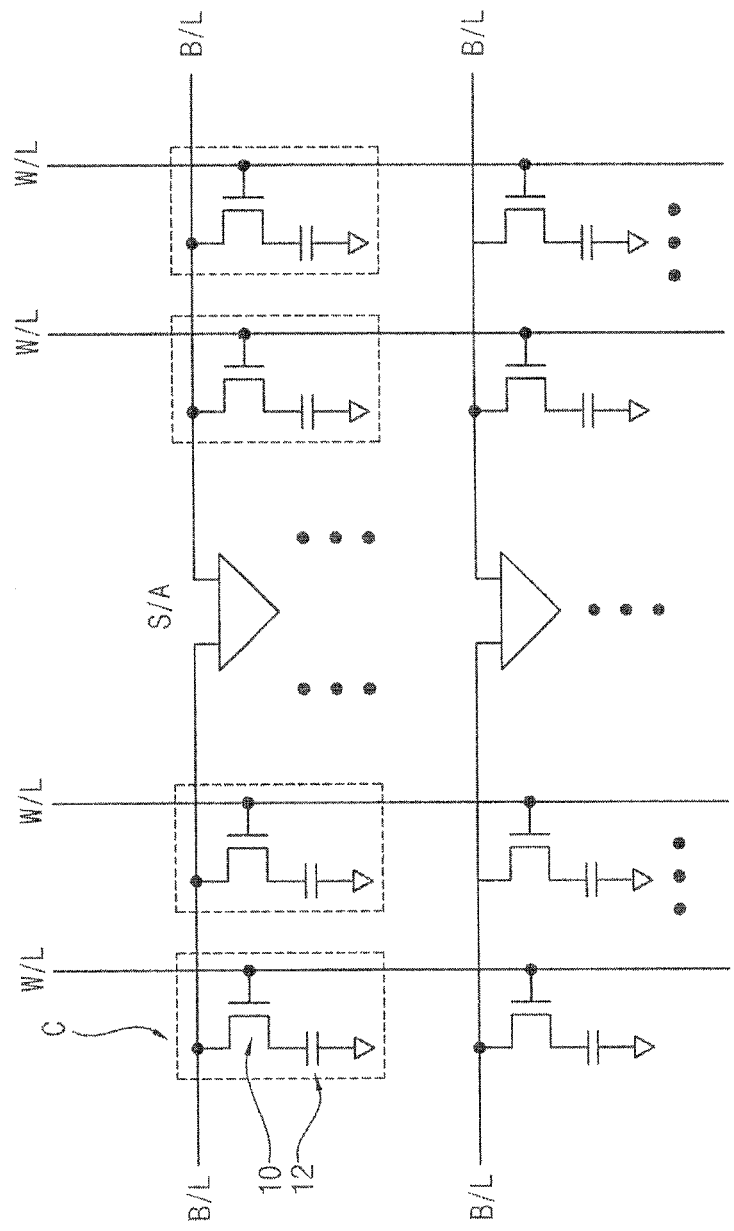
FIG. 12 is a circuit diagram illustrating a unit cell of a DRAM device.
Figure 13:
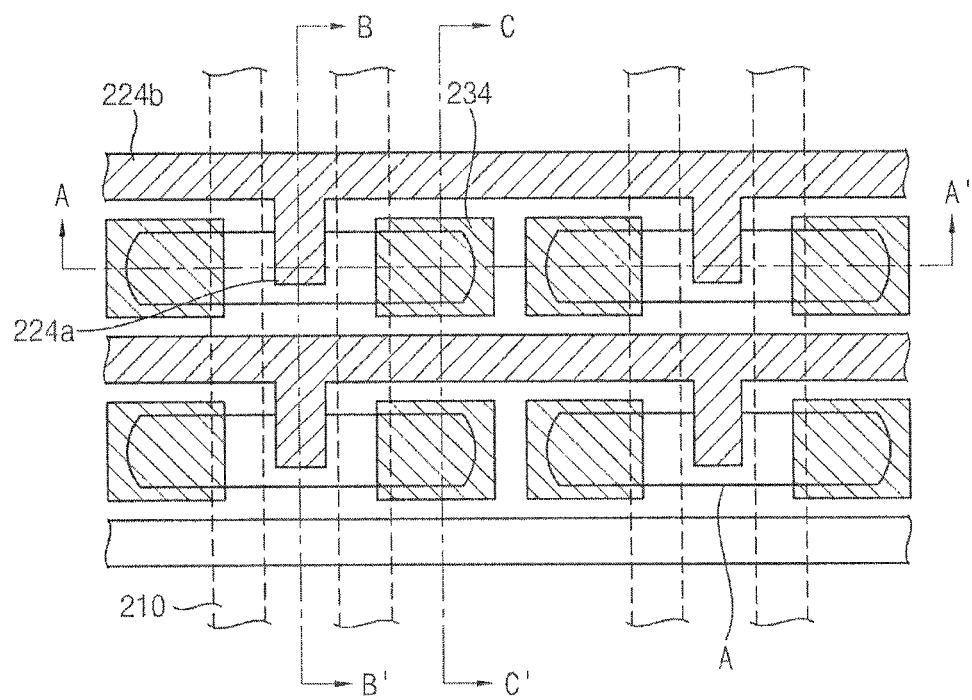
FIG. 13 is a plan view illustrating a DRAM device including the wiring structure in FIG. 1.
Figure 14:
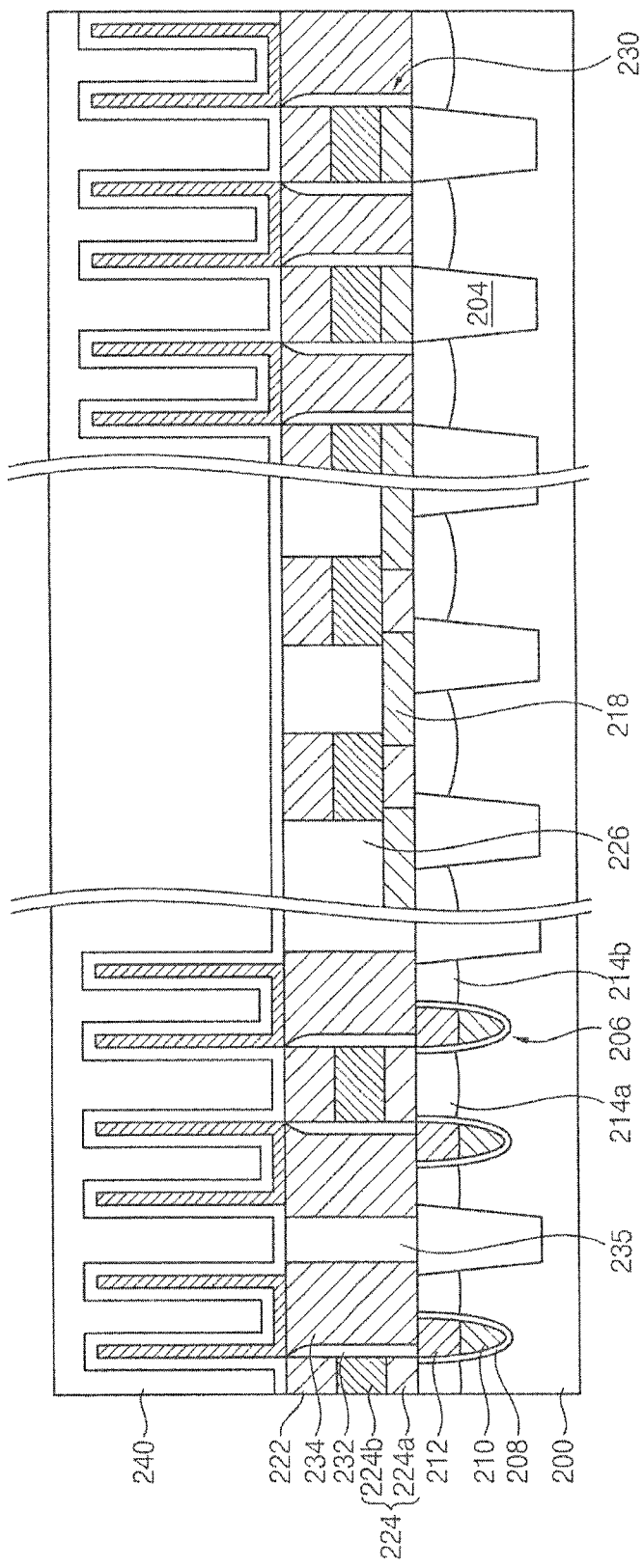
FIG. 14 is a cross sectional view illustrating the DRAM device in FIG. 13.

FIG. 12 a circuit diagram illustrating a unit cell of a DRAM device. FIG. 13 is a plan view illustrating a DRAM device including the wiring structure in FIG. 1. FIG. 14 is a cross sectional view illustrating the DRAM device in FIG. 13. In FIG. 14, a left part illustrates the DRAM device taken along a line of A-A' in FIG. 13, a central part illustrates the DRAM device taken along a line of B-B' in FIG. 13, and a right part illustrates the DRAM device taken along a line of C-C' in FIG. 13.

Referring to FIG. 12, a unit cell C in a DRAM device includes one N type metal oxide semiconductor (NMOS) transistor 10 and a capacitor 12 electrically connected with the NMOS transistor 10. The NMOS transistor may be controlled by a word line W/L. One impurity region of the NMOS transistor 10 may be electrically connected to a bit line B/L, and another impurity region of the NMOS transistor 10 may be electrically connected to a lower electrode of the capacitor 12. The lower electrode of the capacitor 12 may serve as a storage node for storing charges in the capacitor 12. An upper electrode of the capacitor 12 may be electrically connected with a common cell plate line, and a voltage may be applied to the upper electrode through the common cell plate line. A latch type bit line sensing amplifier S/A may have two output terminals electrically connected to a pair of the bit lines B/L.

The unit cells of the DRAM device may be provided on a semiconductor substrate, for example, a single crystalline silicon substrate. Wiring structures may be employed in the unit cell of the DRAM device considering electrical connections among impurity regions of a cell transistor, the bit line and the capacitor.

Hereinafter, a method of manufacturing a DRAM device including wiring structures in FIG. 1 will be described with reference to the accompanying drawings.

Referring to FIGS. 13 and 14, active regions A and isolation regions are defined on a substrate 200. Isolation trenches are formed in the isolation regions of the substrate 200, and the isolation trenches are filled with isolation layers 204, respectively. The active regions may be regularly arranged on the substrate 200. One active region may be isolated from adjacent active regions by isolation regions.

Trenches 206 for gate electrodes are formed in the active and the isolation regions. The trenches 206 for gate electrodes may extend along a first direction. The trenches 206 for gate electrodes may extend across the active regions A. Two MOS transistors may be positioned in one isolated active region A, so that two trenches 206 for gate electrodes may be parallely arranged in one isolated active region.

Gate oxide layers 208 are formed on sidewalls of the trenches 206 for gate electrodes in the active regions A. Each of the gate oxide layers 208 may include silicon oxide or metal oxide having a high dielectric constant. Examples of the metal oxide in each gate oxide layer 208 may include aluminum oxide (AlOx), titanium oxide (TiOx), tantalum oxide (TaOx), zirconium oxide (ZrOx), hafnium oxide (HfOx), or the like. These may be used alone or in a mixture thereof.

Gate structures are buried in the trenches 206 for gate electrodes. The gate structures include conductive layer patterns 210 and first hard mask patterns 212, respectively. Upper faces of the gate structures may be substantially the same as or lower than an upper face of the substrate 200. That is, the upper faces of the gate structures may not protrude from the substrate 200. The gate structures may serve as gate electrodes of selection transistors or word lines in a unit cell of the DRAM device.

The conductive layer patterns 210 may include polysilicon, metal and/or metal compounds. For example, the conductive layer patterns 210 may include polysilicon doped with impurities, tungsten, tungsten nitride, titanium, titanium nitride, tantalum, tantalum nitride, cobalt silicide, titanium silicide, tungsten silicide, or the like. These may be used alone or in a mixture thereof. The first hard mask patterns 212 may include nitride such as silicon nitride.

In the active regions, first and second impurity regions 214a and 214b are formed at portions of the substrate 200 adjacent to the gate structures. The first and the second impurity regions 214a and 214b may serve as source/drain regions of the selection transistors, respectively.

An etch stop layer 218 is formed on the substrate 200 and the isolation layer patterns 204 to cover the gate structures. The etch stop layer 218 may include material having an etching selectivity relative to an insulating interlayer 226. For example, the etch stop layer 270 may include nitride like silicon nitride. First contact holes are formed through the etch stop layer 218. The first contact holes expose the first impurity regions 214a in the active regions.

Bit line contacts 224a are provided in the first contact holes, and bit lines 224b are formed on the bit line contacts 224a and the etch stop layer 218. The bit lines 224b may be integrally formed with the bit line contacts 224a. Thus, bit line structures 224 including the bit line contacts 224a and the bit lines 224b are provided on the substrate 200.

In exemplary embodiments, at least portions of the bit line structures 224 may include metal silicide. For example, the bit line structures 224 may include cobalt silicide, titanium silicide, tantalum silicide, nickel silicide, platinum silicide, or the like. These may be used alone or in a mixture thereof.

The bit line structures 224 may have constructions substantially the same as or substantially similar to that of the wiring structure described with reference to FIGS. 1 and 2a. Alternatively, each of the bit line structures 224 may have a construction substantially different from that of the wiring structure described with reference to FIGS. 1 and 2a.

Second hard mask patterns 222 are formed on the bit line structures 224. The second hard mask patterns 222 may include nitride such as silicon nitride.

In exemplary embodiments, the bit line contacts 224a are formed through the etch stop layer 218 only without the insulating interlayer 226. That is, the insulating interlayer 226 may not be positioned adjacent to sides of the bit line contacts 224a, so that the bit line contacts 224a may have heights reduced by a thickness of the insulating interlayer 226. Therefore, the bit line structures 224 may have reduced heights because of the bit line contacts 224a having the reduced heights. When the bit line structures 224 have decreased heights, the bit line structures 224 may ensure low resistances required in the DRAM device because the bit line structures 224 include the metal silicide.

The insulating interlayer 226 is disposed on the etch stop layer 218. The insulating interlayer 226 may sufficiently fill up a gap between adjacent bit line structures 224.

Storage node contacts 234 are formed through the insulating interlayer 226 and the etch stop layer 218. Each of the storage node contacts 234 may electrically make contact with each second impurity region 214b. Insulators may be provided on sidewalls of the storage node contacts 234. For example, sidewall spacers 232 and insulation patterns 235 may be provided on the sidewalls of the storage node contacts 234. The storage node contacts 234 may include polysilicon.

Capacitors 240 are disposed on the storage node contacts 234 and the insulating interlayer 226. The capacitors 240 may have cylindrical structures for ensuring high storage capacitance, respectively. Alternatively, the capacitors 240 may have other structures such as stacked structures as occasion demands.

FIGS. 15 to 18, 19a, 20a and 21 are cross sectional views illustrating a method of manufacturing the DRAM device in FIG. 13. In FIGS. 15 to 18, 19a, 20a and 21, each of left parts illustrate the DRAM device taken along a line of A-A' in FIG. 13, each central part illustrates the DRAM device taken along a line of B-B' in FIG. 13, and each of right parts illustrate the DRAM device taken along a line of C-C' in FIG. 13.

Figure 15:
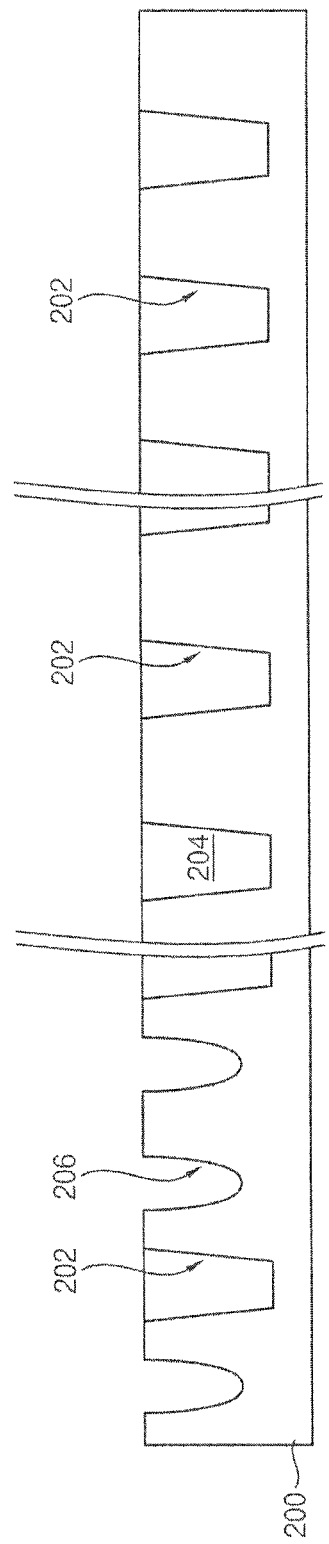
FIGS. 15 to 18, 19a, 20a and 21 are cross sectional views illustrating a method of manufacturing the DRAM device in FIG. 13.

Referring to FIG. 15, a pad oxide layer is formed on a substrate 200 having an active region and an isolation region. The substrate 200 may include a semiconductor material, for example, single crystalline silicon. A hard mask is formed on the pad oxide layer. The hard mask may serve as an etching mask for forming isolation trenches 202 on the substrate 200. The hard mask may be formed using a nitride like silicon nitride.

Using the hard mask an etching mask, the pad oxide layer and the substrate 200 in the isolation region are partially etched to form the isolation trenches 202 on the substrate 200. The active region may be isolated from adjacent active region by the isolation trench 202. Here, the active regions may be regularly defined on the substrate 200.

In some exemplary embodiments, portions of the substrate 200 consisting bottoms and sidewalls of the isolation trenches 202 may be thermally oxidized, so that inner oxide layers may be formed on the bottoms and the sidewalls of the isolation trenches 202. Further, nitride liners may be formed on the inner oxide layers and the hard mask.

An oxide layer is formed on the hard mask to fill up the isolation trenches 202. The oxide layer may be formed using high density plasma (HDP) oxide, tetraethylorthosilicate (TEOS), undoped silicate glass (USG), Tonen silazane (TOSZ), or the like. These may be used alone or in a combination thereof. In some exemplary embodiments, nitride layers or air gaps may be additional formed in the isolation trenches 202 filled with the oxide layer.

The oxide layer is removed until the hard mask is exposed, so that isolation layer patterns 204 are formed in the isolation trenches 202, respectively. The isolation layer patterns 204 may be formed by a chemical mechanical polishing (CMP) process and/or an etch-back process.

An organic anti-reflective layer is formed on the hard mask and the isolation layer patterns 204, and then the organic anti-reflective layer is etched by a photolithography process to form organic anti-reflective layer patterns on the hard mask and the isolation layer patterns 204. Each of the organic anti-reflective layer patterns may selectively expose a portion of the substrate 200 where a gate structure is formed. After the hard mask and the pad oxide layer may be etched using the organic anti-reflective layer patterns, the organic anti-reflective layer patterns may be removed from the hard mask and the isolation layer patterns 204. The organic anti-reflective layer patterns may be removed by an ashing process and/or a stripping process.

Referring now to FIG. 15, portions of the substrate 200 in the active and the isolation regions are anisotropically etched using the hard mask as an etching mask to form trenches 206 for gate electrodes on the substrate 200. Each of the trenches 206 for gate electrodes may extend across the active regions. In exemplary embodiments, two trenches 206 for gate electrodes may be formed in one isolated active region.

Figure 16:
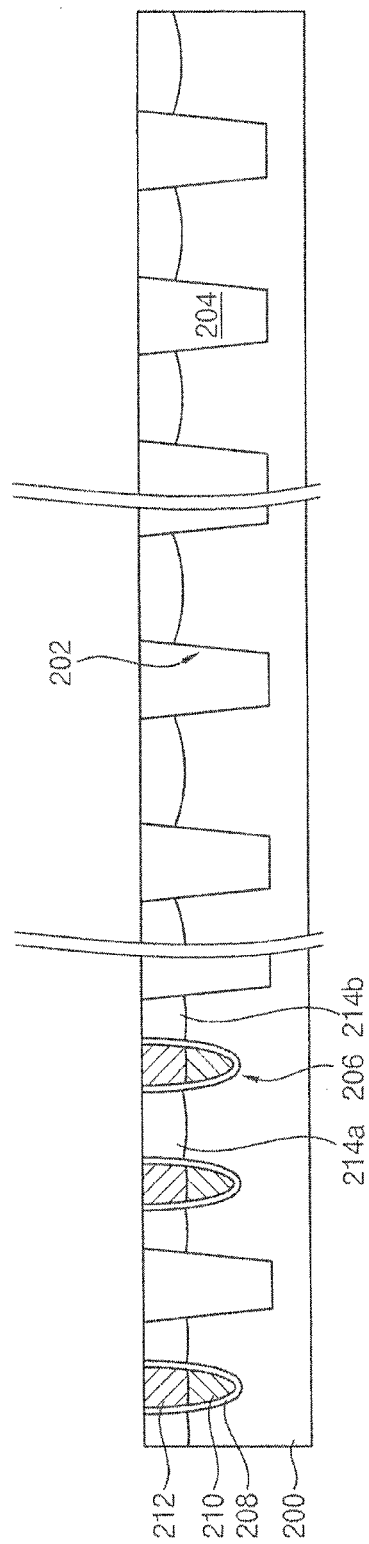

Referring to FIG. 16, gate insulation layers 208 are formed on bottoms and sidewalls of the trenches 206 for gate electrodes, respectively. For example, portions of the substrate 200 corresponding to the bottoms and the sidewalls of the trenches 206 for gate electrodes may be thermally oxidized to provide the gate insulation layers 208. Alternatively, each of the gate insulation layers 208 may be formed using metal oxide having a high dielectric constant by a chemical vapor deposition (CVD) process or an atomic layer deposition (ALD) process. Examples of the metal oxide in the gate insulation layer 208 may include aluminum oxide (AlOx), titanium oxide (TiOx), tantalum oxide (TaOx), zirconium oxide (ZrOx), hafnium oxide (HfOx), or the like. These may be used alone or in a mixture thereof.

A conductive layer for gate electrodes on the gate insulation layers 208 to fully fill up the trenches 206 for gate electrodes. The conductive layer for gate electrodes may be formed using a semiconductor material such as polysilicon, metal and/or metal compound. Examples the material in the conductive layer may include doped polysilicon, tungsten, copper, titanium nitride, tantalum nitride, titanium silicide, tungsten silicide, titanium, tantalum, tantalum nitride, cobalt silicide, nickel silicide, or the like. These may be used alone or in a combination thereof.

The conductive layer for gate electrodes is partially removed to form conductive layer patterns 210 on the gate insulation layers 208. The conductive layer patterns 210 may partially fill up the trenches 206 for gate electrodes. The conductive layer patterns 210 may be obtained by a wet etching process or a dry etching process after performing a chemical mechanical polishing (CMP) process and/or an etch-back process about the conductive layer for gate electrodes.

In exemplary embodiments, the conductive layer patterns 210 may be formed by a damascene process instead of a photolithography process. Hence, the conductive layer patterns 210 may be formed using metal (e.g., copper) which is hardly etched through the photolithography process.

A hard mask layer is formed on the conductive layer patterns 210 to completely fill up the trenches 206 for gate electrodes. The hard mask layer may be formed by a chemical vapor deposition (CVD) process using nitride such as silicon nitride. The hard mask layer is partially removed to form first hard mask patterns 212 on the conductive layer patterns 210. The first hard mask patterns 212 may be obtained by a CMP process and/or an etch-back process. The first hard mask patterns 212 may fully fill up trenches 206 for gate electrodes. That is, the trenches 206 for gate electrodes may be filled with gate structures including the gate insulation layers 208, the conductive layer patterns 210 and the first hard mask patterns 212, respectively. The first hard mask patterns 212 may protect the conductive layer patterns 210 serving as gate electrodes and word lines in the semiconductor device.

As described above, each of the gate structures includes the gate insulation layer 208, the conductive layer pattern 210 and the first hard mask pattern 212 filling the trench 206. Further, each gate structure may have an upper face substantially the same or lower than an upper face of the substrate 200.

Impurities are doped into portions of the active region adjacent to the gate structures, so that first impurity regions 214a and second impurity regions 214b are formed at portions of the substrate 200 adjacent to the gate structures, respectively. Therefore, selection transistors of the DRAM device may be formed on the substrate 200. Here, the first hard mask patterns 212 may serve as implantation masks for forming the first and the second impurity regions 214*a* and 214*b* by an ion implantation process.

Figure 17:
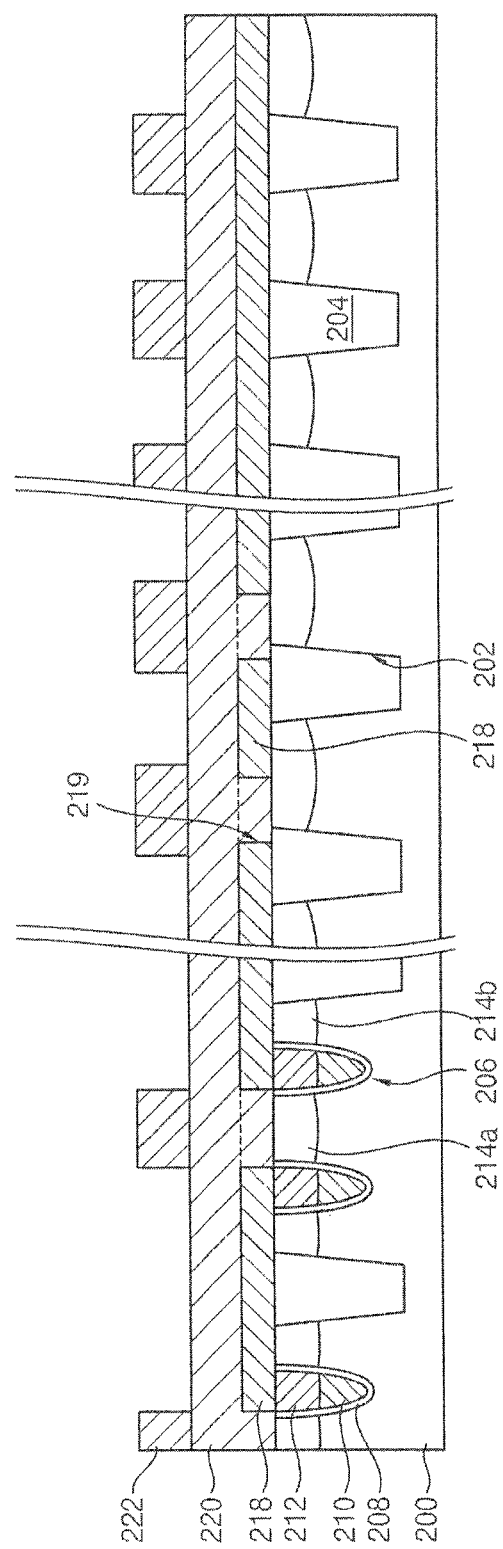

Referring to FIG. 17, an etch stop layer 218 is formed on the substrate 200 having the selection transistors formed thereon. The etch stop layer 218 may be formed using nitride like silicon nitride.

The etch stop layer 218 is partially etched by a photolithography process to form first contact holes 219 through the etch stop layer 218. The first contact holes 219 may expose the first impurity regions 214*a* of the substrate 200.

A polysilicon layer 220 is formed on the etch stop layer 218 to fill up the first contact holes 219, and second hard mask patterns 222 for bit line structures 224 are formed on the polysilicon layer 220.

In exemplary embodiments, the second hard mask patterns 222 may have line shapes that extend across the active regions along the first direction. The second hard mask patterns 222 may extend substantially perpendicular relative to the gate structures. Additionally, the second hard mask patterns 222 may pass the isolation regions between adjacent active regions, and may have protruding portions positioned over the first impurity regions 214*a*. The protruding portions may extend from lateral portions of the second hard mask patterns 222, respectively.

Figure 18:
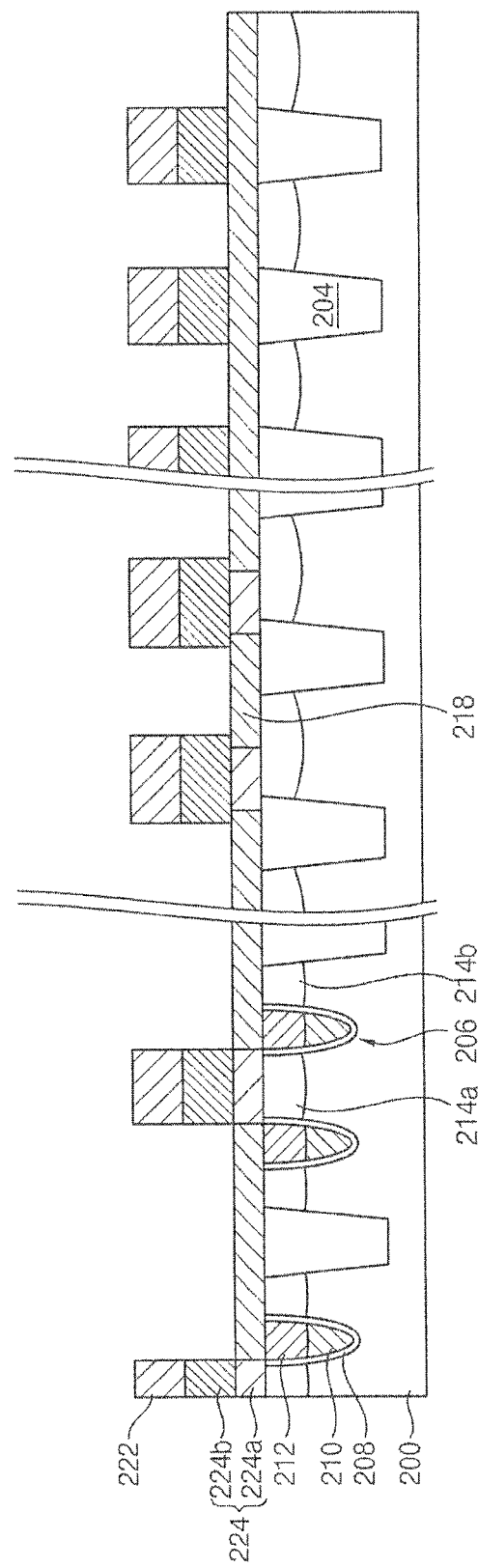

Referring to FIG. 18, the polysilicon layer 220 is etched using the second hard mask patterns 222 as etching masks, so that preliminary conductive patterns are formed on the first impurity regions 214*a*. The preliminary conductive patterns may fill up the first contact holes 219 and may protrude from an upper face of the etch stop layer 218.

A metal layer is formed on the etch stop layer 218 to cover the preliminary conductive patterns, and then a silicidation process is executed on the metal layer and the preliminary conductive patterns to form metal silicide in at least one portion of each preliminary conductive pattern. Therefore, the bit line structures 224 including the metal silicide are formed on the substrate 200. Each of the bit line structures 224 includes a bit line contact 224*a* and a bit line 224*b*. Here, the bit line contact 224*a* and the bit line 224*b* may be obtained by one deposition process, so that the bit line contact 224*a* and the bit line 224*b* may be integrally formed.

Because the second hard mask patterns 222 may pass the isolation regions between active regions and may have the protruding portions extended over the first impurity regions 214*a*, the bit lines 224*b* may also have protruding portions that protruded from sides of the bit lines 224*a* to cover the first impurity regions 214*a* in the active regions as illustrated in FIG. 13.

In exemplary embodiments, processes for forming the preliminary conductive patterns and the bit line structures 224 may be substantially the same as or substantially similar to those described with reference to FIGS. 5 to 7.

Figure 19A:
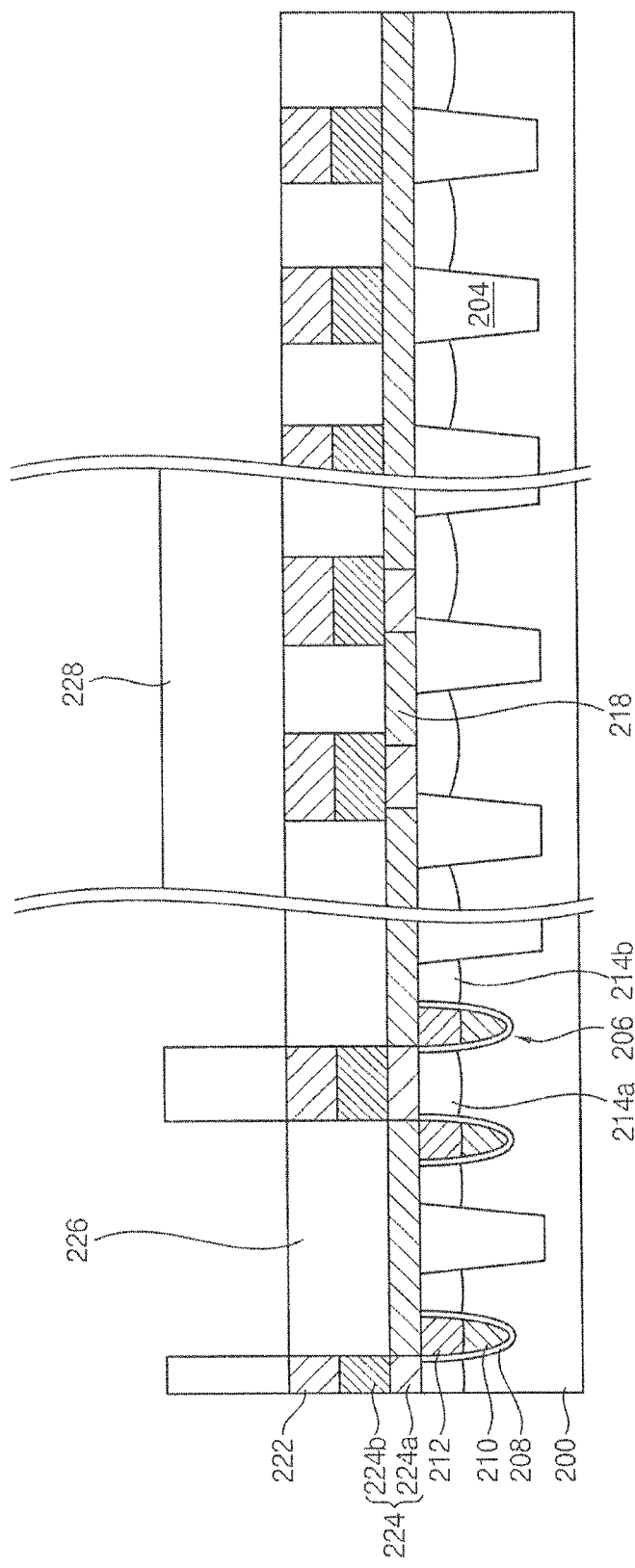

Referring to FIG. 19*a*, an insulating interlayer 226 is formed to cover the bit line structures 224. The insulating interlayer 226 may sufficiently fill up a gap between adjacent bit line structures 224. The insulating interlayer 226 may be formed by processes substantially the same as or substantially similar to those described with reference to FIG. 5.

A photoresist pattern 228 is formed on the insulating interlayer 226. The photoresist pattern 228 may have a line shape extending along a second direction substantially perpendicular to the first direction. The photoresist pattern 228 may expose portions of the insulating interlayer 226 under which the second impurity regions 214*b* are located.

In exemplary embodiments, the photoresist pattern 228 may cover portions of the substrate 200 including the first impurity regions 214*a*. Hence, the isolation regions between adjacent active regions may be exposed by the photoresist pattern 228, so that the second impurity regions 214*b* in adjacent active regions may also be exposed after forming the photoresist pattern 228. Storage node contacts will be formed on the exposed second impurity regions 214*b*.

Figure 20A:
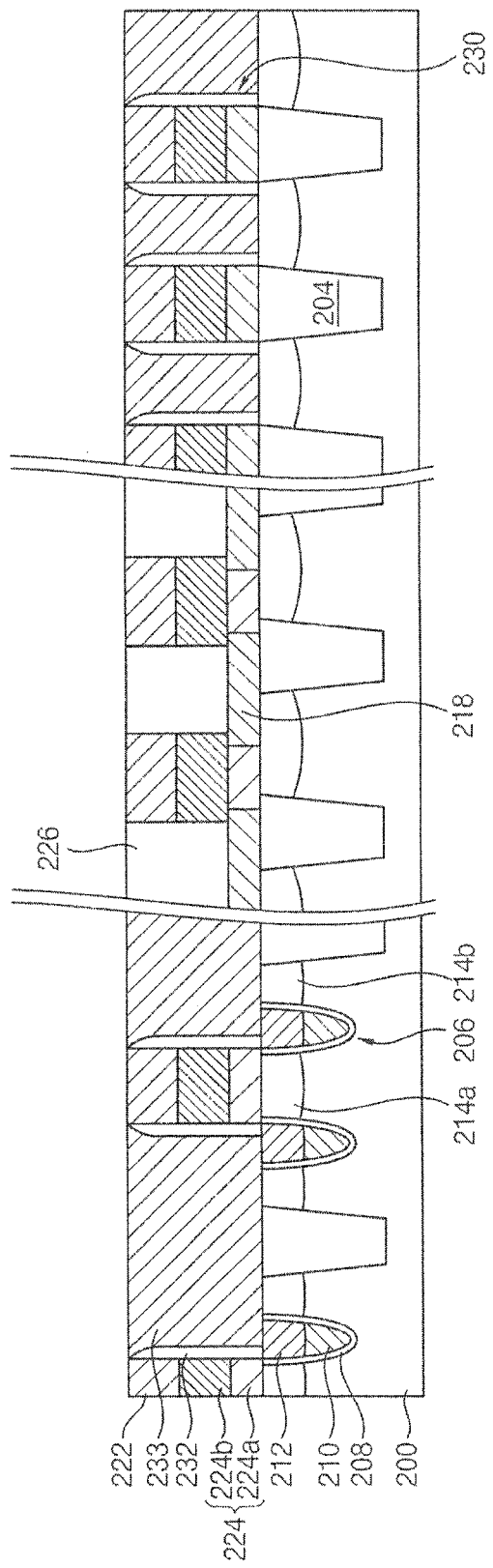

Referring to FIG. 20*a*, the exposed portions of the insulating interlayer 226 by the photoresist pattern 228 and the second hard mask patterns 222 are etched. Then, portions of the etch stop layer 218 are etched to expose portions of the substrate 200. Thus, second contact holes 230 are formed through the insulating interlayer 226.

When the etch stop layer 218 and the insulating interlayer 226 are partially etched using the photoresist pattern 228 as an etching mask, the second contact holes 230 may simultaneously expose two adjacent second impurity regions 214*b* and the isolation region adjacent to the second impurity regions 214*b*. Here, the exposed second impurity regions 214*b* may correspond to storage node contact regions.

Sidewall spacers 232 are formed on sidewalls of the second contact holes 230. Each of the sidewall spacers 232 may be formed using an insulation material. Therefore, the storage node contacts may be electrically insulated from adjacent bit line structures 224.

After a conductive material is deposited to fill the second contact holes 230, the conductive material is partially removed until the second hard mask patterns 222 are exposed, thereby forming preliminary storage node contacts 233 in the second contact holes 230. The conductive material may be easily etched by a dry etching process. For example, the conductive material may include polysilicon.

In exemplary embodiments, one preliminary storage node contact 233 may simultaneously make contact with two second impurity regions 214*b* positioned in adjacent active regions.

Figure 21:
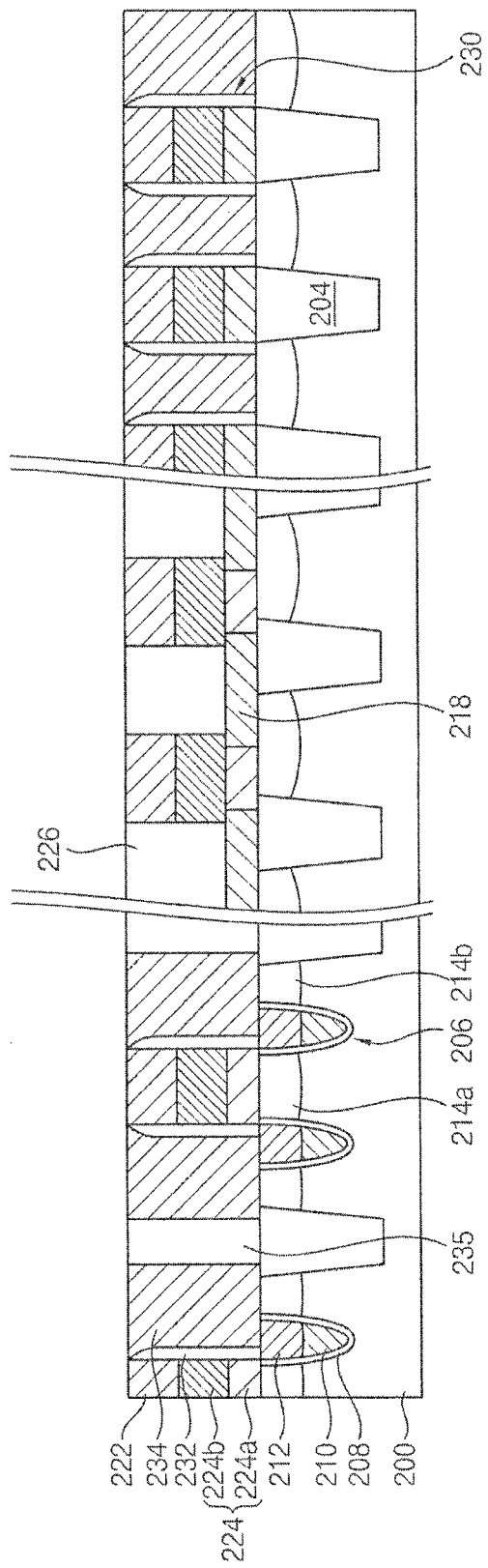

Referring to FIG. 21, one preliminary storage node contact 233 is divided into two storage node contacts 234 to electrically connect the storage node contacts 234 to the second impurity regions 214*b*. That is, the storage node contacts 234 may electrically make contact with the second impurity regions 214*b*, respectively.

In the formations of the storage node contacts 234, a photoresist pattern may be formed on the preliminary storage node contacts 233 and the insulating interlayer 226. The photoresist pattern may have a structure that exposes the isolation regions adjacent to the preliminary storage node contacts 233. For example, the photoresist pattern may have a line shape. Using the photoresist pattern as an etching mask, the preliminary storage node contacts 233 may be partially etched until an adjacent isolation region is exposed. As a result, two storage node contacts 234 may be formed from one preliminary storage node contacts 233 near both sides of the adjacent isolation region. The divided storage node contacts 234 may electrically make contact with two second impurity regions 214*b*, respectively.

After an insulation material is formed to fill a gap between adjacent storage node contacts 234, the insulation material is planarized to form insulation patterns 235 between the storage node contacts 234. For example, each of the insulation patterns 235 may include oxide such as silicon oxide.

According to exemplary embodiments, the sidewall spacers 232 may not be formed on sidewalls of some storage node contacts 234 contacting the insulation patterns 235, whereas the sidewall spacers 232 may be formed on sidewalls of other storage node contacts 234. That is, the sidewall spacers 232 may be provided on the sidewalls of the storage node contacts 234 that make contact with the bit line structures 224.

In some exemplary embodiments, the storage node contacts 234 may be obtained without dividing the preliminary storage node contacts 233. Namely, the storage node contacts 234 may be directly formed on corresponding second impurity regions 214a.

Figure 20B:
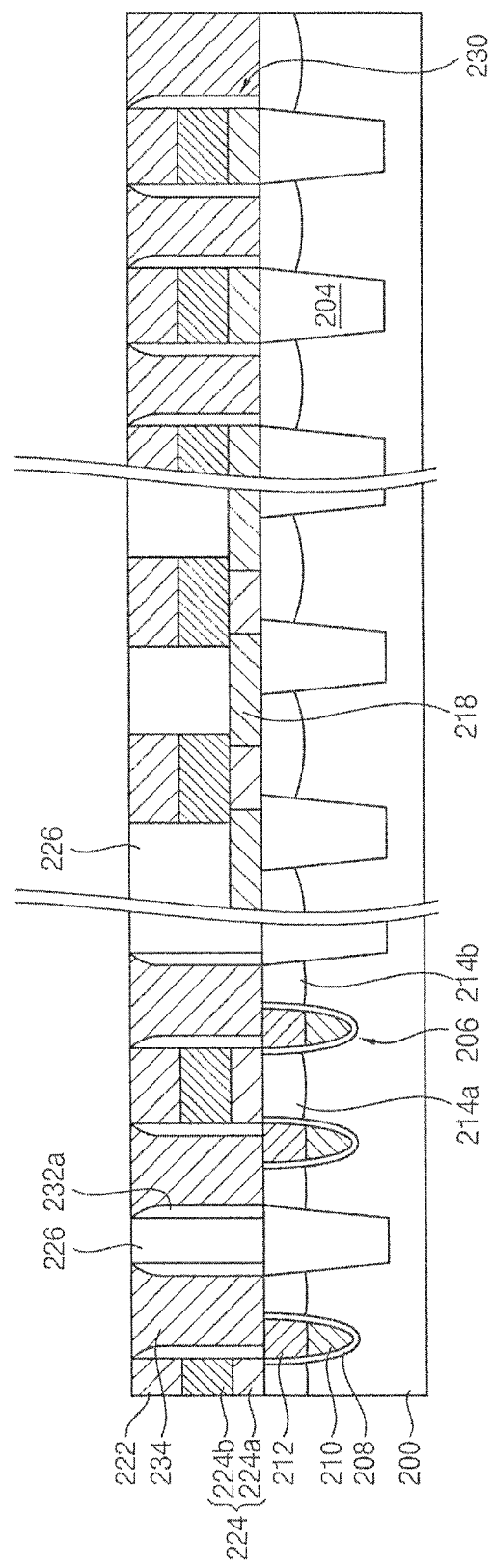

FIGS. 19b and 20b are cross sectional views illustrating processes for forming a storage node contact in accordance other exemplary embodiments. Referring to FIG. 19b, in the formations of the storage node contacts 234, a photoresist pattern 228a for forming the second contact holes 230 may cover the first impurity regions 214a of the substrate 200 and the isolation regions between adjacent active regions along the first direction.

Referring to FIG. 20b, using the photoresist pattern 228a as an etching mask, the insulating interlayer 226 and the etch stop layer 218 may be sequentially etched to form the second contact holes 230 exposing the second impurity regions 214b. The sidewall spacers 232 may be formed on the sidewalls of the second contact holes 230, and a conductive material may be formed to fill up the second contact holes 230. After planarizing the conductive material, the storage node contacts 234 may be directly formed on the second impurity regions 214b, respectively. Here, the sidewall spacers 232 may be positioned on the sidewalls of the storage node contacts 234.

Capacitors 240 may be formed to make contact with the storage node contacts 234 as illustrated in FIG. 14. Each of the capacitors 240 may have a cylindrical structure or a stacked structure.

Figure 22:
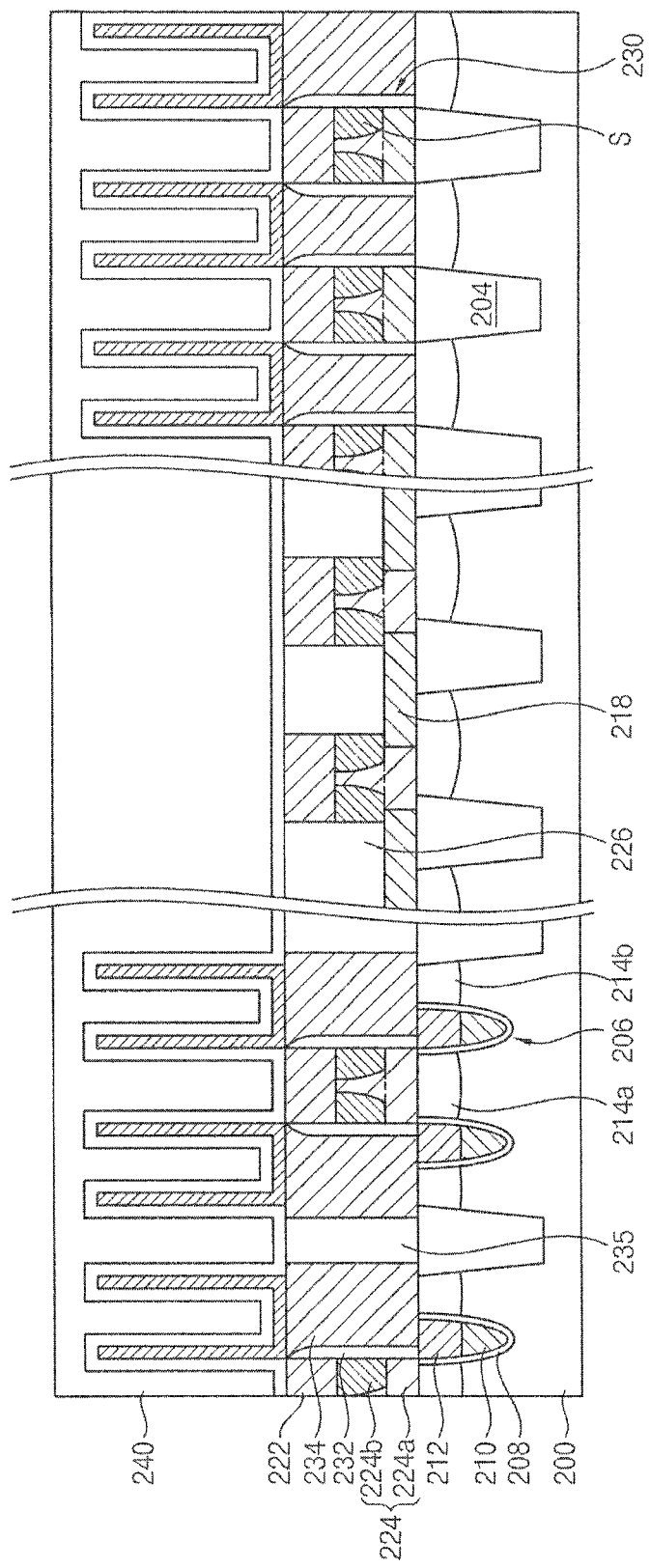
FIG. 22 is a cross sectional view illustrating a DRAM device in accordance with another exemplary embodiment of the present disclosure.

FIG. 22 is a cross sectional view illustrating a DRAM device in accordance with a second embodiment. The DRAM device illustrated in FIG. 22 may have a construction substantially the same as or substantially similar to that of the DRAM device described with reference to FIG. 14 except for metal silicide in bit lines.

Referring to FIG. 22, the DRAM device includes a bit line structure 224 having at least a portion that includes metal silicide S. The bit line structure 224 includes a bit line 224b and a bit line contact 224a.

The metal silicide S may be disposed in lateral portions of the bit line 224b in the bit line structure 224. Other portions of the bit line 224b and the bit line contact 224a may remain polysilicon.

The DRAM device illustrated in FIG. 22 may be manufactured through processes substantially the same as or substantially similar to those described with reference to FIGS. 15 to 20 except for processes for forming the metal silicide S. In the formation of the metal silicide S, a silicidation reaction may occur at a lateral portion of a preliminary conductive layer pattern in FIG. 18 by adjusting process conditions of a silicidation process, thereby obtaining the DRAM device having a construction illustrated in FIG. 22.

Figure 23:
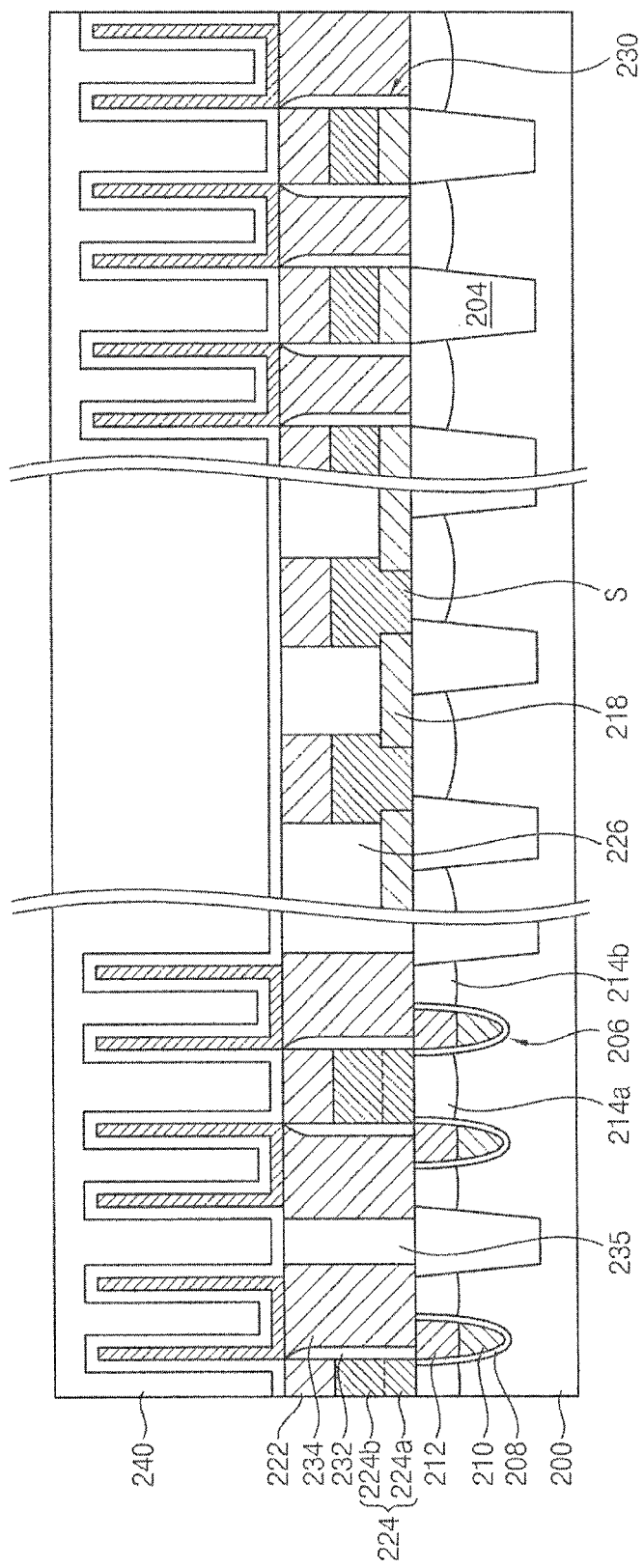
FIG. 23 is a cross sectional view illustrating a DRAM device in accordance with another exemplary embodiment of the present disclosure.

FIG. 23 is a cross sectional view illustrating a DRAM device in accordance with a third embodiment. The DRAM device illustrated in FIG. 23 may have a construction substantially the same as or substantially similar to that of the DRAM device described with reference to FIG. 14 except for a bit line including metal silicide.

Referring to FIG. 23, the DRAM device includes a bit line structure 224 including metal silicide S. The bit line structure 224 has a bit line 224b and a bit line contact 224a. Each of the bit line 224b and the bit line contact 224a includes the metal silicide S. Alternatively, the bit line 224b may include the metal silicide S whereas the bit line contact 224a has an upper portion including the metal silicide S.

In manufacturing the DRAM device illustrated in FIG. 23, a silicidation process may be performed for entire portions of a preliminary conductive layer pattern in FIG. 18 by adjusting process conditions of the silicidation process, so that the DRAM device having a construction illustrated in FIG. 23 may be provided.

Figure 24:
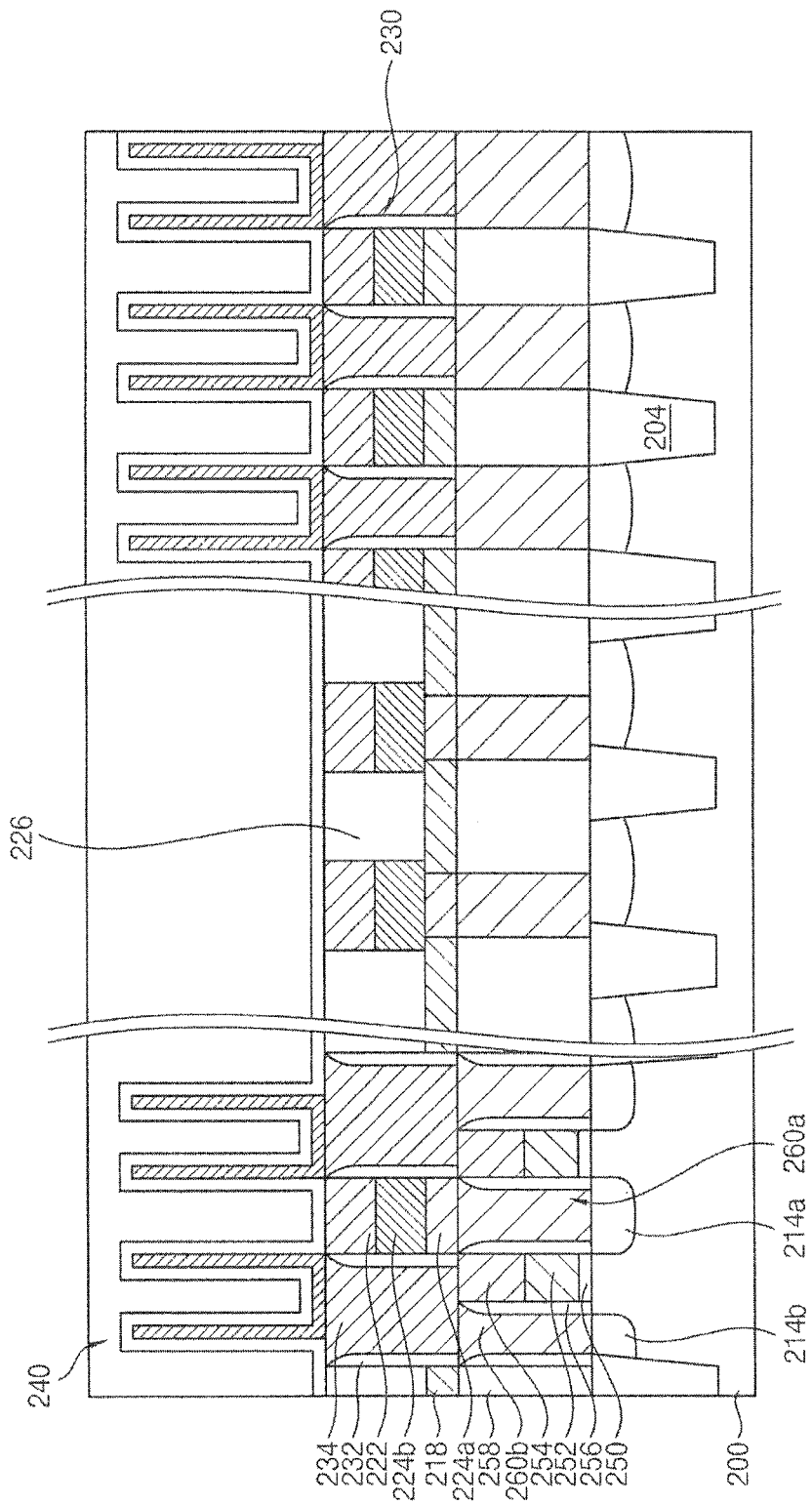
FIG. 24 is a cross sectional view illustrating a DRAM device in accordance with another exemplary embodiment of the present disclosure.

FIG. 24 is a cross sectional view illustrating a DRAM device in accordance with a fourth embodiment. The DRAM device illustrated in FIG. 24 includes a wiring structure having constructions substantially the same as or substantially similar to that of the wiring structure in FIG. 1.

Referring to FIG. 24, an active region and an isolation region are defined on a substrate 200. An isolation trench is formed in the isolation region of the substrate 200, and the isolation trench is filled with an isolation layer pattern 204.

Gate structures are formed on the active region and the isolation region. Each of the gate structures may have a line shape extending in a first direction. The gate structures are provided on the substrate 200, so that the gate structures have upper faces higher than that of the substrate 200. Each of the gate structures include a gate oxide layer 250, a conductive layer pattern 252 and a first hard mask pattern 254. Spacers 256 are provided on sidewalls of each gate structure.

In some exemplary embodiments, the gate structures may have lower portions filling recesses formed in the substrate 200. That is, each of the gate structures may have a recessed gate shape.

A first impurity region 214a and a second impurity region 214b are formed at portions of the substrate 200 adjacent to the gate structure.

A lower insulating interlayer 258 is formed on the substrate 200 to cover the gate structures. The lower insulating interlayer 258 may have an upper face substantially the same or substantially similar to an upper face of the first hard mask pattern 254. Namely, the upper faces of the lower insulating interlayer 258 and the first hard mask pattern 254 may be located on substantially the same plane. Alternatively, the upper face of the lower insulating interlayer 258 may be higher than the upper face of the first hard mask pattern 254.

A first contact pad 260a and a second contact pad 260b are formed through the lower insulating interlayer 258. The first and the second contact pads 260a and 260b may be electrically connected with the first and the second impurity regions 214a and 214b, respectively.

An etch stop layer 218 is formed on the lower insulating interlayer 258, the first contact pad 260a and the second contact pad 260b. A bit line contact 224a is formed through the etch stop layer 218. The bit line contact 224a may make electrical contact with the first contact pad 260a. A bit line 224b is formed on the etch stop layer 218 and the bit line contact 224a. The bit line 224b and the bit line contact 224a may be integrally formed. The bit line 224a may have at least one portion including metal silicide. A bit line structure 224 having the bit line 224b and the bit line contact 224a may have a construction substantially the same as or substantially similar to that of the first wiring described with reference to FIG. 1. A second hard mask pattern 222 is disposed on the bit line structure 224.

An insulating interlayer 226 is disposed between adjacent bit line structures 224. A storage node contact 234 is formed through the insulating interlayer 226 and the etch stop layer 218. The storage node contact 234 may electrically make contact with at least one portion of the second contact pad 260b. A sidewall spacer 232 including an insulation material is provided on a sidewall of the storage node contact 234.

A capacitor 240 is formed on the storage node contact 234 and the insulating interlayer 226. The capacitors 240 may have cylindrical structure or a stacked structure.

Figure 25:
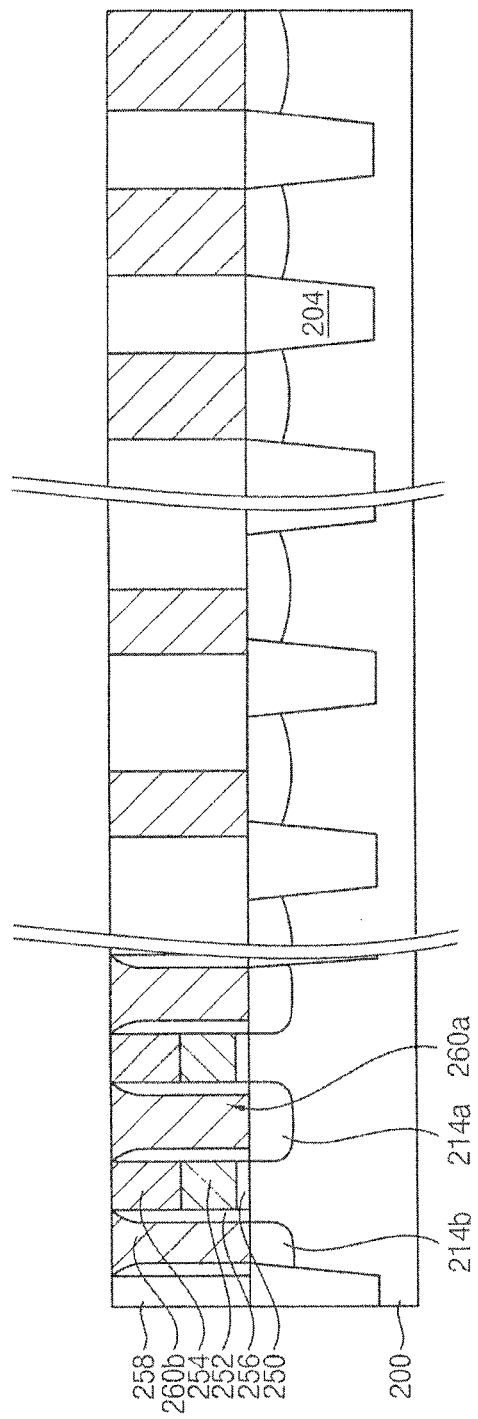
FIGS. 25 to 27 are cross sectional views illustrating a method of manufacturing the DRAM device in FIG. 24.
Figure 26:
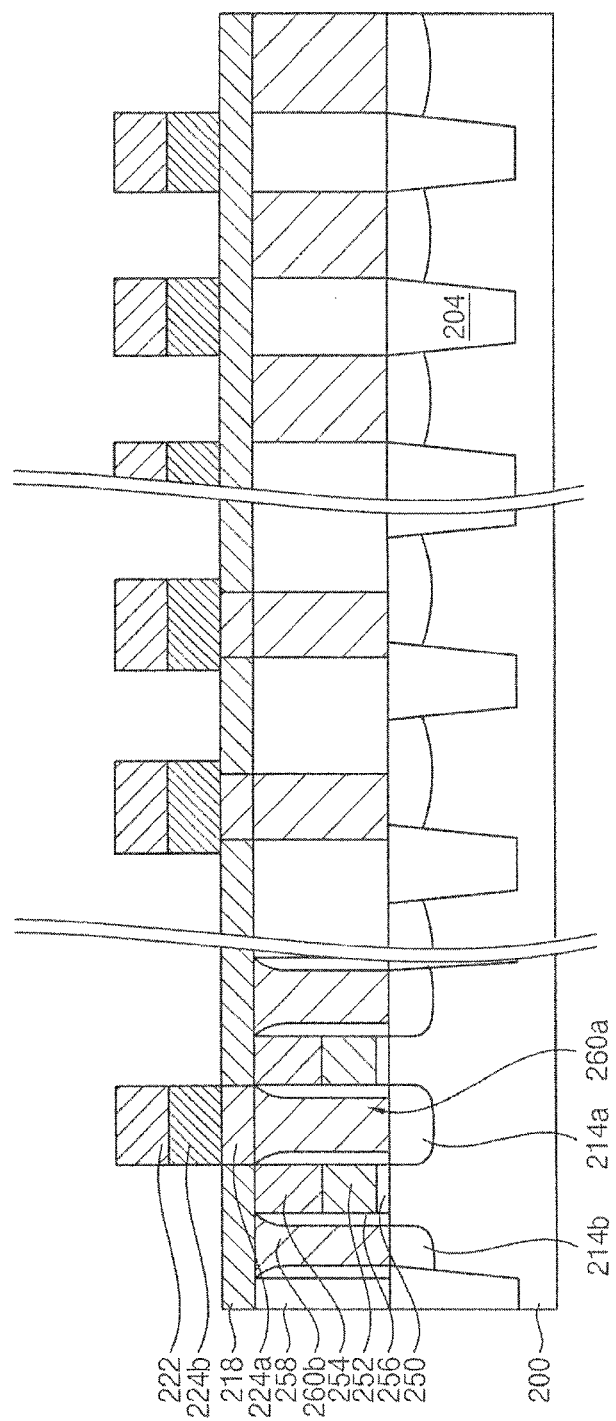
Figure 27:
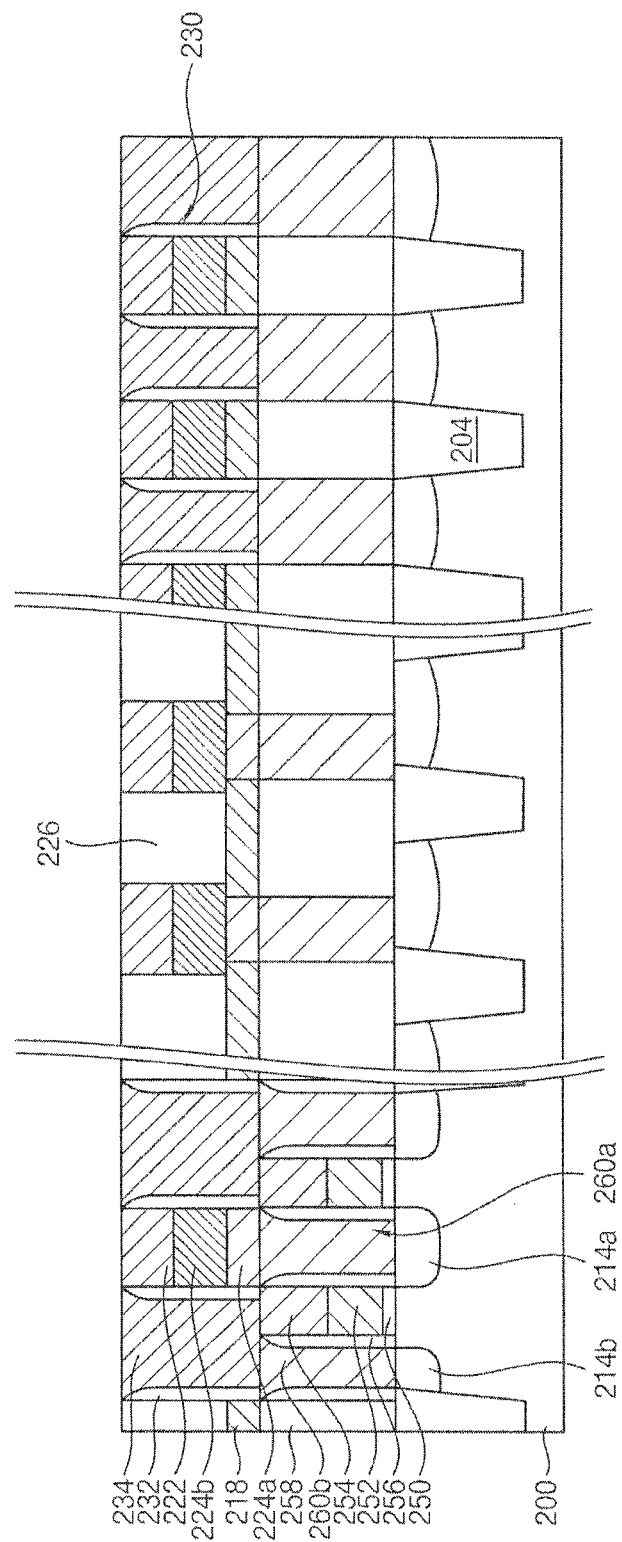

FIGS. 25 to 27 are cross sectional views illustrating a method of manufacturing the DRAM device in FIG. 24.

Referring to FIG. 25, an isolation layer pattern 204 is formed on a substrate by an isolation process to define an active region and an isolation region of the substrate 200. The substrate 200 may include a semiconductor material, for example, single crystalline silicon.

A gate oxide layer 250 is formed in the active region of the substrate 200. A conductive layer for a gate electrode is formed on the gate oxide layer 250. A first hard mask layer is formed on the conductive layer. The first hard mask layer may be formed using nitride, for example, silicon nitride.

The first hard mask layer is etched by a photolithography process to form a first hard mask pattern 254 on the conductive layer. The first hard mask pattern 254 may have a line shape extending across the active region. In exemplary embodiments, two first hard mask patterns 254 may be provided in one active region.

The conductive layer is etched using the first hard mask pattern 254 as an etching mask, so that a conductive layer pattern 252 is formed on the gate oxide layer 250. The conductive layer 252 may serve as a gate electrode in a word line. When the conductive layer pattern 252 is formed, a gate structure is formed in the active region. The gate structure includes the gate oxide layer 250, the conductive layer pattern 252 and the first hard mask pattern 254.

A spacer formation layer is formed on the substrate 200 to cover the conductive layer pattern 252 and the first hard mask pattern 254. The spacer formation layer may be conformably formed along profiles of the gate structure. The spacer formation layer is anisotropically etched to form a spacer 256 on a sidewall of the gate structure.

Impurities are implanted into portions of the substrate 200 adjacent to the gate structure, such that a first impurity region 214a and a second impurity region 214b are formed at the portions of the substrate 200.

A lower insulating interlayer 258 is formed on the substrate 200 to fill up a gap between adjacent gate structures. The lower insulating interlayer 258 may be obtained by partially removing an oxide layer until the first hard mask pattern 254 is exposed after forming the oxide layer covering the gate structure.

The lowest insulating interlayer 258 is partially etched by a photolithography process to form contact holes that expose the first and the second impurity regions 214a and 214b, respectively. The contact holes are filled with a conductive material, and then the conductive material is partially removed until the lower insulating interlayer 258 is exposed. Thus, contact pads 260a and 260b are formed in the contact holes. The contact pads 260a and 260b make contact with the first and the second impurity regions 214a and 214b.

In exemplary embodiments, a first contact pad 260a filling one contact hole is positioned on the first impurity region 214a. That is, the first contact pad 260a may make contact with the first impurity region 214a through the lower insulating interlayer 258. Similarly, a second contact pad 260b filling the other contact hole may make contact with the second impurity region 214b through the lower insulating interlayer 258.

Referring to FIG. 26, an etch stop layer 218 is formed on the lower insulating interlayer 258, the first contact pad 260a and the second contact pad 260b. The etch stop layer 218 is partially etched by a photolithography process to form a first contact hole through the etch stop layer 218. The first contact hole may expose the first contact pad 260a.

A polysilicon layer is formed on the etch stop layer 218 to fill up the first contact hole. A second hard mask pattern 222 for a bit line is formed on the polysilicon layer.

Using the second hard mask pattern 222 as an etching mask, the polysilicon layer is etched to form a preliminary conductive pattern. A metal layer is formed on the preliminary conductive pattern, the etch stop layer 218 and the second hard mask pattern 222. A silicidation process is carried out about the metal layer and the preliminary conductive pattern, so that metal silicide is formed at the preliminary conductive pattern. Here, at least one portion of the preliminary conductive may be silicided. Therefore, a bit line structure having a bit line contact 224a and a bit line 224b is formed on the substrate 200.

In exemplary embodiments, processes for forming the preliminary conductive pattern and the bit line structure may be substantially the same as or substantially similar to those described with reference to FIG. 18.

Referring to FIG. 27, an insulating interlayer 226 is formed on the etch stop layer 218 to fill up a gap between adjacent bit lines. The insulating interlayer 226 is partially etched, and then the etch stop layer 218 is also partially etched to form a second contact hole through the insulating interlayer 226 and the etch stop layer 218. The second contact hole may expose at least a portion of the second contact pad 260b. That is, the second contact pad 260b may be partially or entirely exposed by the second contact hole. Processes for forming the insulating interlayer 226 and the second contact hole may be substantially the same as or substantially similar to those described with reference to FIGS. 19 to 21.

A sidewall spacer 232 is formed on a sidewall of the second contact hole. Then, a conductive material is formed in the second contact hole to form a storage node contact 234 filling the second contact hole. As illustrated in FIG. 24, a capacitor 240 is formed to be electrically connected with the storage node contact 234.

Figure 28:
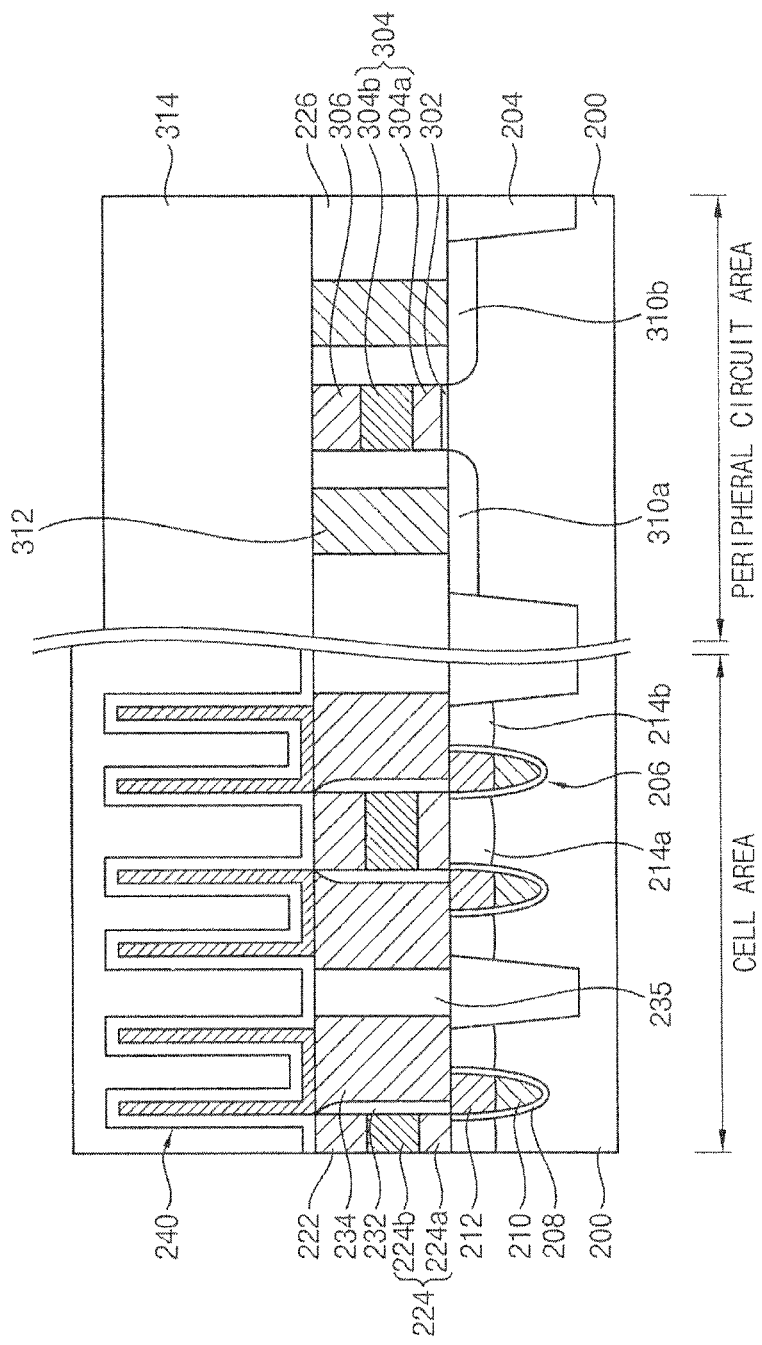
FIG. 28 is a cross sectional view illustrating a DRAM device in accordance with another exemplary embodiment of the present disclosure.

FIG. 28 is a cross sectional view illustrating a DRAM device in accordance with a fifth embodiment. The DRAM device in FIG. 28 includes unit cells having constructions substantially the same as or substantially similar to those of the unit cells of the DRAM device described with reference to FIG. 14. The DRAM device includes a planar transistor in a peripheral circuit area.

Referring to FIG. 28, the DRAM device includes the unit cells in a cell area substantially the same as or substantially similar to those of the unit cells of the DRAM device described with reference to FIG. 14. Thus, detailed descriptions of the unit cells in the cell area may be omitted, and elements formed in the peripheral circuit area will be described.

An isolation layer pattern 204 is formed on the peripheral circuit area of a substrate 200 to define an active region and an isolation region. A second gate structure is provided on the peripheral circuit area of the substrate 200. The second gate structure includes a gate insulation layer 302, a second gate electrode 304 and a third hard mask pattern 306. Here, the second gate electrode 304 includes a polysilicon pattern 304a and metal silicide 304b. Further, a third impurity region 310a and a fourth impurity region 310b are formed at portions of the substrate 200 adjacent to the second gate structure. The third and the fourth impurity regions 310a and 310b may serve as source/drain regions.

In exemplary embodiments, the second gate structure in the peripheral circuit area may have a construction substantially the same as or substantially similar to that consisting of a bit line contact 224a, a bit line 224b and a second hard mask pattern 222 in the cell area except that the gate insulation layer 302 is formed on the substrate 200. For example, the second gate electrode 304 includes a material contained in the bit line contact 224a and another material included in the bit line 224b. Thus, the second gate electrode 302 may have at least one portion including metal silicide, thereby ensuring a low resistance of the second gate electrode 302. The third hard mask pattern 306 may include a material substantially the same as that in the second hard mask pattern 222 positioned on the bit line 224b. For example, the third hard mask pattern 306 may include nitride, such as silicon nitride. Upper faces of the second and the third hard mask patterns 222 and 306 may be located on the same plane.

An insulating interlayer 226 is formed to fill up a gap between adjacent second gate structures. The insulating interlayer 226 may include a material substantially the same as that of the insulating interlayer in the cell area.

Second contact plugs 312 are formed through the insulating interlayer 226. The second contact plugs 312 may electrically contact the third and the fourth impurity regions 310a and 310b, respectively. An insulation pattern 235 is formed between adjacent second contact plugs 312. An upper insulating interlayer 314 is provided on the second contact plugs 312 and the insulating interlayer 226.

FIGS. 29 to 34 are cross sectional views illustrating a method of manufacturing the DRAM device in FIG. 28.

Figure 29:
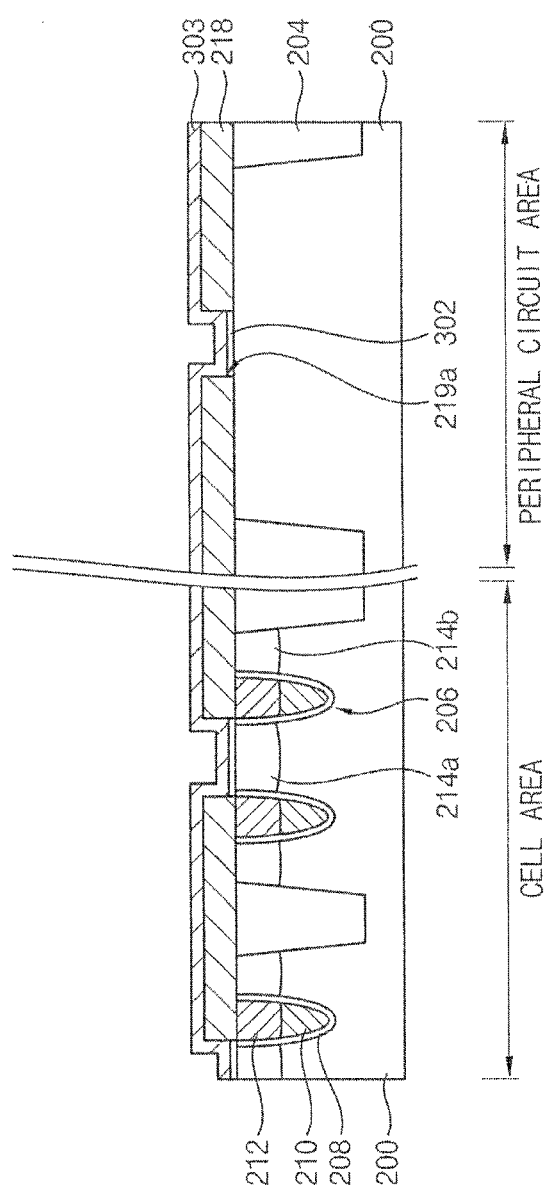
FIGS. 29 to 34 are cross sectional views illustrating a method of manufacturing the DRAM device in FIG. 28.

Referring to FIG. 29, isolation layer patterns 204 are formed on a substrate 200 having a cell area and a peripheral circuit area. The isolation layer patterns 204 may be formed by a shallow trench isolation process.

A selection transistor including a gate buried in the substrate 200 is formed in the cell area through processes substantially the same as or substantially similar to those described with reference to FIGS. 15 and 16.

An etch stop layer 218 is formed on the substrate 200 having the selection transistor. The etch stop layer 218 is partially etched to form first openings 219a through the etch stop layer 218. The first openings 219a may be formed by a photolithography process. In exemplary embodiments, a contact hole exposing a first impurity region 214a may be provided in the cell area of the substrate 200, and an opening may be formed in the peripheral circuit area of the substrate 200. The opening may expose a portion of the substrate 200 where a gate electrode is formed.

Sidewalls of the first openings 219a are thermally oxidized to form gate insulation layers 302 on the sidewalls of the first openings 219a. A preliminary polysilicon layer 303 is formed on the gate insulation layers 302 to protect the gate insulation layers 302. The preliminary polysilicon layer 303 may have a thickness of about 50A to about 200A.

Figure 30:
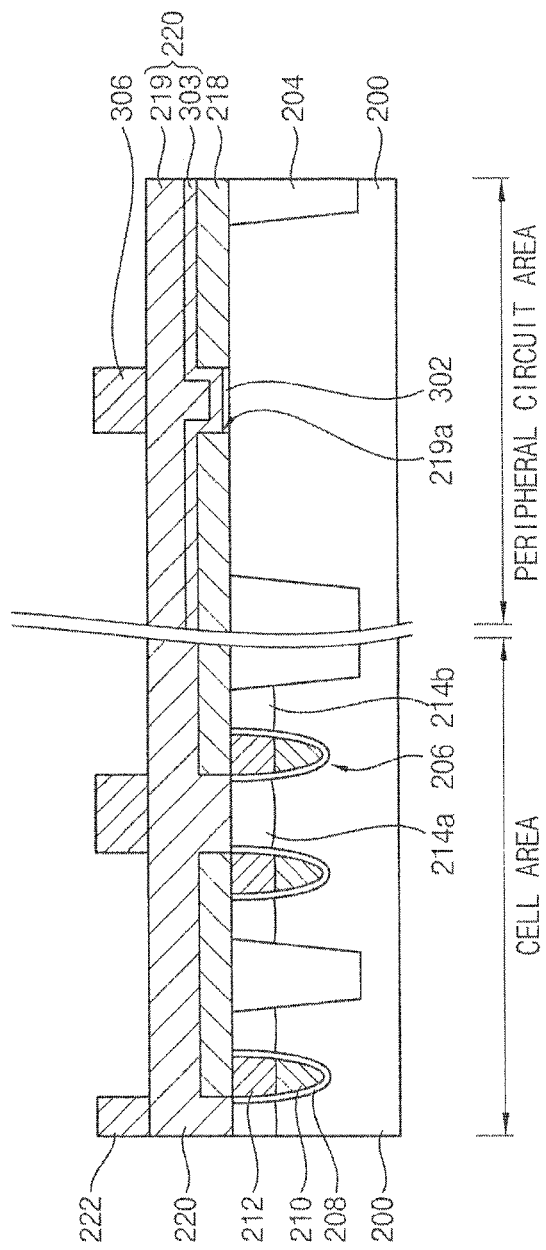

Referring to FIG. 30, a photoresist pattern is formed on the preliminary polysilicon layer 303. The photoresist pattern may selectively expose the cell area of the substrate 200. Portions of the preliminary polysilicon layer 303 and the gate insulation layers 302 in the cell area are removed using the photoresist pattern as an etching mask. Hence, a portion of the substrate 200 in the cell area is exposed through the contact hole.

An upper polysilicon layer 219 is formed on the etch stop layer 218 in the cell and the peripheral circuit areas to fill up the first openings 219a. Hereinafter, the remaining preliminary polysilicon layer 303 and the upper polysilicon layer 220 are referred to as a polysilicon layer 220.

A portion of the polysilicon layer 220 may make contact with the exposed portion of the substrate 200 in the cell area. In the peripheral circuit area, a portion of the polysilicon layer 220 may be positioned on the preliminary polysilicon layer 303 in the opening. Thus, the polysilicon layer 220 does not contact the substrate 200 in the peripheral circuit area, whereas the polysilicon layer 220 makes contact with the gate insulation layer 302 in the peripheral circuit area.

Hard mask patterns 222 and 306 are formed on the polysilicon layer 220 in the cell and the peripheral circuit areas. The hard mask pattern 222 in the cell area may serve as an etching mask for forming a bit line, and the hard mask pattern 306 in the peripheral circuit area may function as an etching mask for forming a gate of a transistor.

Figure 31:
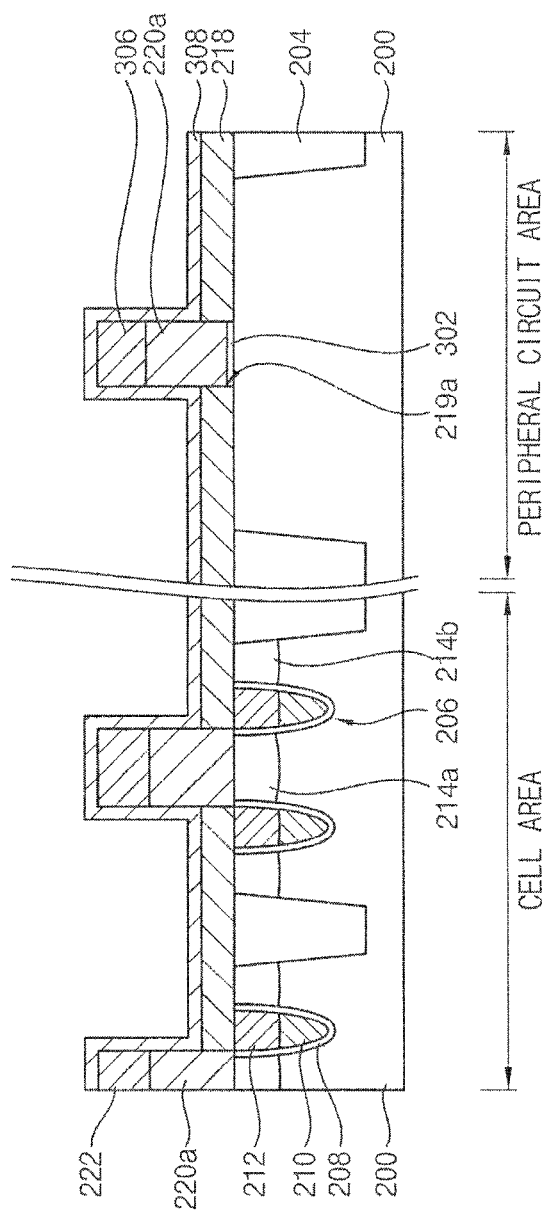

Referring to FIG. 31, the polysilicon layer 220 is etched using the hard mask patterns 222 and 306 as the etching masks, so that preliminary conductive patterns 220a are formed in the first openings 219a. Each of the preliminary conductive patterns 220a may protrude from the etch stop layer 218.

The preliminary conductive pattern 220a in the cell area may have a structure that includes a contact and a line pattern. Further, the preliminary conductive pattern 220a in the peripheral circuit area may have a line shape or an isolated shape.

A metal layer 308 is formed on the etch stop layer 218, the preliminary conductive patterns 220a and the hard mask patterns 222 and 306. The metal layer 308 may be formed using a material that has a resistance substantially smaller than that of metal nitride when a silicidation process is executed on the metal layer 308. For example, the metal layer 308 may include cobalt, titanium, tantalum, nickel, platinum, or the like. The metal layer 308 may directly make contact with side portions of the preliminary conductive patterns 220a.

Figure 32:
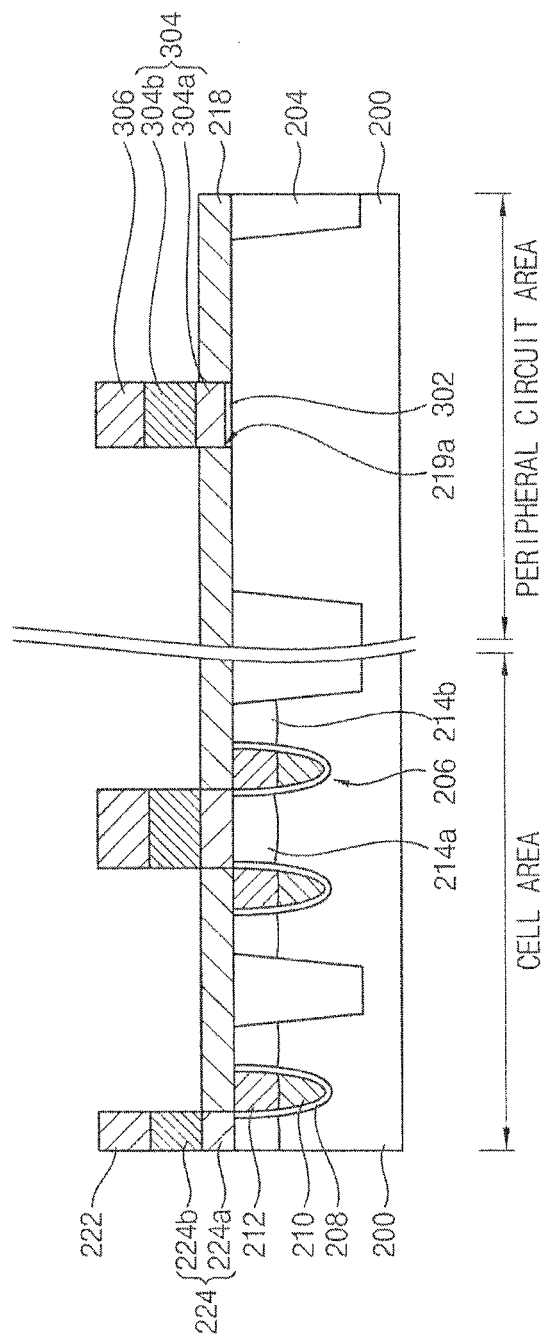

Referring to FIG. 32, the metal layer 308 is thermally treated so that metal silicides are formed at portions of the preliminary conductive patterns 220a. Hence, a bit line structure 224 including the metal silicide is formed in the cell area of the substrate 200. The bit line structure 224 includes a bit line contact 224a and a bit line 224b. Additionally, a second gate electrode 304 including the metal silicide is formed in the peripheral circuit area. The thickness of the metal silicides in the bit line structure 224 and the second gate electrode 304 may be varied by adjusting process conditions of a silicidation process. Further, the bit line structure 224 and the second gate electrode 304 may ensure desired low resistances in accordance with the variations of the thickness of the metal silicide. Then, unreacted portions of the metal layer 308 are removed.

According to exemplary embodiments, the bit line structure 224 including the metal silicide and the second gate electrode 304 including the metal silicide for a peripheral circuit may be obtained by one silicidation process. Therefore, the DRAM device may be manufactured through simplified processes.

Figure 33:
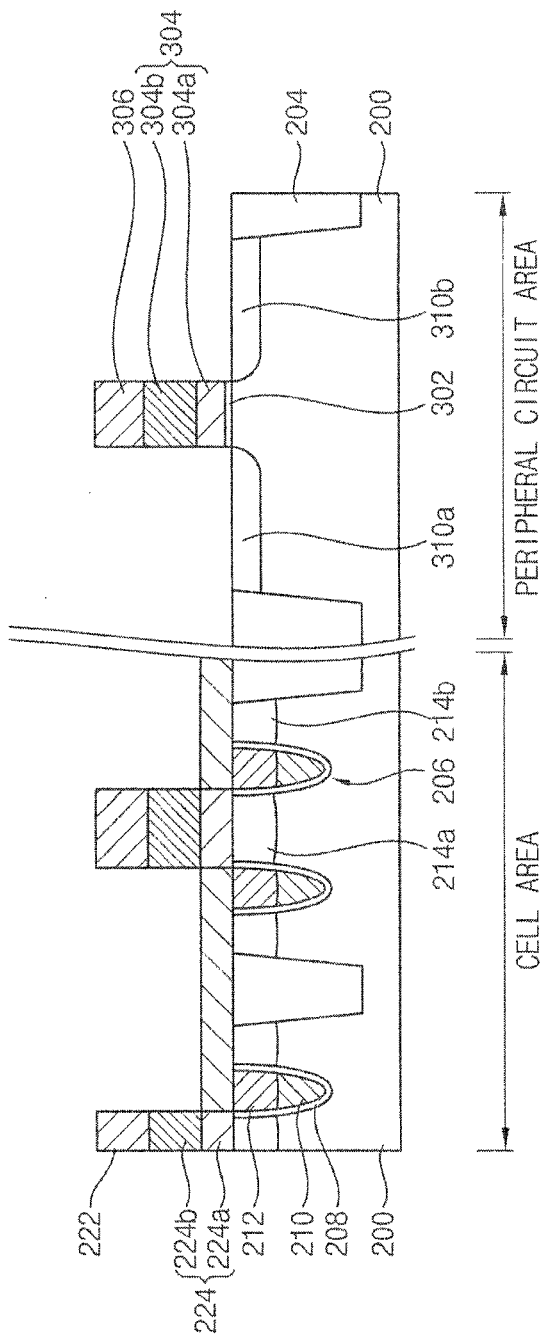

Referring to FIG. 33, the portion of the etch stop layer 218 in the peripheral circuit area is selectively removed, so that the etch stop layer 218 remains in the cell area only.

Impurities are doped into portions of the substrate 200 in the peripheral circuit area adjacent to the second gate electrode 304 to form a third impurity region 310a and a fourth impurity region 310b. The third and the fourth impurity regions 310a and 310b may serve as source/drain regions in a transistor for a peripheral circuit.

In some exemplary embodiments, an additional spacer may be formed on a sidewall of the second gate electrode 304 before forming the third and the fourth impurity regions 310a and 310b or after forming the third and the fourth impurity regions 310a and 310b. Alternatively, the additional spacer may be provided on the sidewall of the second gate electrode 304 while forming the third and the fourth impurity regions 310a and 310b.

Figure 34:
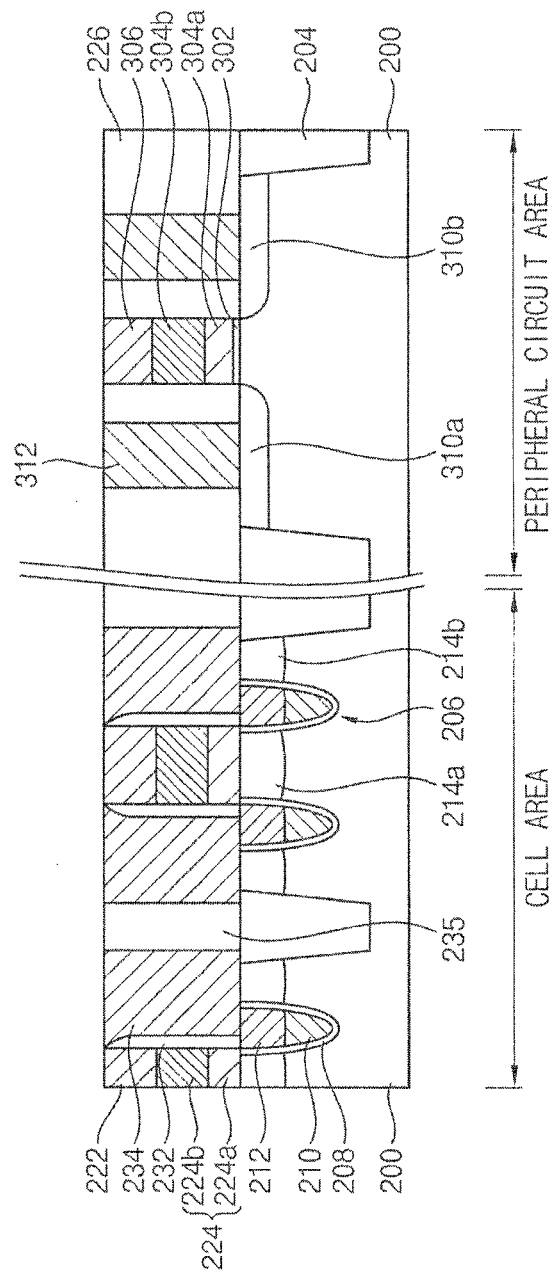

Referring to FIG. 34, an insulating interlayer 226 is formed to fully cover the hard mask patterns 222 and 306. Then, the insulating interlayer 226 is partially removed until the hard mask patterns 222 and 306 are exposed.

A storage node contact 234 is formed through a portion of the insulating interlayer 226 in the cell area. Processes for forming the storage node contact 234 may be substantially the same as or substantially similar to those described with reference to FIGS. 19 to 21.

Contact holes are formed by partially etching the insulating interlayer 226 in the peripheral circuit area, and then the contact holes are filled with a conductive material. Hence, third contact plugs 312 are formed in the peripheral circuit area. The third contact plugs 312 make electrical contact with the third and the fourth impurity regions 310a and 310b.

As illustrated in FIG. 28, an upper insulating interlayer 314 is formed to cover the peripheral circuit area. Additionally, a capacitor 240 contacting the storage node contact 234 is formed in the cell area. The capacitor 240 may have a cylindrical structure or a stacked structure.

Figure 35:
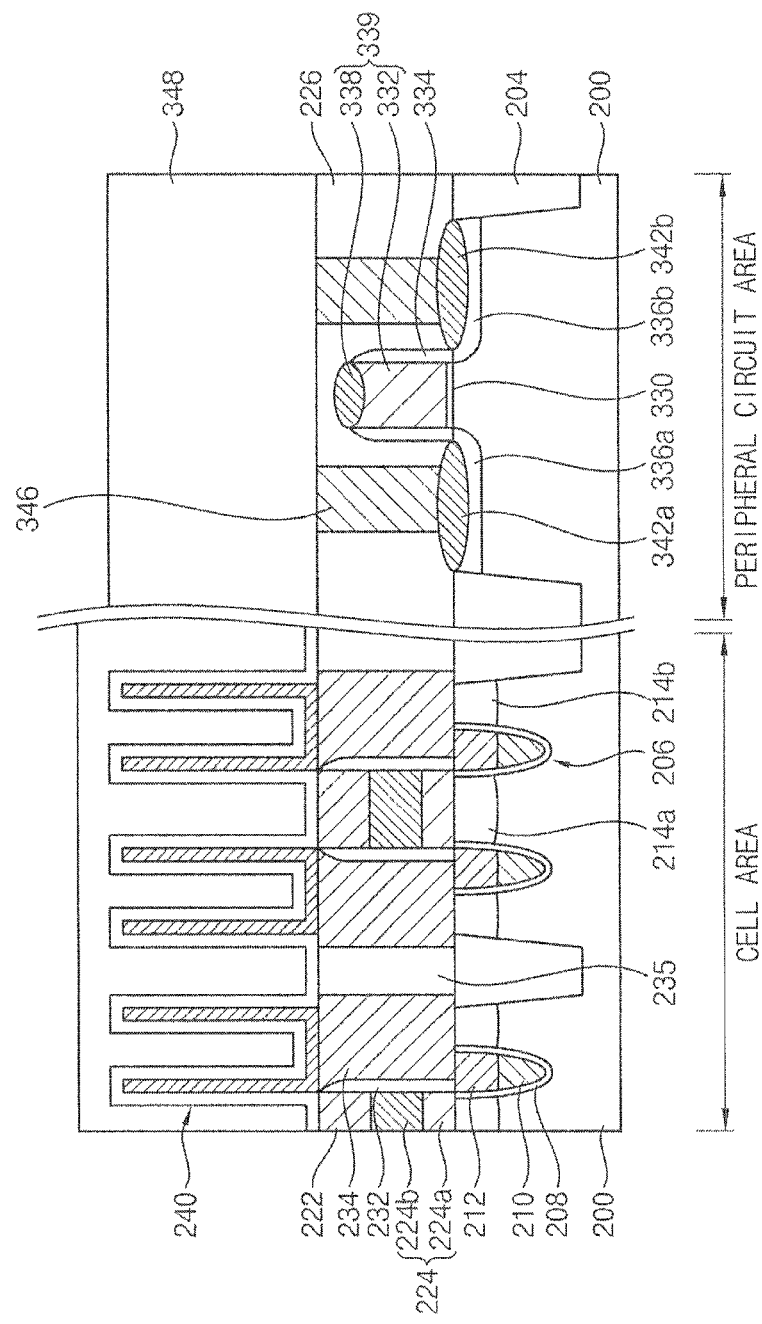
FIG. 35 is a cross sectional view illustrating a DRAM device in accordance with another exemplary embodiment of the present disclosure.

FIG. 35 is a cross sectional view illustrating a DRAM device in accordance with a sixth embodiment. The DRAM device in FIG. 35 includes unit cells having constructions substantially the same as or substantially similar to those of the unit cells of the DRAM device described with reference to FIG. 14. The DRAM device includes a planar transistor in a peripheral circuit area.

Referring to FIG. 35, the DRAM device includes the unit cells in a cell area substantially the same as or substantially similar to those of the unit cells of the DRAM device described with reference to FIG. 14. Thus, detailed descriptions of the unit cells in the cell area may be omitted, and elements formed in the peripheral circuit area will be described.

An isolation layer pattern 204 is formed on the peripheral circuit area of a substrate 200 to define an active region and an isolation region. A second gate structure is provided on the peripheral circuit area of the substrate 200. The second gate structure includes a gate insulation layer 330 and a second gate electrode 339. However, the second gate structure does not include any hard mask pattern. A third impurity region 336a and a fourth impurity region 336b are formed at portions of the substrate 200 adjacent to the second gate structure. The third and the fourth impurity regions 336a and 336b may serve as source/drain regions. A sidewall spacer 334 is provided on a sidewall of the second gate structure.

In exemplary embodiments, the second gate structure in the peripheral circuit area may have a stacked structure including a polysilicon pattern 332 and a metal silicide 338. Additional metal silicides 342a and 342b are formed on the third and the fourth impurity regions 336a and 336b adjacent to the spacer 334. The metal silicides 338, 342a and 342b may include materials substantially the same as or substantially similar to the metal silicide in the bit line structure in the cell area.

An insulating interlayer 226 is formed to fill up a gap between adjacent second gate structures in the peripheral circuit area. The insulating interlayer 226 may include a material substantially the same as that of the insulating interlayer in the cell area.

Third contact plugs 346 are formed through the insulating interlayer 226. The third contact plugs 346 may electrically contact the third and the fourth impurity regions 336a and 336b, respectively. An upper insulating interlayer 348 is disposed on the third contact plugs 346 and the insulating interlayer 226.

Figure 36:
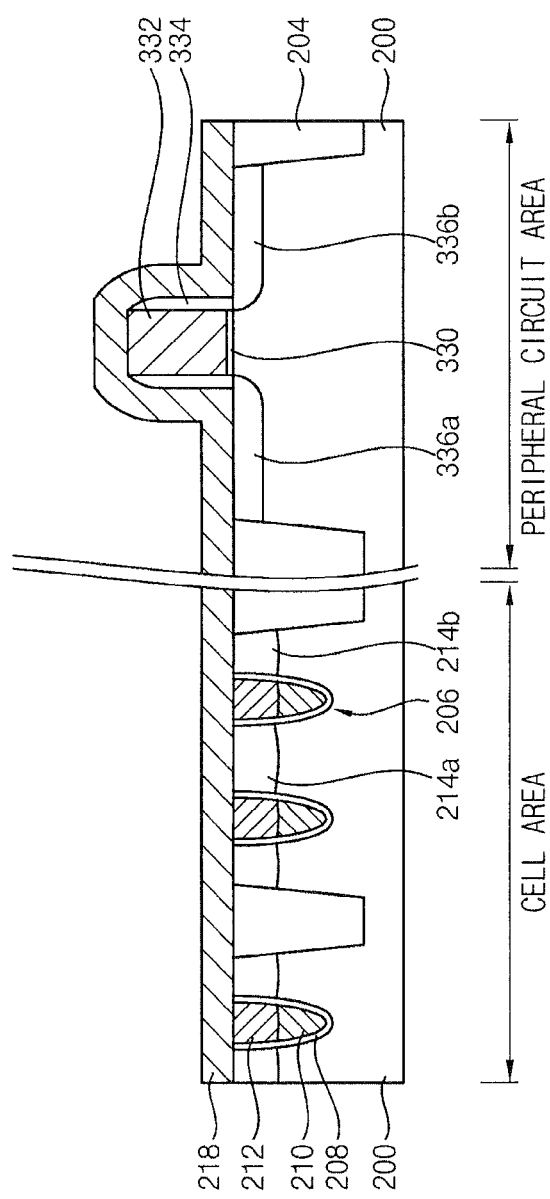
FIGS. 36 to 39 are cross sectional views illustrating a method of manufacturing the DRAM device in FIG. 35.

FIGS. 36 to 39 are cross sectional views illustrating a method of manufacturing the DRAM device in FIG. 35. Referring to FIG. 36, isolation layer patterns 204 are formed on a substrate 200 including a cell area and a peripheral circuit area. The isolation layer patterns 204 may be formed by an isolation process, for example, a shallow trench isolation process.

A selection transistor including a gate buried in the substrate 200 is formed in the cell area through processes substantially the same as or substantially similar to those described with reference to FIGS. 15 and 16. A preliminary gate structure is formed in the peripheral circuit area of the substrate 200. The preliminary gate structure includes a gate insulation layer 330 and a polysilicon layer pattern 332.

A spacer 334 is formed on a sidewall of the preliminary gate structure. Then, impurities are doped into portions of the substrate 200 adjacent to the preliminary gate structure to form a third impurity region 336a and a fourth impurity region 336b at the portions of the substrate 200 in the peripheral circuit area. Thus, a preliminary transistor is provided in the peripheral circuit area. The preliminary transistor includes the preliminary gate structure, the spacer 334, the third impurity region 336a and the fourth impurity region 336b.

An etch stop layer 218 is formed on the substrate 200 having the cell area and the peripheral circuit area. A portion of the etch stop layer 218 in the cell area may cover the selection transistor having the buried gate. Another portion of the etch stop layer 218 in the peripheral circuit area may cover the preliminary transistor.

Figure 37:
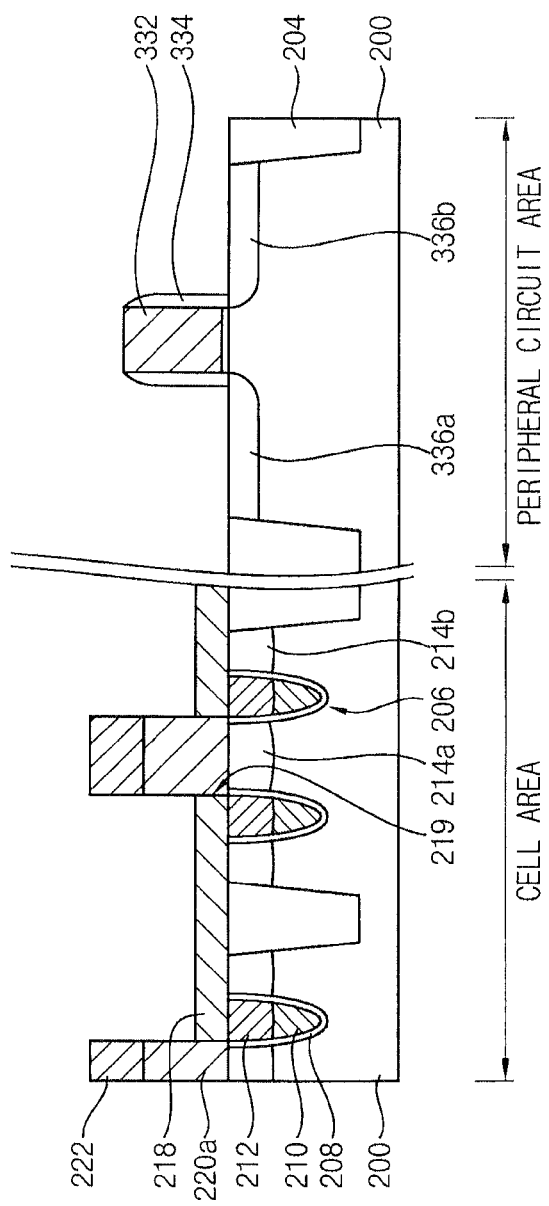

Referring to FIG. 37, the etch stop layer 218 in the cell area is partially etched to form a contact hole 219 through the etch stop layer 218. The contact hole 219 may be formed by a photolithography process. The contact hole 219 exposes a first impurity region 214a in the cell area.

A polysilicon layer is formed on the etch stop layer 218 to fill up the contact hole 219 in the cell area. A hard mask pattern 222 is formed on a portion of the polysilicon layer positioned in the cell area. However, no hard mask pattern is provided on another portion of the polysilicon layer in the peripheral circuit area. The hard mask pattern in the cell area may serve as an etching mask for forming a bit line.

Using the hard mask pattern as an etching mask, the polysilicon layer is etched to form a preliminary conductive pattern 220a in the cell area. The preliminary conductive pattern 220a fills the contact hole 219. The preliminary conductive pattern 220a may protrude from the etch stop layer 218. Here, the polysilicon layer in the peripheral circuit is completely removed from the etch stop layer 218.

A portion of the etch stop layer 218 in the peripheral circuit area is fully removed by a photolithography process. Thus, the preliminary gate structure is exposed in the peripheral circuit area. Further, portions of the substrate 200 near the preliminary gate structure are also exposed after removing the etch stop layer 218 in the peripheral circuit area.

Figure 38:
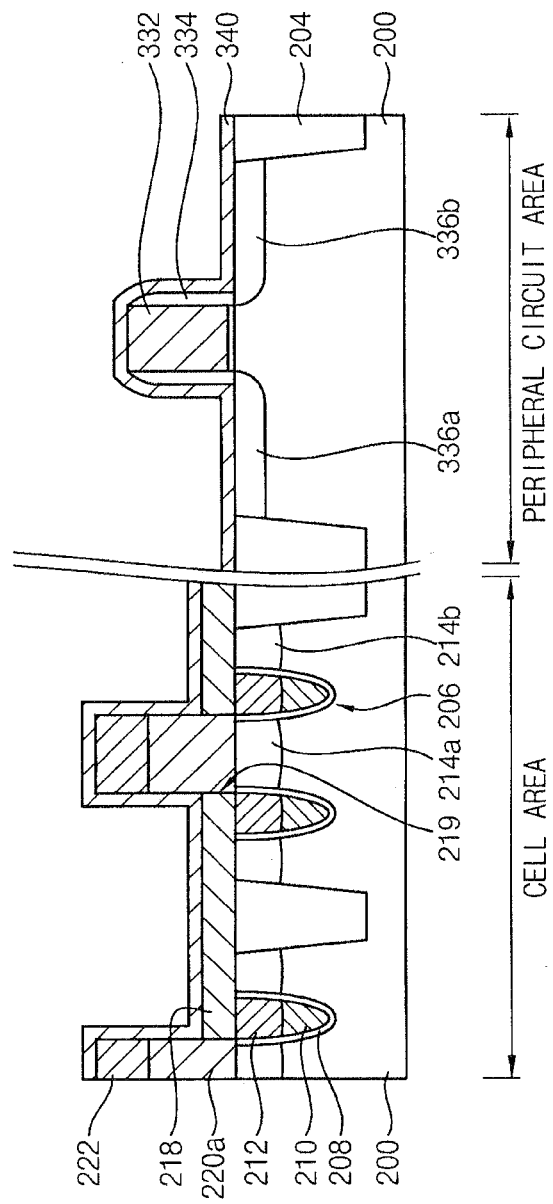

Referring to FIG. 38, a metal layer 340 is formed on the substrate 200 having the cell and the peripheral circuit areas. The metal layer 340 may be conformally formed along profiles of the resultant structures in the cell and the peripheral circuit areas. For example, the metal layer 340 may be uniformly formed along profiles of the etch stop layer 218, the preliminary conductive pattern 220a and the hard mask pattern 222 in the cell area. In the peripheral circuit area, the metal layer 340 may be conformally formed along a profile of the preliminary gate structure. The metal layer 340 may be formed using a material that has a resistance substantially lower than that of metal nitride after a silicidation process is performed about the metal layer 340.

Figure 39:
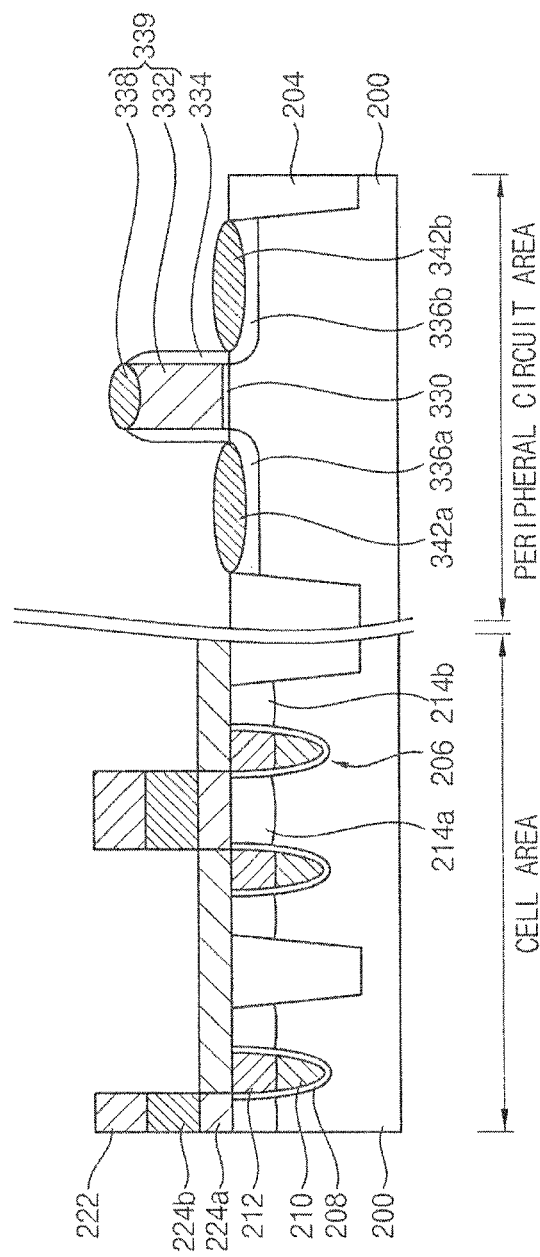

Referring to FIG. 39, the metal layer 340 is thermally treated to form metal silicide at a portion of the preliminary conductive patterns 220a in the cell area. Simultaneously, metal silicides are also formed at portions of the polysilicon pattern 332, the third impurity region 336a and the fourth impurity region 336b in the peripheral circuit area. Therefore, a bit line structure including the metal silicide is formed in the cell area of the substrate 200. The bit line structure includes a bit line contact 224a and a bit line 224b. Additionally, a second gate electrode 339 including the metal silicide is formed in the peripheral circuit area, and metal silicides 342a and 342b are formed the third and the fourth impurity regions 336a and 336b, respectively. The thicknesses of the metal silicides in the bit line structure and the second gate electrode 339 and the metal silicides 342a and 342b on the third and the fourth impurity regions 336a and 336b may vary by adjusting process conditions of the silicidation process. Thus, the bit line structure and the second gate electrode 339 may ensure desired low resistances in accordance with the variations of the thickness of the metal silicide. Further, the third and the fourth impurity regions 336a and 336b serving as source/drain regions in a transistor for a peripheral circuit may have reduced resistances. Then, unreacted portions of the metal layer 340 are removed.

According to exemplary embodiments, there may be obtained the bit line structure including the metal silicide, the third and the fourth impurity regions 336a and 336b including the metal silicides 342a and 342b, and the second gate electrode 339 including the metal silicide for a peripheral circuit by using just one silicidation process.

As illustrated in FIG. 33, an insulating interlayer 226 is formed to fully cover the bit line structure and the second gate electrode 339 in the cell and the peripheral circuit areas. The insulating interlayer 226 is partially removed until the hard mask pattern 222 in the cell area is exposed.

A storage node contact 234 is formed through a portion of the insulating interlayer 226 in the cell area. Processes for forming the storage node contact 234 may be substantially the same as or substantially similar to those described with reference to FIGS. 19 to 21.

Contact holes are formed by partially etching the insulating interlayer 226 in the peripheral circuit area, and then the contact holes are filled with a conductive material. Thus, third contact plugs 346 are formed in the peripheral circuit area. The third contact plugs 346 make electrical contact with the metal silicides 342a and 342b positioned on the third and the fourth impurity regions 336a and 336b. After an upper insulating interlayer 348 is formed to cover the peripheral circuit area, a capacitor 240 contacting the storage node contact 234 is formed in the cell area.

Figure 40:
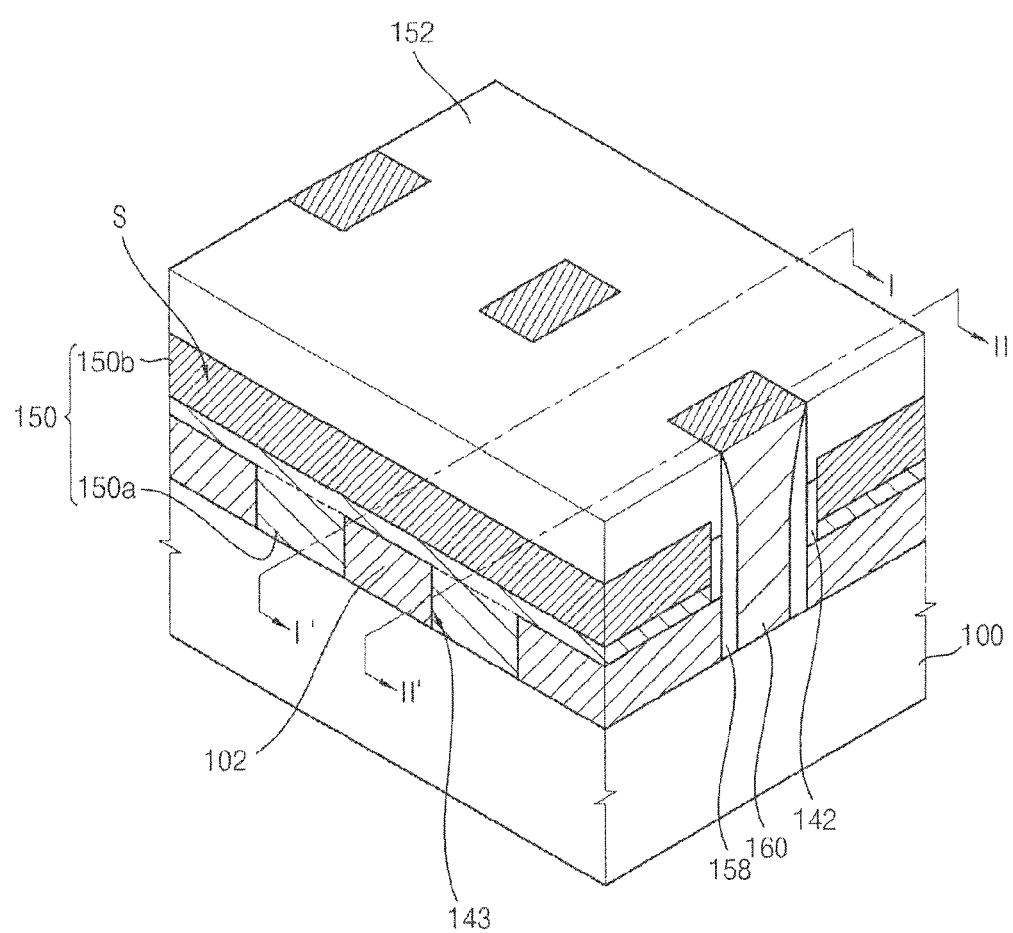
FIG. 40 is a perspective view illustrating a wiring structure in accordance with another exemplary embodiment of the present disclosure.
Figure 41:
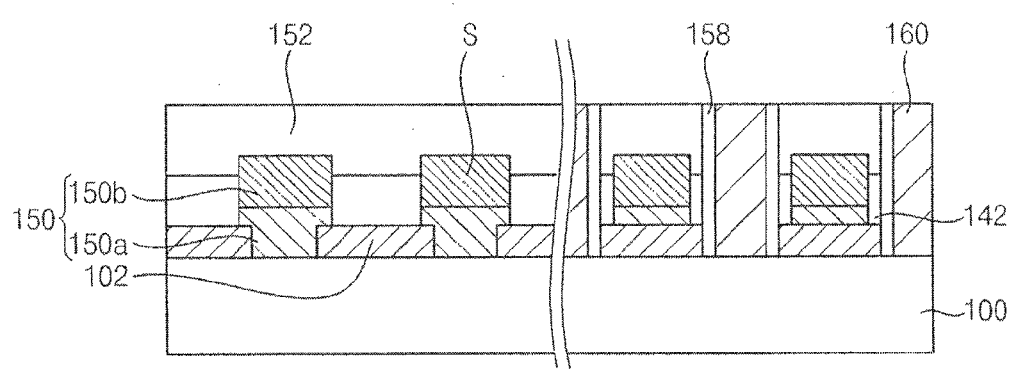
FIG. 41 is a cross sectional view illustrating the wiring structure in FIG. 40.

FIG. 40 is a perspective view illustrating a wiring structure in accordance with a seventh embodiment. In FIG. 41, a left part illustrates the wiring structure taken along a lint of I-I' in FIG. 40, and a right part illustrates the wiring structure taken along a lint of II-II' in FIG. 40. The wiring structure illustrated in FIGS. 40 and 41 may not include a hard mask pattern on a first wiring, which is different from that of the wiring described with reference to FIGS. 1 and 2a.

Referring to FIGS. 40 and 41, an etch stop layer 102 and a lower insulating interlayer 142 are disposed on a substrate 100. A first contact hole 143 is formed through the etch stop layer 102, and a trench 146 communicated with the first contact hole 143 is formed on the lower insulating interlayer 142. The trench 146 may have a line shape extending on the lower insulating interlayer 142.

A first contact plug 150a is formed in the first contact hole 143. A conductive line 150b is disposed in the trench 146 on the lower insulating interlayer 142. The first contact plug 150a and the conductive line 150b may be integrally formed. The conductive line 150b may have an upper face higher than an upper face of the lower insulating interlayer 142. Alternatively, the upper faces of the conductive line 150b and the lower insulating interlayer 142 may be located on substantially the same plane. A first wiring 150 includes the first contact plug 150a and the conductive line 150b. The first wiring 150 may have at least a portion including metal silicide S. However, no mask pattern is provided on the conductive line 150b.

In exemplary embodiments, the metal silicide S may include cobalt silicide, titanium silicide, tantalum silicide, nickel silicide, platinum silicide, or the like. These may be used alone or in a mixture thereof.

An insulating interlayer 152 is formed to cover the first wirings 150 including the conductive lines 159b and the lower insulating interlayer 142. The insulating interlayer 152 may have an upper face higher than the upper face of the conductive line 150b, so that the insulating interlayer 152 may cover the conductive line 150b.

A second contact plug 160 is formed through the insulating interlayer 152, the lower insulating interlayer 142 and the etch stop layer 102. A sidewall spacer 158 may be provided on a sidewall of the second contact plug 160. The sidewall spacer 158 may include oxide such as silicon oxide, or nitride like silicon nitride.

FIGS. 42 to 46 are cross sectional views illustrating a method of forming the wiring structure in FIG. 41. In FIGS. 42 to 46, left parts illustrate the wiring structure taken along a line of I-I' in FIG. 40, and right parts illustrate the wiring structure taken along a line of II-II' in FIG. 40.

Figure 42:
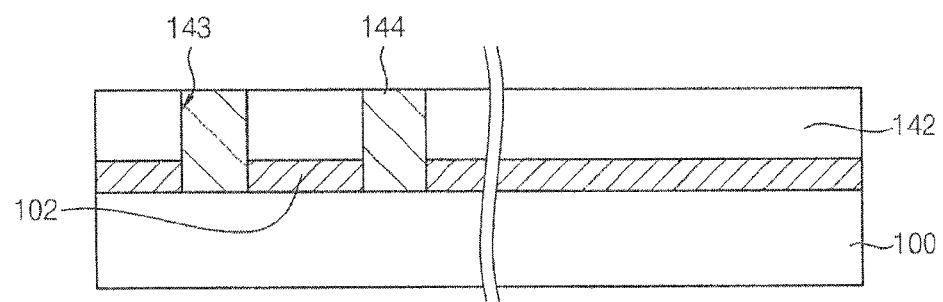
FIGS. 42 to 46 are cross sectional views illustrating a method of forming the wiring structure in FIG. 41.

Referring to FIG. 42, an etch stop layer 102 and a lower insulating interlayer 142 are disposed on a substrate 100. The lower insulating interlayer 142 and the etch stop layer 102 are partially etched to form a first contact hole 143 exposing a portion of the substrate 100. The first contact hole 143 may be formed by a photolithography process.

A sacrificial layer is formed in the first contact hole 143. The sacrificial layer may be formed using polymer that contains carbon. The sacrificial layer may be easily removed by an ashing process and/or a stripping process.

The sacrificial layer is partially removed until the lower insulating interlayer 142 is exposed, so that a sacrificial layer pattern 144 is formed in the first contact hole 143. The sacrificial layer pattern 144 may be obtained by a CMP process.

Figure 43:
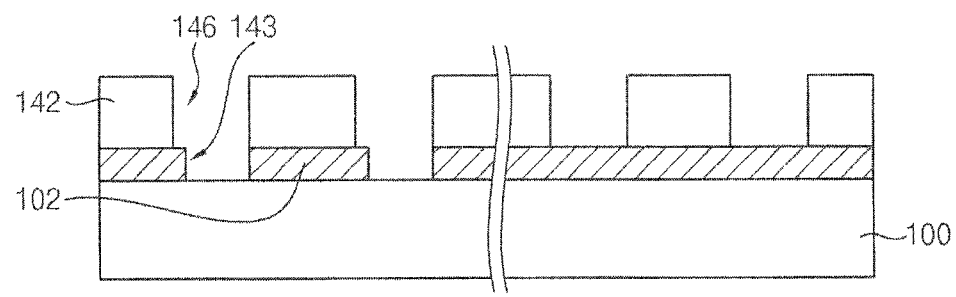

Referring to FIG. 43, a photoresist pattern is formed on the lower insulating interlayer 142 and the sacrificial layer pattern 144. The photoresist pattern may have a line shape. The sacrificial layer pattern 144 under the photoresist pattern may be exposed.

Using the photoresist pattern as an etching mask, the lower insulating interlayer 142 is partially etched to form a trench 146 on the lower insulating interlayer 142. Then, the photoresist pattern is removed from the lower insulating interlayer 142. Here, the sacrificial layer pattern 144 may be simultaneously removed. Therefore, a first contact hole 143 is formed through the etch stop layer 102, and also the trench 146 is provided on the lower insulating interlayer 142. The trench 146 may be communicated with the first contact hole 143.

Figure 44:
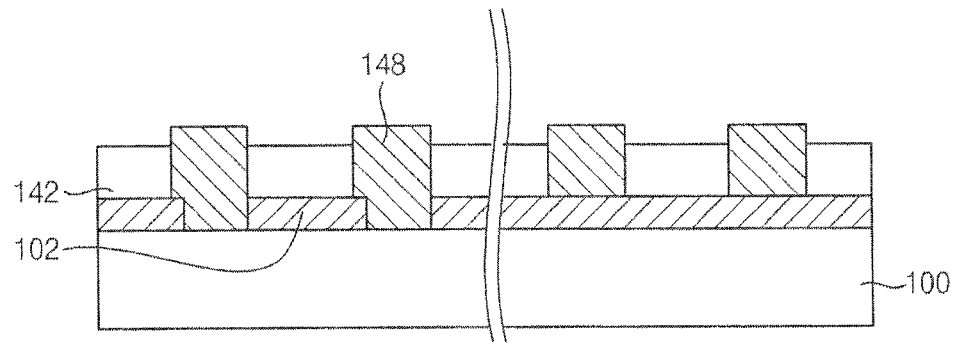

Referring to FIG. 44, a polysilicon layer is formed on the lower insulating interlayer 142 to fill up the first contact hole 143 and the trench 146. The polysilicon layer is partially removed until the lower insulating interlayer 142 is exposed. The polysilicon layer may be removed by a CMP process and/or an etch-back process. Thus, a preliminary conductive pattern 148 is formed in the first contact hole 143 and the trench 146. The preliminary conductive line includes a preliminary contact plug and a preliminary line pattern. The preliminary contact plug may fill up the first contact hole 143, and the preliminary line pattern may locate on the preliminary contact plug. The preliminary conductive line may be integrally formed with the preliminary contact plug.

The lower insulating interlayer 142 is partially removed to a predetermined depth, such that the preliminary conductive pattern 148 protrudes from the lower insulating interlayer 142. The lower insulating interlayer 142 may be partially removed by an etch-back process or a wet etching process. Alternatively, the lower insulating interlayer 142 may be fully removed so the etch stop layer 102 may be exposed, or the lower insulating interlayer 142 may not be additionally etched.

Figure 45:
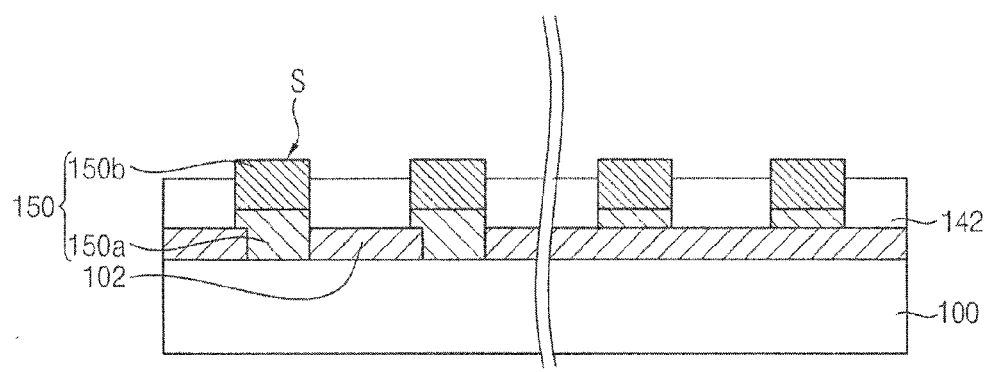

Referring to FIG. 45, a metal layer is formed on the preliminary conductive pattern 148 and the lower insulating interlayer 142. A silicidation process is performed about the metal layer, so that metal silicide S is formed in accordance with the reaction between metal in the metal layer and polysilicon in the preliminary conductive pattern 148. That is, the metal silicide S may be formed between the metal layer and the preliminary conductive pattern 148 by thermally treating the metal layer and the preliminary conductive pattern 148. Therefore, a first wiring 150 including the metal silicide S is formed on the substrate 100. The first wiring 150 includes a first contact plug 150a and a conductive line 150b. The first contact plug 150a may fill up the first contact hole 143, and the conductive line 150b may be integrally formed with the first contact plug 150a.

In exemplary embodiments, the metal silicide S may be obtained by reacting the metal layer with an upper portion and a side portion of the preliminary conductive pattern 148. The metal silicide S may have a thickness varied by controlling process conditions of the silicidation process. The processes for forming the metal silicide S may be substantially the same as or substantially similar to those described with reference to FIG. 7.

Figure 46:
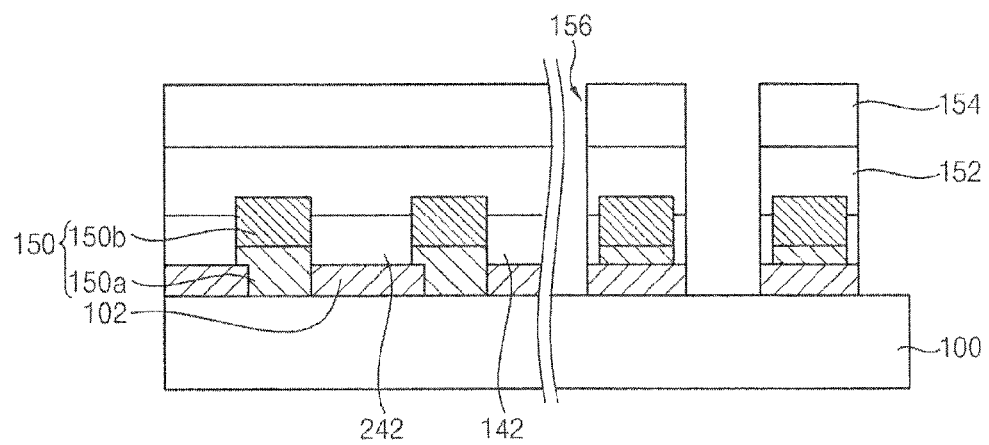

Referring to FIG. 46, an insulating interlayer 152 is formed to cover the first wiring 150 and the lower insulating interlayer 142. The insulating interlayer 152 may fill up a gap between adjacent first wirings 150. The insulating interlayer 152 may have an upper face higher than the upper face of the first wiring 150. In some exemplary embodiments, the insulating interlayer 152 may be planarized by a planarization process, so that the insulating interlayer 152 may have a level upper face.

A photoresist pattern 154 is formed on the insulating interlayer 152. The photoresist pattern 154 may expose a portion of the insulating interlayer 152 where a second contact plug is formed. The photoresist pattern 154 need not have a line shape.

The portion of the insulating interlayer 152 exposed by the photoresist pattern 154 is etched using the photoresist pattern 154 as an etching mask. Then, the lower insulating interlayer 142 and the etch stop layer 142 are partially etched to form a second contact hole 156 through the insulating interlayer 152, the lower insulating interlayer 142 and the etch stop layer 102. The photoresist pattern 154 may be removed from the insulating interlayer 152 by an ashing process and/or a stripping process.

As illustrated in FIG. 41, a sidewall spacer 158 is formed on a sidewall of the second contact hole 156 by depositing an insulation material on the sidewall of the second contact hole 156.

After the second contact hole 156 is filled with a conductive material, the conductive material is removed until the insulating interlayer 152 is exposed. Hence, a second contact plug 160 is formed in the second contact hole 156.

According to exemplary embodiments, a wiring structure in a semiconductor device may be formed while ensuring a low resistance of the wiring structure by simplified processes. The wiring structure may include a first wiring that has a first contact plug and a conductive line integrally formed with the first contact plug by one deposition process, so that a contact resistance between the first contact plug and the conductive line may be considerably reduced. Further, the wiring structure may include metal silicide of low resistance, such that the wiring structure may ensure a desired low resistance even though the wiring structure has a reduced height.

Figure 47:
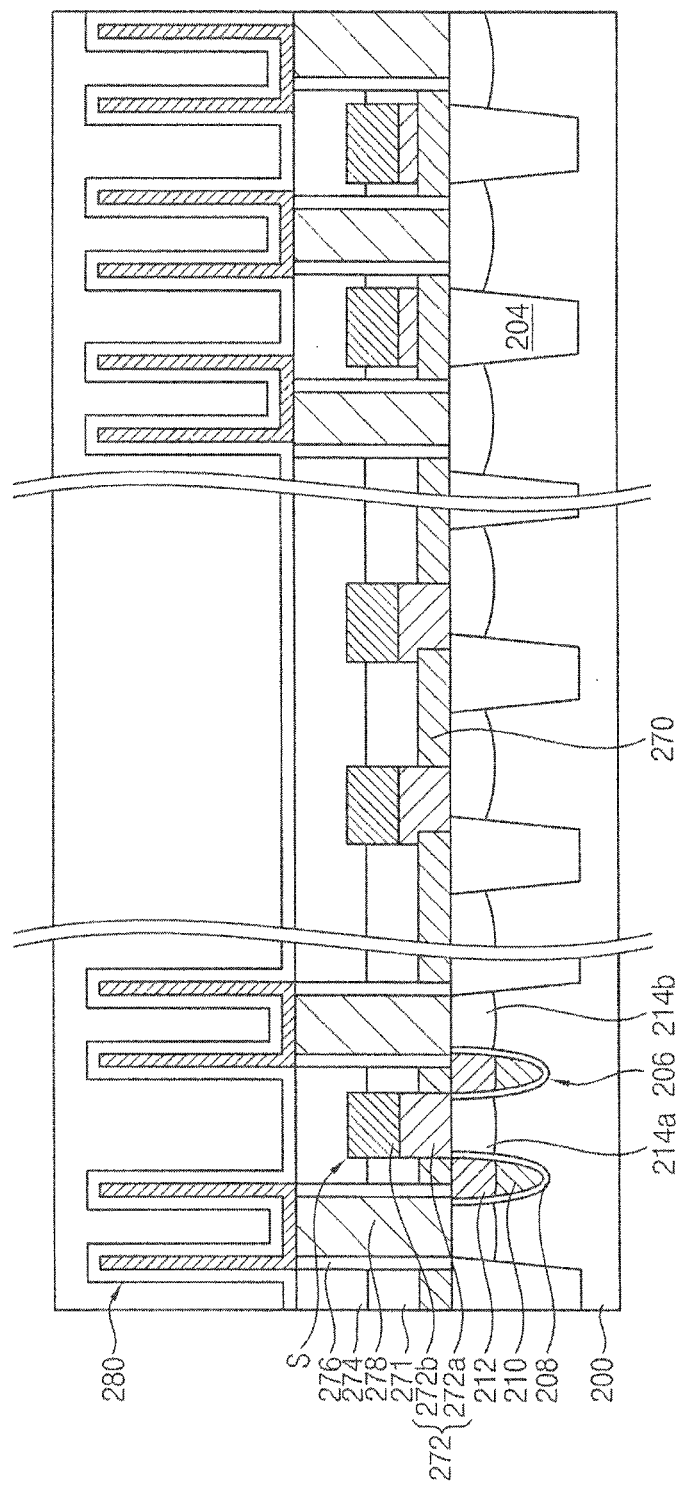
FIG. 47 is a cross sectional view illustrating a DRAM device including the wiring structure in FIGS. 40 and 41.

FIG. 47 is a cross sectional view illustrating a DRAM device including the wiring structure in FIGS. 40 and 41. Referring to FIG. 47, an active region and an isolation region are defined on a substrate 200. A buried type transistor is formed on the substrate 200. Processes for forming the buried type transistor may be substantially the same as or substantially similar to those described with reference to FIGS. 15 and 16.

An etch stop layer 218 is disposed on the substrate 200, isolation layer patterns 204 and the buried type transistor. A lower insulating interlayer 270 is provided on the etch stop layer 270. A first contact hole is formed through the etch stop layer 270 to expose a first impurity region 214a in the active region.

A bit line contact 272a is formed in the first contact hole, and a bit line 272b is disposed on the bit line contact 272a. The bit line 272b may be integrally formed with the bit line contact 272a. The bit line 272b may include at least one portion containing metal silicide S. For example, the metal silicide S may include cobalt silicide, titanium silicide, tantalum silicide, nickel silicide, platinum silicide, or the like. These may be used alone or in a mixture thereof. However, any hard mask pattern is not provided on the bit line 272b.

In exemplary embodiments, a bit line structure 272 including the bit line contact 272a and the bit line 272b may have a construction substantially the same as or substantially similar to that of the wiring structure described with reference to FIG. 41.

An insulating interlayer 274 is formed to fill up gaps between bit line structures 272. The insulating interlayer 274 may cover the bit line structures 272. A storage node contact 278 is formed through the insulating interlayer 274, the lower insulating interlayer 271 and the etch stop layer 270. The storage node contact 278 may electrically make contact with a portion of the substrate 200. A sidewall spacer 276 including an insulation material is disposed at a sidewall of the storage node contact 278.

A capacitor 280 is located on the storage node contact 278. The capacitor 280 may have a cylindrical structure for improving a storage capacity thereof. Alternatively, the capacitor 280 may have other structures, for example, stacked structures.

In a method of manufacturing the DRAM device in FIG. 47, the buried type transistor may be formed on the substrate 200 through processes substantially the same as or substantially similar to those described with reference to FIGS. 15 and 16. The bit line structure 272 and the storage node contact 278 may be formed through processes substantially the same as or substantially similar to those described with reference to FIGS. 42 and 46.

For example, the bit line structure 272 may be obtained by processes substantially the same as or substantially similar to those for forming the wiring structure. The bit line structure 272 may be electrically connected to the first impurity region 214a of the buried type transistor. Further, the storage node contact 278 may be obtained through substantially the same as or substantially similar processes to those for forming the second contact plug.

The storage node contact 278 may be electrically connected with the second impurity region 214b of the buried type transistor. After the capacitor 280 is formed on the storage node contact 278, the DRAM device illustrated in FIG. 47 is provided on the substrate 200.

Figure 48:
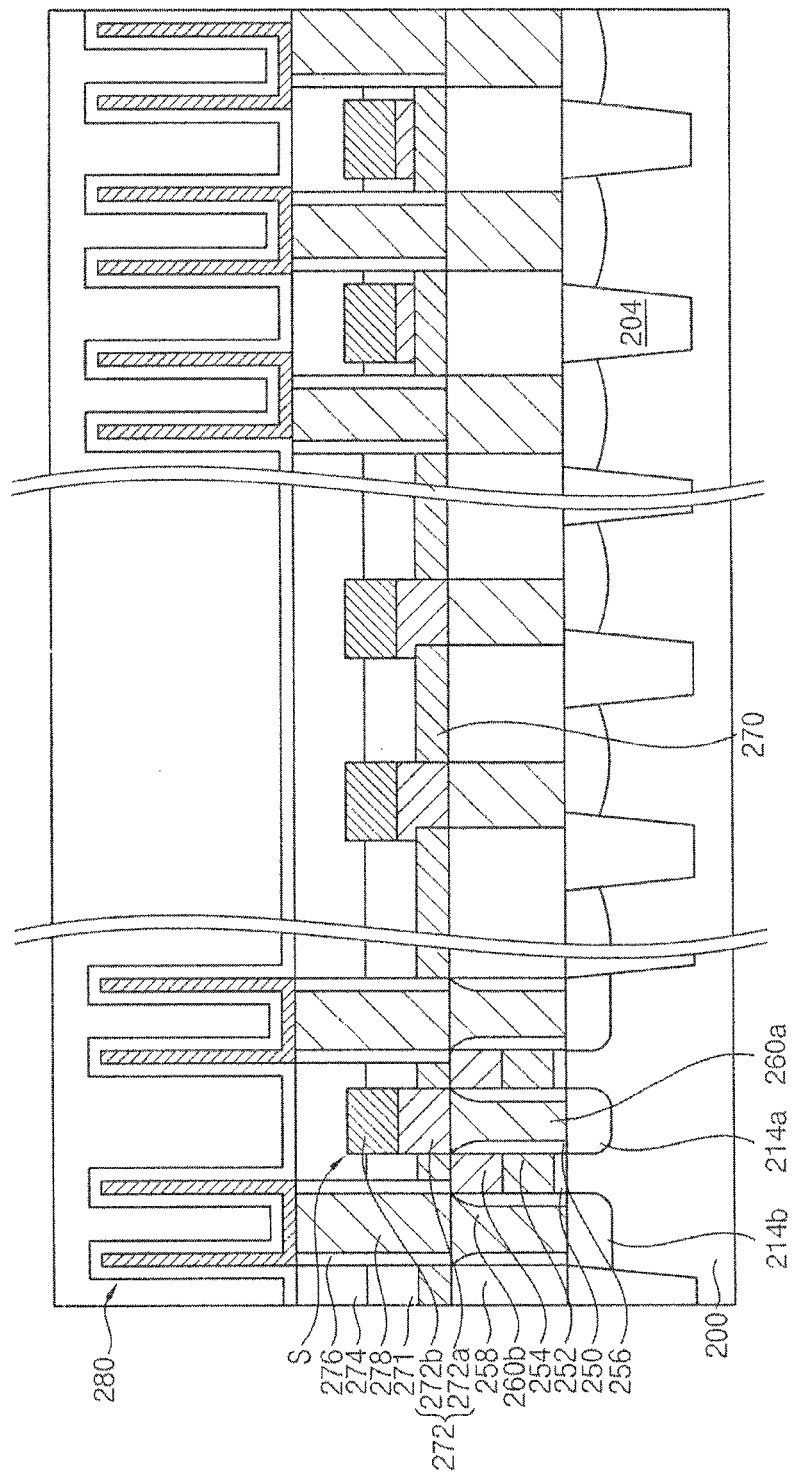
FIG. 48 is a cross sectional view illustrating a DRAM device in accordance with another exemplary embodiment of the present disclosure.

FIG. 48 is a cross sectional view illustrating a DRAM device in accordance with an eighth embodiment. The DRAM device illustrated in FIG. 48 includes a wiring structure having a construction substantially the same as or substantially similar to that of the wiring structure described with reference to FIG. 41.

Referring to FIG. 48, after an active region and an isolation region are defined on a substrate 200, a planar transistor is formed on the substrate 200. The planar transistor may have a construction substantially the same as or substantially similar to that of the planar transistor described with reference to FIG. 24.

A first lower insulating interlayer 258 is disposed on the substrate 200 to cover isolation layer patterns 204 and the planar transistor. A first contact pad 260a and a second contact pad 260b are formed through the first lower insulating interlayer 258. The first contact pad 260a and the second contact pad 260b may make contact with a first impurity region 214a and a second impurity region 214b, respectively.

An etch stop layer 270 and a second lower insulating interlayer 271 are formed on the first lower insulating interlayer 258, the first contact pad 260a and the second contact pad 260b. A first contact hole is formed through the etch stop layer 270, and a trench is formed on the second lower insulating interlayer 271. The first contact hole may expose the first contact pad 260a. The trench may have a line shape and may communicate with the first contact hole.

A bit line contact 272a is disposed in the first contact hole, and a bit line 272b filling the trench is located on the bit line contact 272a. The bit line contact 272a may be integrally formed with the bit line 272b. The bit line contact 272a makes contact with the first contact pad 260a. The bit line 272b may protrude from the second lower insulating interlayer 271. Alternatively, the bit line 272b may have an upper face positioned substantially the same as or substantially similar to a position of an upper face of the trench.

The bit line 272b may have at least one portion including metal silicide. Examples of the metal silicide may include cobalt silicide, titanium silicide, tantalum silicide, nickel silicide, platinum silicide, or the like. These may be used alone or in a mixture thereof. There is no hard mask pattern on the bit line 272b.

In exemplary embodiments, a bit line structure 272 including the bit line contact 272a and the bit line 272b may have a construction substantially the same as or substantially similar to that of the wiring structure described with reference to FIG. 41.

An insulating interlayer 274 is formed to cover the bit line 272 while filling a gap between the bit lines 272. A storage node contact 278 is formed through the insulating interlayer 274, the second lower insulating interlayer 271 and an etch stop layer 270. The storage node contact 278 may electrically make contact with the second contact pad 260b.

A capacitor 280 is located on the storage node contact 278. The capacitor 280 may have a cylindrical structure for improving a storage capacity thereof. Alternatively, the capacitor 280 may have another structure such as a stacked structure.

In a method of manufacturing the DRAM device illustrated in FIG. 48, the planar transistor, the first contact pad 260a and the second contact pad 260b may be formed on the substrate 200 through processes substantially the same as or substantially similar to those described with reference to FIG. 25.

The bit line structure 272 and the storage node contact 278 may be formed through processes substantially the same as or substantially similar to those described with reference to FIGS. 42 and 46. For example, the bit line structure 272 may be obtained by processes substantially the same as or substantially similar to those for forming the first wiring. The bit line structure 272 may be electrically connected to the first contact pad 260a. Further, the storage node contact 278 may be obtained through substantially the same as or substantially similar processes to those for forming the second contact plug 260b. The storage node contact 278 may be electrically connected with the second contact plug 260b.

After the capacitor 280 is formed on the storage node contact 278, the DRAM device illustrated in FIG. 47 is provided on the substrate 200. According to the exemplary embodiments, the wiring structure may be illustratively employed in a DRAM device. However, the wiring structure of the inventive concept may also be used as various wirings having a contact plug and a conductive pattern in various semiconductor devices.

Figure 49:
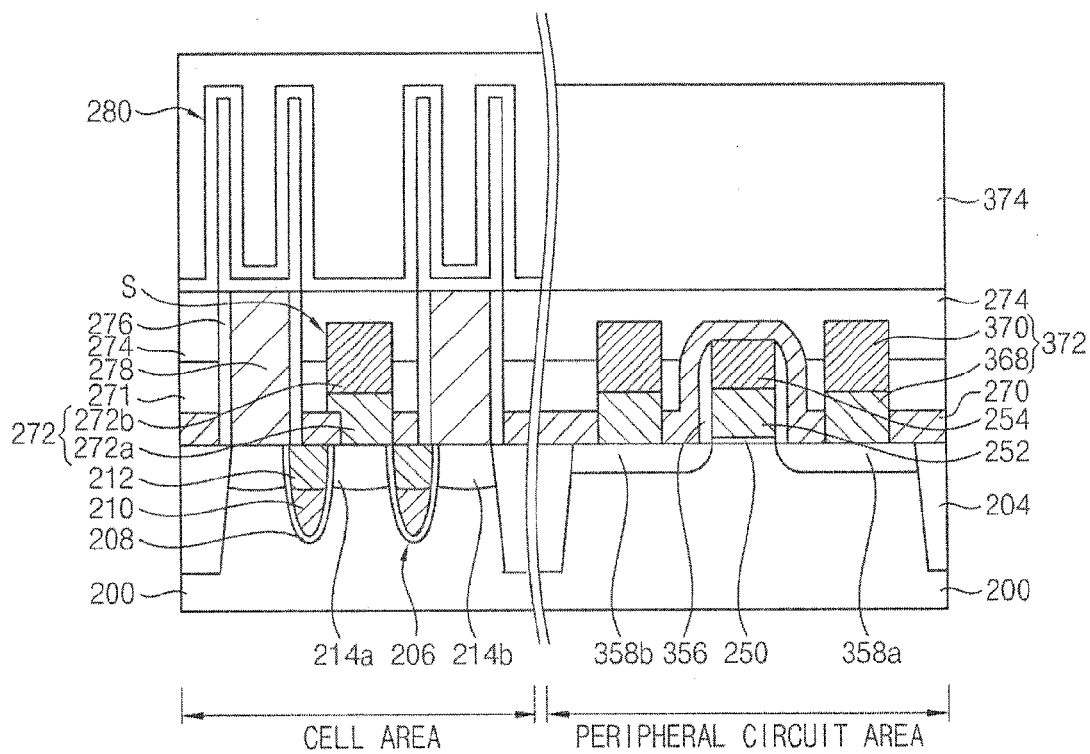
FIG. 49 is a cross sectional view illustrating a DRAM device in accordance with another exemplary embodiment of the present disclosure.

FIG. 49 is a cross sectional view illustrating a DRAM device in accordance with a ninth embodiment. The DRAM device in FIG. 49 may include a unit cell in a cell area substantially the same or substantially similar to that of the DRAM device described with reference to FIG. 47. The DRAM device illustrated in FIG. 49 further includes a planar transistor in a peripheral circuit area.

Referring to FIG. 49, the DRAM device includes the unit cells in the cell area substantially the same as or substantially similar to those of the unit cells of the DRAM device described with reference to FIG. 47. Thus, detailed descriptions of the unit cells in the cell area may be omitted, and elements formed in the peripheral circuit area will be described.

An isolation layer pattern 204 is formed on the peripheral circuit area of a substrate 200 to define an active region and an isolation region. A second gate structure is provided on the peripheral circuit area of the substrate 200. The second gate structure includes a gate insulation layer 250, a second gate electrode 252 and a hard mask pattern 254. A sidewall spacer 356 is provided on a sidewall of the second gate structure. Further, a third impurity region 358a and a fourth impurity region 358b are formed at portions of the substrate 200 adjacent to the second gate structure. The third and the fourth impurity regions 358a and 358b may serve as source/drain regions.

An etch stop layer 270 is formed on the substrate 200 in the peripheral circuit area along profiles of the second gate structure and the spacer 356. The etch stop layer 270 in the peripheral circuit area may include a material substantially the same as that of the etch stop layer 270 in the cell area.

A lower insulating interlayer 271 is formed on the etch stop layer 270 in the peripheral circuit area, which is substantially similar to that in the cell area. Contact pads 372 are formed through the lower insulating interlayer 271 and the etch stop layer 270 in the peripheral circuit area. The contact pads 372 may electrically contact the third and the fourth impurity regions 358a and 358b, respectively. Each of the contact pads 372 may protrude from the lower insulating interlayer 271. Alternatively, upper faces of the contact pads 372 and the lower insulating interlayer 271 may be positioned on the same plane.

In exemplary embodiments, each of the contact pads 372 in the peripheral circuit area may have constructions substantially the same as or substantially similar to those of a bit line contact 272a and a bit line 272b in the cell area. That is, each of the contact pads 372 may have at least one portion including metal silicide 370. For example, the contact pads 372 may include polysilicon patterns 368 and metal silicides 370 stacked on the substrate 200. Since the contact pads 372 include the metal silicides 370, each contact pad 372 may have a desired low resistance.

An insulating interlayer 274 is also provided on the substrate 200 in the peripheral circuit area to cover contact pads 372, which is substantially similar to that in the cell area. An upper insulating interlayer 374 is provided on the insulating interlayer 274 in the peripheral circuit area.

Figure 50:
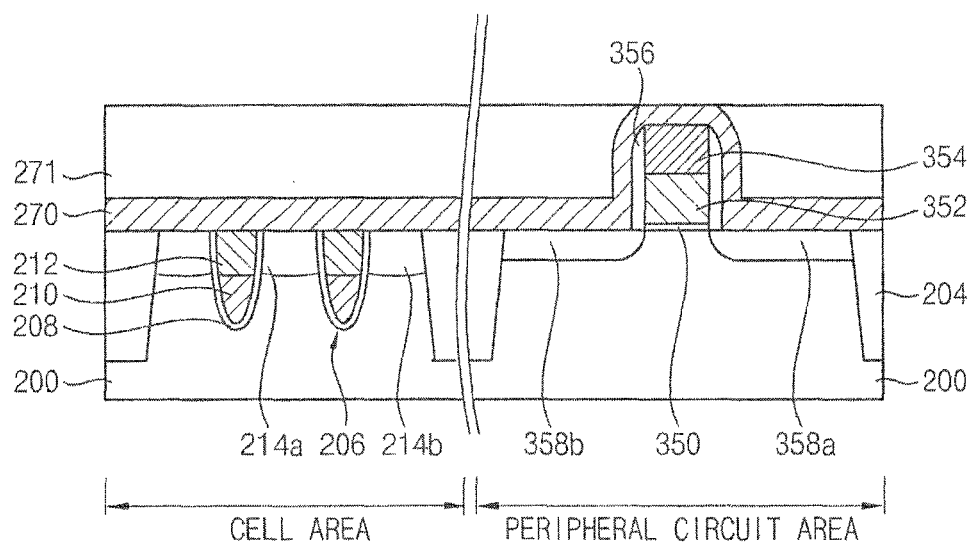
FIGS. 50 to 53 are cross sectional views illustrating a method of manufacturing the DRAM device in FIG. 49.

FIGS. 50 to 53 are cross sectional views illustrating a method of manufacturing the DRAM device in FIG. 49. Referring to FIG. 50, an isolation layer pattern 204 is formed on a substrate having a cell area and a peripheral circuit area. The isolation layer pattern 204 may be formed by an isolation process, for example, a shallow trench isolation process.

A selection transistor having a gate buried in cell area of the substrate 200 may be formed through processes substantially the same as or substantially similar to those described with reference to FIGS. 15 and 16.

After forming the selection transistor on the substrate 200, a gate structure is formed in the peripheral circuit area of the substrate 200. The gate structure includes a gate insulation layer 350, a polysilicon layer pattern 352 and a hard mask pattern 354 sequentially stacked on the substrate 200.

After forming a spacer 356 on a sidewall of the gate structure, a third impurity region 358a and a fourth impurity region 358b are formed at portions of the substrate 200 adjacent to the gate structures. The third and the fourth impurity regions 358a and 358b may be formed by doping impurities into the portions of the substrate 200. Hence, a peripheral circuit transistor is formed in the peripheral circuit area of the substrate 200. The peripheral circuit transistor includes the gate structure, the spacer 356, the third impurity region 358a and the fourth impurity 358b.

An etch stop layer 270 is formed on the substrate 200 having the cell and the peripheral circuit areas. A portion of the etch stop layer 270 may cover the selection transistor in the cell area, and another portion of the etch stop layer 270 may cover the peripheral circuit transistor in the peripheral circuit area.

A lower insulating interlayer 271 is formed on the etch stop layer 270. The lower insulating interlayer 271 is partially removed until a portion of the etch stop layer 270 in the peripheral circuit is exposed.

Figure 51:
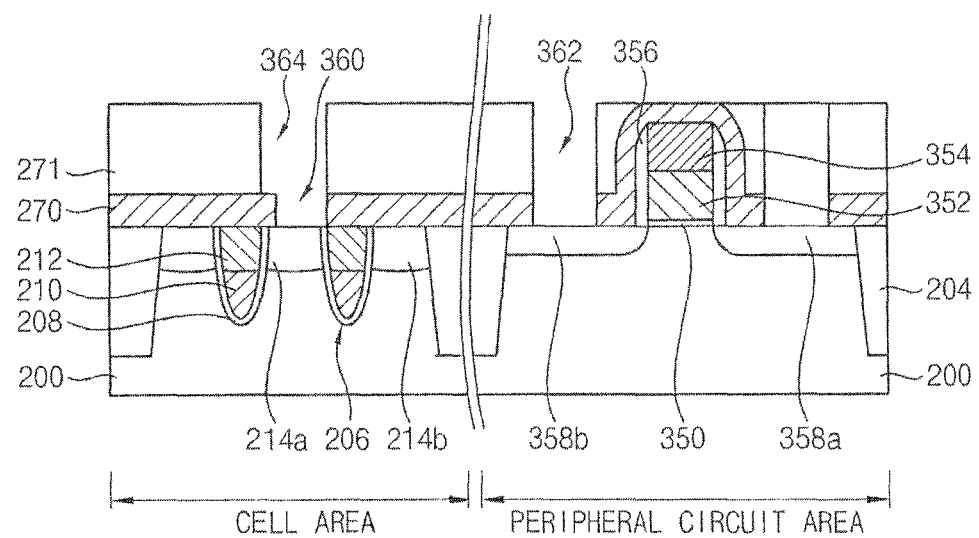

Referring to FIG. 51, the lower insulating interlayer 271 and the etch stop layer 270 are partially etched to form a first contact hole 360 exposing a first impurity region 214a in the cell area. The first contact hole 360 may be formed by a photolithography process. While forming the first contact hole 360, second contact holes 362 are simultaneously formed through the lower insulating interlayer 271 and the etch stop layer 270 in the peripheral circuit area. The second contact holes 362 expose the third and the fourth impurity regions 358a and 358b, respectively. Further, sacrificial layer patterns may be formed on sidewalls of the first and the second contact holes 360 and 362.

The lower insulating interlayer 271 is partially etched to form a trench 364 communicated with the first contact hole 360. The trench 364 may extend as a line shape. After forming the trench 364 on the lower insulating interlayer 271, the sacrificial layer patterns may be removed from the first and the second contact holes 360 and 362.

Figure 52:
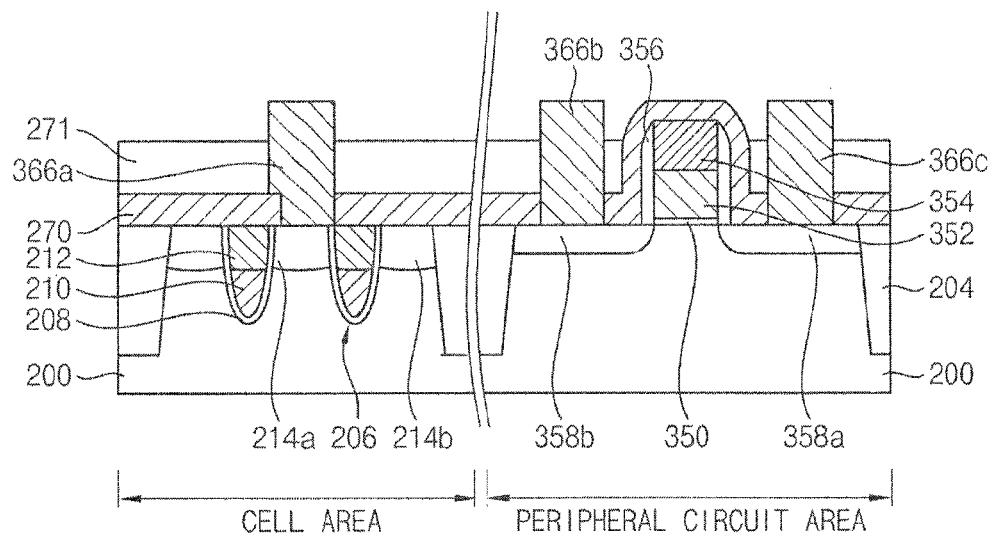

Referring to FIG. 52, a polysilicon layer is formed on the lower insulating interlayer 271 to fill up the trench 364, the first contact hole 360 and the second contact hole 362. The polysilicon layer is partially removed to form a first polysilicon layer pattern 366a, a second polysilicon layer pattern 366b and a third polysilicon layer pattern 366c in the first contact hole 360, the trench 364 and the second contact hole 362.

The lower insulating interlayer 271 is partially removed until upper side portions of the first to the third polysilicon layer patterns 366a, 366b and 366c are exposed. The lower insulating interlayer 271 may be partially etched by a wet etching process.

Figure 53:
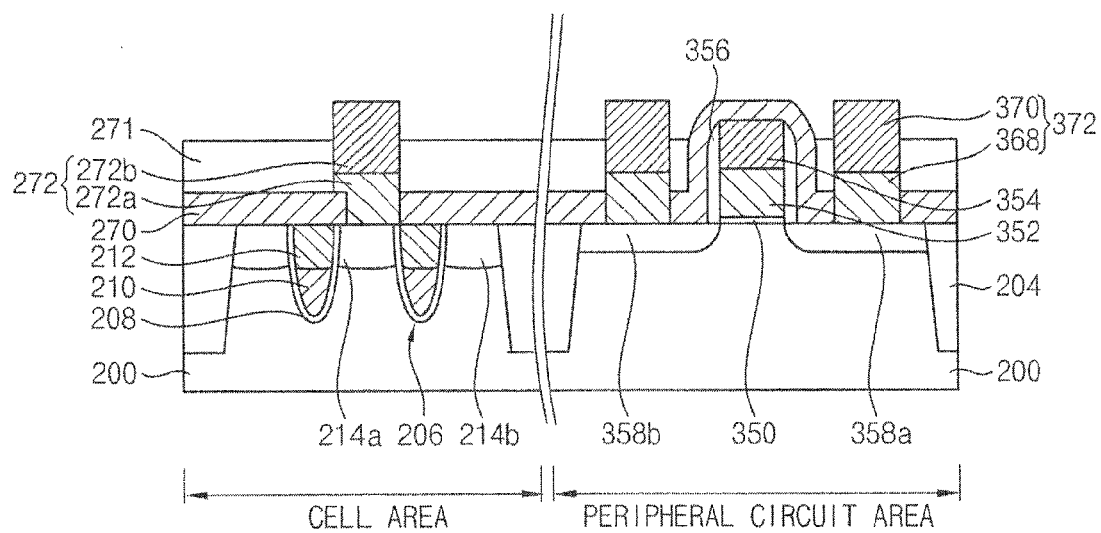

Referring to FIG. 53, a metal layer is formed on the lower insulating interlayer 271, the etch stop layer 270 and the exposed upper sides of the first to the third polysilicon layer patterns 366a, 366b and 366c.

The metal layer is thermally treated to form metal silicide at portions of the first to the third polysilicon layer patterns 366a, 366b and 366c in the cell and the peripheral circuit areas. Namely, each of the first to the third polysilicon layer patterns 366a, 366b and 366c may include at least one silicided portion. Therefore, a bit line structure 272 is formed in the cell area and a contact pad 372 is provided in the peripheral circuit area. The bit line structure 272 including a metal silicide S has a bit line contact 272a and a bit line 272b. The contact pad 372 also includes a metal silicide 370. Unreacted portions of the metal layer may be removed from the first to the third polysilicon layer patterns 366a, 366b and 366c. By adjusting process conditions of a silicidation process, the metal silicides S and 370 in the bit line structure 272 and the contact pad 372 may have proper thickness as described above.

According to exemplary embodiments, the bit line structure 272 including the metal silicide S and the contact pad 373 including the metal silicide 370 may be formed by one silicidation process. The contact pad 372 may be electrically connected with source/drain regions of the peripheral circuit transistor.

As illustrated in FIG. 49, an insulating interlayer 274 is formed on lower insulating interlayer 271 to cover the bit line structure 272 and the contact pad 372. A contact plug 278 is formed through the insulating interlayer 274. The contact plug 278 may be electrically connected to a second impurity region 214b in the cell area.

An upper insulating interlayer 374 is formed to cover the peripheral circuit area of the substrate 200. A capacitor 280 is formed to make contact with a storage node contact 234 in the cell area of the substrate 200. The capacitor 280 may have a cylindrical structure or a stacked structure.

Figure 54:
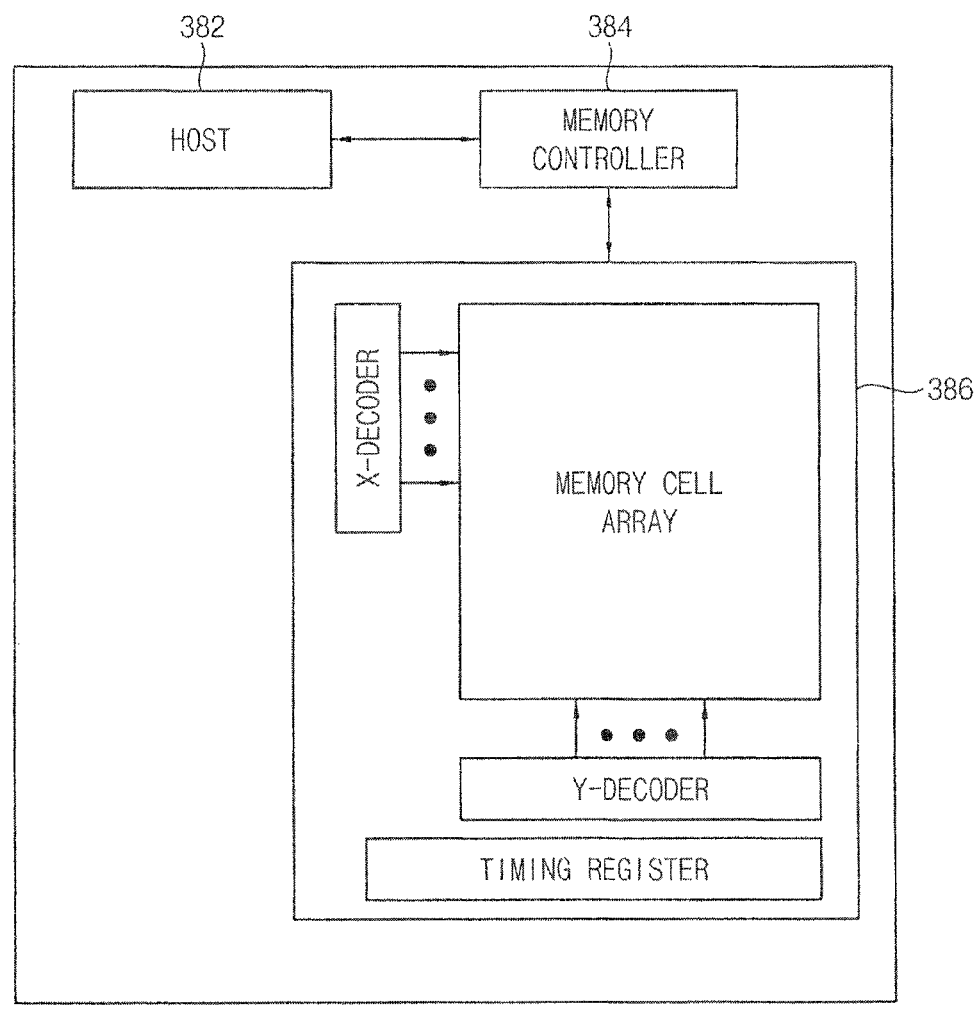
FIG. 54 is a block diagram illustrating a memory system including a DRAM device in accordance with an exemplary embodiment of the present disclosure.

FIG. 54 is a block diagram illustrating a memory system including a DRAM device in accordance with exemplary embodiments. Referring to FIG. 54, the memory system includes a host 382, a memory controller 384 and a DRAM device 386.

The memory controller 384 may serve as an interface between the host 382 and the DRAM device 386. The memory controller 384 includes a buffer memory. The memory controller 384 may additionally include a central processing unit (CPU), a read only memory (ROM), a random access memory (RAM), an interface block, and the like.

The DRAM device 386 includes a cell array, an X decoder, a Y decoder and a timing register.

In exemplary embodiments, data, address signals and write commands may be transferred into the memory controller 384 form the host 382. The memory controller 384 may control the DRAM device 386 for writing the data into the cell array of the DRAM device 386 according to the inputted commands. Additionally, the memory controller 384 may control the DRAM device 386 for reading the data stored in the cell array based on read commands transferred from the host 382.

The cell array of the DRAM device 386 includes a plurality of memory cells. The X decoder of the DRAM device 386 may be electrically connected with word lines in the cell array. The Y decoder of the DRAM device 386 may be electrically connected with bit lines in the cell array. The X decoder may receive X address signals from the memory controller 384, and then the X decoder may select one of the word lines after decoding the X address signals. The Y decoder may receive Y address signals from the memory controller 384, and then the Y decoder may select one of the bit lines after decoding the Y address signals.

In exemplary embodiments, the DRAM device 386 may have a construction substantially the same as or substantially similar to those of the above-described DRAM devices. When the DRAM device 386 has such a construction ensuring high integration degree and performance, the memory system including the DRAM device may also have improved integration degree and enhanced performance.

Figure 55:
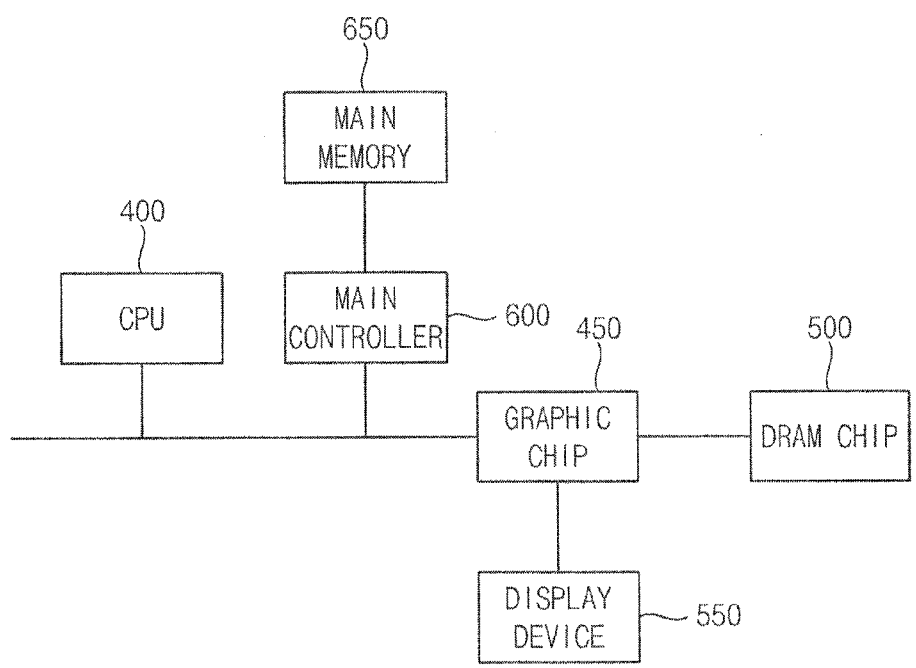
FIG. 55 is a block diagram illustrating a graphic system including a DRAM chip in accordance with exemplary embodiments of the present disclosure.
Figure 56:
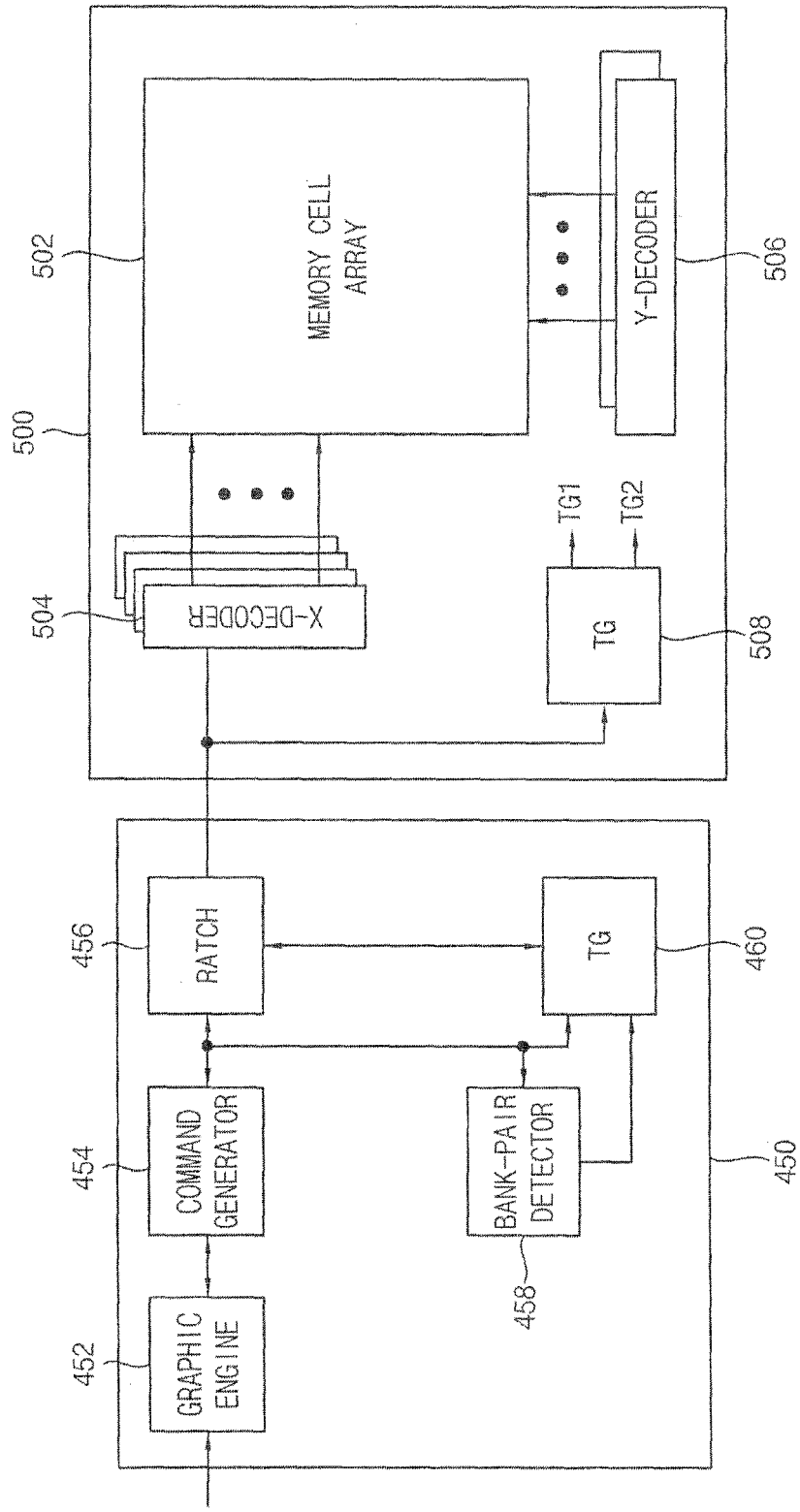
FIG. 56 is a block diagram illustrating a graphic chip and the DRAM chip in FIG. 55.

FIG. 55 is a block diagram illustrating a graphic system including a DRAM chip in accordance with exemplary embodiments. FIG. 56 is a block diagram illustrating a graphic chip and the DRAM chip in FIG. 55.

Referring to FIG. 55, the graphic system includes a CPU 400, a graphic chip 450, a DRAM chip 500, a display device 550, a memory controller 600 and a main memory 650. The CPU 400 may transfer original commands to the graphic chip 450. The graphic chip 450 may analyze the original commands, and then may generate commands and data bits corresponding to the original commands. The graphic chip 450 may additionally control the display device 550 to display the data decoded by the DRAM chip 500.

As illustrated in FIG. 56, the graphic chip 450 includes a graphic engine 452, a command generator 454, a latch 456, a bank-pair detector 458 and a timing generator 460. When the graphic chip 450 receives the original commands, the graphic engine 452 may generate graphic data. Responding to these operations, the command generator 454 may generate commands for writing predetermined data into the DRAM chip 500 according to the graphic data. The generated commands may be transferred to the latch 456, the bank-pair detector 458 and the timing generator 460.

The DRAM chip 500 includes an X decoder 504, a timing generator 508, a memory cell array 502, and a Y decoder 506. The memory cell array 502 may include a plurality of cells electrically connected with bit lines and word lines. The X decoder 504 may be electrically connected with the word lines, and the Y decoder 506 may be electrically connected with the bit lines. The X decoder 504 may decode current commands generated from the latch 456, and then may activate the word lines. The Y decoder 506 may also decode the current commands, and then may activate the bit lines. The timing generator 508 may indicate bank pairs corresponding to the current commands, and then may generate timing signals.

The DRAM chip 500 in the graphic chip 450 may have a construction substantially the same as or substantially similar to those of the above-described DRAM devices. Since the DRAM device 500 has such a construction ensuring a high integration degree and performance, the graphic chip 450 including the DRAM chip 500 may also have an improved integration degree and enhanced performance.

According to the inventive concept, a wiring structure may include a contact plug and a conductive line connected to the contact plug. Such a wiring structure may be widely employed in various semiconductor devices.

In the claims, any means-plus-function clauses are intended to cover the structures described herein as performing the recited function, and not only structural equivalents but also equivalent structures. Therefore, it is to be understood that the foregoing is illustrative of the inventive concept and is not to be construed as limited to the specific embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

These and other features of the present disclosure may be readily ascertained by one of ordinary skill in the pertinent art based on the teachings herein. Although illustrative embodiments have been described herein with reference to the accompanying drawings, it is to be understood that the present disclosure is not limited to those precise embodiments, and that various other changes and modifications may be effected therein by those of ordinary skill in the pertinent art without departing from the scope or spirit of the present disclosure. All such changes and modifications are intended to be included within the scope of the present disclosure as set forth in the appended claims.

What is claimed is:

1. A semiconductor memory wiring method comprising:
   receiving a substrate having a cell area and a peripheral circuit area;
   depositing a first insulating layer on the substrate;
   forming a first contact plug in the cell array region, the first contact plug comprising a first conductive material extending through the first insulating layer;
   forming a first elongated conductive line at substantially the same time as forming the first contact plug, the first elongated conductive line comprising the first conductive material directly covering and integrated with the first contact plug;
   forming a second contact plug in the peripheral circuit area at substantially the same time as forming the first contact plug, the second contact plug comprising the first conductive material extending through the first insulating layer;
   forming a second elongated conductive line at substantially the same time as forming the second contact plug, the second elongated conductive line comprising the first conductive material directly covering and integrated with the second contact plug, and
   simultaneously silicidating lateral portions along the first elongated conductive line and along the second elongated conductive line.

2. The method of claim 1 wherein the first conductive line and the second conductive line are substantially parallel to each other.

3. The method of claim 1 wherein the first insulating layer and the first and second contact plugs have upper surfaces disposed in substantially the same plane.

4. The method of claim 1, further comprising simultaneously silicidating the first contact plug, the first elongated conductive line, the second contact plug, and the second elongated conductive line.

5. The method of claim 1, further comprising forming at least one elongated trench in the substrate.

6. The method of claim 5 wherein the at least one elongated trench is oriented parallel to the first elongated conductive line.

7. The method of claim 5, further comprising forming a gate electrode in the at least one trench disposed adjacent to the first contact plug.

8. The method of claim 7, further comprising: forming at least one third contact plug through the first insulating layer disposed on an opposite side of the gate electrode than the first contact plug, wherein the third contact plug extends higher than the first elongated conductive line.

9. The method of claim 8, further comprising forming a capacitor directly on the at least one third contact plug.

10. A semiconductor memory wiring method comprising:
receiving a substrate;
depositing a first insulating layer on the substrate;
etching a first contact hole through the first insulating layer on an active region of the substrate;
simultaneously forming a first contact plug in the first contact hole and a conductive layer directly covering and integrated with the first contact plug, both of a first conductive material;
forming an elongated capping pattern along a first horizontal path on the conductive layer covering the first contact plug;
removing a portion of the conductive layer that extends outside of the elongated capping pattern to form a first elongated conductive line along the first horizontal path directly covering and integrated with the first contact plug;
forming an elongated photoresist pattern that extends along a second horizontal path substantially perpendicular to the first horizontal path, and
silicidating lateral portions along the first elongated conductive line.

11. The method of claim 10 wherein the elongated photoresist pattern is disposed directly on the capping pattern.

12. The method of claim 10 wherein upper boundaries of the first contact plug and the first insulating layer, and a lower boundary of the first elongated conductive line, are disposed in substantially the same horizontal plane.

13. The method of claim 10, further comprising simultaneously silicidating the first contact plug and the first elongated conductive line.

14. The method of claim 10 wherein the first contact hole is disposed in a cell array region of the substrate, the method further comprising:
etching a second contact hole through the first insulating layer in a peripheral circuit region of the substrate; and
simultaneously forming a second contact plug in the second contact hole and the conductive layer directly covering and integrated with the second contact plug, both of the first conductive material.

15. The method of claim 10, further comprising:
forming at least one elongated trench in the substrate and oriented parallel to the first elongated conductive line; and
forming a gate electrode in the at least one trench disposed adjacent to the first contact plug.

16. The method of claim 15, further comprising:
forming at least one third contact plug through the first insulating layer disposed on an opposite side of the gate electrode than the first contact plug,
wherein the third contact plug extends higher than the first elongated conductive line.

17. The method of claim 16, further comprising forming a capacitor directly on the at least one third contact plug.

* * * * *